(12) United States Patent
Sotzing

(10) Patent No.: US 7,321,012 B2
(45) Date of Patent: Jan. 22, 2008

(54) METHOD OF CROSSLINKING INTRINSICALLY CONDUCTIVE POLYMERS OR INTRINSICALLY CONDUCTIVE POLYMER PRECURSORS AND THE ARTICLES OBTAINED THEREFROM

(75) Inventor: Gregory A. Sotzing, Storrs, CT (US)

(73) Assignee: The University of Connecticut, Storrs, CT (US)

( * ) Notice: Subject to any disclaimer, the term of this patent is extended or adjusted under 35 U.S.C. 154(b) by 400 days.

(21) Appl. No.: 10/788,234

(22) Filed: Feb. 26, 2004

(65) Prior Publication Data

US 2004/0242792 A1    Dec. 2, 2004

Related U.S. Application Data

(60) Provisional application No. 60/451,165, filed on Feb. 28, 2003.

(51) Int. Cl.
- C08G 75/00 (2006.01)
- H01M 6/04 (2006.01)
- H01M 4/02 (2006.01)
- G03C 5/00 (2006.01)

(52) U.S. Cl. ............ 525/417; 252/500; 252/510; 429/189; 429/209; 429/213; 429/322; 430/311; 528/373; 526/256

(58) Field of Classification Search ........... 525/417; 252/500, 510; 429/189, 209, 213, 322; 430/311; 528/373; 526/256

See application file for complete search history.

(56) References Cited

U.S. PATENT DOCUMENTS

| 4,663,001 A | 5/1987 | Lazzaroni et al. |
| 5,561,030 A | 10/1996 | Holdcroft et al. |

(Continued)

FOREIGN PATENT DOCUMENTS

| CA | 2343444 | 3/2001 |

(Continued)

OTHER PUBLICATIONS

Watson, K.J, WOlfe, P.S, Ngunyen, S.T, Zhu, J, Mirkin, C.A, Norbornenyl-Substituted Thiophenes and Terthiophenes: Novel Doubly Polymerizable Monomers, 2000, Macromolecules, 33, 4628-4633.*

(Continued)

*Primary Examiner*—Randy Gulakowski
*Assistant Examiner*—A. Toscano
(74) *Attorney, Agent, or Firm*—Cantor Colburn LLP

(57) ABSTRACT

A method of manufacturing an intrinsically conductive polymer crosslinking at least a portion of an intrinsically conductive polymer precursor in the solid state, the swollen state, or combinations comprising at least one of the foregoing states, wherein the swollen state is characterized as being one wherein the intrinsically conductive polymer precursor increases in volume upon exposure to a solvent without completely dissolving in the solvent. In another embodiment, a method of manufacturing a pattern comprises casting a film of an intrinsically conductive polymer precursor on a substrate; and crosslinking at least a portion of the film by oxidation, wherein the crosslinking occurs in the solid state, the swollen state or combinations comprising at least one of the foregoing states.

39 Claims, 24 Drawing Sheets

U.S. PATENT DOCUMENTS

| | | | |
|---|---|---|---|
| 6,294,245 B1* | 9/2001 | Roitman et al. | 428/212 |
| 2003/0077515 A1* | 4/2003 | Chen et al. | 429/231.8 |
| 2003/0137083 A1 | 7/2003 | Ko et al. | |
| 2004/0010115 A1 | 1/2004 | Rubinsztain et al. | |
| 2004/0074779 A1 | 4/2004 | Sotzing | |
| 2005/0124784 A1 | 6/2005 | Sotzing | |

FOREIGN PATENT DOCUMENTS

| | | |
|---|---|---|
| EP | 0577406 A1 | 1/1994 |
| WO | WO 97/32571 | 9/1997 |
| WO | WO 00/41213 A1 | 7/2000 |
| WO | WO 03/001633 A2 | 1/2003 |
| WO | WO 2005/014693 A1 | 2/2005 |

OTHER PUBLICATIONS

Chittibabu, K.G, Li, L, Kamath, M, Tripathy, S.K, Synthesis and Properties of a Novel Polythiophene Derivative with a Side-Chain NLO Chromophore, 1994, Chem. Mater., 6, 475-480.*

Sotzing, G.A, Jang, S, Marquez, M, Oxidative Solid-State Crosslinking of Polymer Precursors to Pattern Intrinsically Conductive Polymers, Aug. 2002, ACS Preprint.*

Sotzing, G, Jang, SY, Marquez, M, Oxidative solid-state crosslinking of polymer precursors to pattern intrinsically conducting polymers, Aug. 2002, ACS Preprint.*

Watson K, Wolfe, PS, Nguyen ST, Zhu J, Mirkin, CA, Norbomenyl-substituted thiophenes and terthiophenes: Novel doubly polymerizable monomers, 2000, Macromolecules, 33, 4628-4633.*

Watson et al, Norbonenyl Substituted Thiphenes and Terthiophenes: Novel Doubly Polymerizable Monomers, Macromolecules, 2000, 33, 4628.*

Watson et al, Macromolecules, 2000, 33, 4628.*

Taranedar et al, Langmuir, 2002, 18, 7943.*

Baba et al, 2 powerpoint pages of Polm Mat Sci Eng 2002, 86, 48.*

International Search Report and the Written Opiniion of the International Searching Authority; International Application No. PCT/US2004/005913; International Filing Date Feb. 27, 2004; Applicant's File Reference: UCT-0044-PCT; Date of Mailing: Dec. 10, 2004, 14 pages.

Chittibabu, K. G., et al.; "Synthesis and Properties of a Novel Polythiophene Derivative with a Side-Chain NLO Chromophore"; Chem. Mater.; 1994; 6; 475-480.

Deng, Suxiang; et al.; "Polymethacrylate Functionalized Polypyrrole Network Films on Indium Tin Oxide: Electropolymerization of a Precursor Polymer and Comonomer"; Chem. Mater.; 2002; 14; 4073-4080.

Granlund, Thomas, et al.; "Patterning of Polymer Light-Emitting Diodes with Soft Lithography"; Adv. Mater.; 2000; 12; No. 4; 269-273.

Inaoka, Seiji, et al.; Synthesis and Oxidative Cross-Linking of Fluorene-Containing Polymers To Form Conjugated Network Polyfluorenes: Poly(fluoren-9,9-diyl-*alt*-alkan-*a,w*-diyl); Macromolecules; 2002; 35; 2426-2428.

Jang, Sung-Yeon, et al.; Patterning Polynorbornylenes with Conducting Polymers Utilizing Oxidative Solid-state Crosslinking; ACS Conference-Fall 2002-Boston, MA.

Jang, Sung-Yeon, et al. "Intrinsically Conducting Polymer (ICP) Networks of Poly(thiophene) via Solid-State Oxidative Crosslinking of a Poly(norbornene) Containing Terthiophene Moieties"; Orlando ACS Conference—Spring 2002, Apr. 19, 2002.

Jang, Sung-Yeon, et al.;"Intrinsically Conducting Polymer Networks of Poly(thiophene) via Solid-State Oxidative Cross-Linking of a Poly(norbornylene) Containing Terthiophene Moieties"; Macromolecules; 2002; 35; 7293-7300.

Jang, Sung-Yeon, et al.; "Poly (Terthiophene) Networks via Electrochemical Crosslinking of Terthiophene Derivatized Norbornylene Monomers and Polymers"; Polymeric Materials: Science & Engineering; 2002; 86; 205-206, monomer X-Link on wire.

Lim, Jung-Hyurk, et al.; "Electrostatically Driven Dip-Pen Nanolithography of Conducting Polymers"; Adv. Mater.; 2002; 14; No. 20, Oct. 16; 1474-1477.

Marsitzky, Dirk, et al.; "Amorphous Poly-2,7-fluorene Networks"; Chem. Mater; vol. 13; No. 11; 2001; 4285-4289.

Maynor, Benjamin W., et al.; "Direct-Writing of Polymer Nanostructures: Poly(thiophene) Nanowires on Semiconducting and Insulating Surfaces"; vol. 124; No. 4; 2002; 522-523, nano patt.

Sirringhaus, Henning, et al.; "Integrated Optoelectronic Devices Based on Conjugated Polymers"; Science; vol. 280; Jun. 12, 1998; 1741-1744.

Sotzing, Gregory A., et al.; "Oxidative Solid-State Crosslinking of Polymer Precursors to Pattern Intrinsically Conducting Polymers"; Polymeric Materials: Science & Engineering; 2002; 87; 371-372, oxidative X-Link pattern.

Sotzing, Gregory A., et al.; "Preparation and Characterization of Fully Conjugated Intrinsically Conducting Polymer Networks"; Polymeric Materials: Science & Engineering; 2002; 86; 40-41.

Taranekar, Prasad, et al.; "Distinct Surface Morphologies of Electropolymerized Polymethylsiloxan Network Polypyrrole and Comonomer Films"; Langmuir; 2002; 18; 7943-7952.

Watson, Keith J., et al.; Norbornenyl-Substituted Thiophenes and Terthiophenes: Novel Doubly Polymerizable Monomers; Macromolecules; 2000; 33; 4628-4633.

Xia, Chuanjun, et al.; "Surface Grafting of Conjugated Polymers onto Self-assembled Monolayer Modified Conducting Substrates by Electrochemistry"; Chem. Mater.; 2001; 13; 1682-1691.

Xia, Chuanjun, et al.; "Ultrathin Film Electrodeposition of Polythiophene Conjugated Networks through a Polymer Precursor Route"; Langmuir; 2001; 17; 7893-7898.

Yu, Jianfei, et al.; "Chemically amplified soft lithography of a low band gap polymer"; Chem. Commun.; 2001; 1274-1275.

Beh, Weng Sing; et al. "Formation of Patterned Microstructures of Conducting Polymers by Soft Lithography and Applications in Microelectronic Device Fabrication" Adv. Mater; 1999;11; No. 12; 1038-1041.

Dai, Liming, et al; "Photochemical Generation of Conducting Patterns in Polybutadiene Films"; Macromolecules; 1996; 29; 282-287.

Di Bartolomeo, C., et al.; "A Photolithographic Technique for Patterning Spin-Coated Polyaniline Films"; Advanced Materials for Optics and Electronics; vol. 2; 233-236 (1993).

Holdcroft, Steven; "Patterning p-Conjugated Polymers" Adv. Mater; 2001; 13; No. 23;Dec. 3; 1753-1765.

Huang, Zheyuan., et al.; "Selective Deposition of Conducting Polymers on Hydroxyl-Terminated Surfaces with Printed Monolayers of Alkylsiloxanes as Templates"; Langmuir; 1997; 13; 6480-6484.

Jang, Sung-Yeon; et al.; "Poly(thiophene)s Prepared via Electrochemical Solid-State Oxidative Cross-Linking; A Comparative Study"; Macromolecules; 2004 37;4351-4359.

Jang, Sung-Yeon, et al; "Poly (Terthiophene) Networks via Electrochemical Crosslinking of Terthiophene Derivatized Norbornylene Monomers and Polymers";Preprint of Orlando National ACS Conference, Apr. 2002.

Li, Yan, et al;"Electrochemical AFM "Dip-Pen" Nanolithography" J. Am. Chem. Soc. 2001; 123; 2105-2106.

Lowe, Jimmy; et al. "Poly(3-(2-acetoxyethyl)thiophene): a model polymer for acid-catalyzed lithography."; Synthetic Metals; 85;(1997);1427-1430.

Maynor, Benjamin W., et al; "Au "Ink" for AFM "Dip-Pen" Nanolithography"; Langmuir; 2001; 17;2575-2578.

Noy, Aleksandr; et al. "Fabrication of Luminescent Nanostructures and Polymer Nanowires Using Dip-Pen Nanolithography";Nano Letters; 2002; vol. 2; No. 2;109-112.

Persson, S. H. Magnus, et al. "Patterning of Poly(3-Octylthiophene) Conducting Polymer Films by Electron Beam Exposure" Adv. Mater; 1996; 8; No. 5; 405-408.

Renak, Michelle L., et al.; "Microlithographic Process for Patterning Conjugated Emissive Polymers";Adv. Mater; 1997; 9;No. 5; 392-394.

Rozsnyai, Lawrence F., et al "Selective Deposition of Conducting Polymers via Monolayer Photopatterning"; Langmuir; 1995; 11; 3913-3920.

Schanze, Kirk S., et al; "Photolithographic Patterning of Electroactive Polymer Films and Electrochemically Modulated Optical Diffraction Gratings"; Adv. Mater; 1996; 8;No. 6; 531-534.

Sotzing, Gregory A., et al.;"Oxidative Solid-State Crosslinking of Polymer Precursors to Pattern Intrinsically Conducting Polymers";Preprint of Presentation to 224th National ACS meeting; Aug. 2002; Boston.

Venugopal, G., et al.; "Photoinduced Doping and Photolithography of Methyl-Substituted Polyaniline"; Chem.Mater; 1995;7; 271-276.

Yu, Jianfei; et al; "Chemically amplified photolithography of a conjugated polymer" Chem. Commun.; 1998; 1503-1504.

Jang, Sung-Yeon, et al., "Oxidative Solid-State Cross-Linking of Polymer Precursors to Pattern Intrinsically Conducting Polymers", American Chemical Society (2004); 874; pp. 44-53.

Jang, S. et al., "Electrospinning of Electrochromic Conductive Polymeric Nanofibers", Polymer Preprints (2005), 46(1), pp. 513-514.

Lee et al., "Synthesis and Characterization of a Soluble and Transparent Conducting Polymer", Poly (3,4-Ethylenedioxythiophene), Mol. Cryst. 1999, vol. 327, pp. 237-240.

Reeves, Benjamin D. et al., Dual Cathodically and Anodically Coloring Electrochromic Polymer Based On a Spiro Bipropylenedioxythiophene [(Poly(spiroBiProDOT)], Advanced Materials, May 17, 2002, vol. 14, No. 10, pp. 717-719.

Roncali, M. et al., "Enhancement of the Mean Conjugation Length in Conducting Polythiophenes", Synthetic Metals, 1987, vol. 18, pp. 139-144.

MacDiarmid, Alan G., "Synthetic Metals": A Novel Rule For Organic Polymers (Nobel Lecture); Angewandte Chemie, International Edition (2001) 40(14), 2581-2590.

* cited by examiner

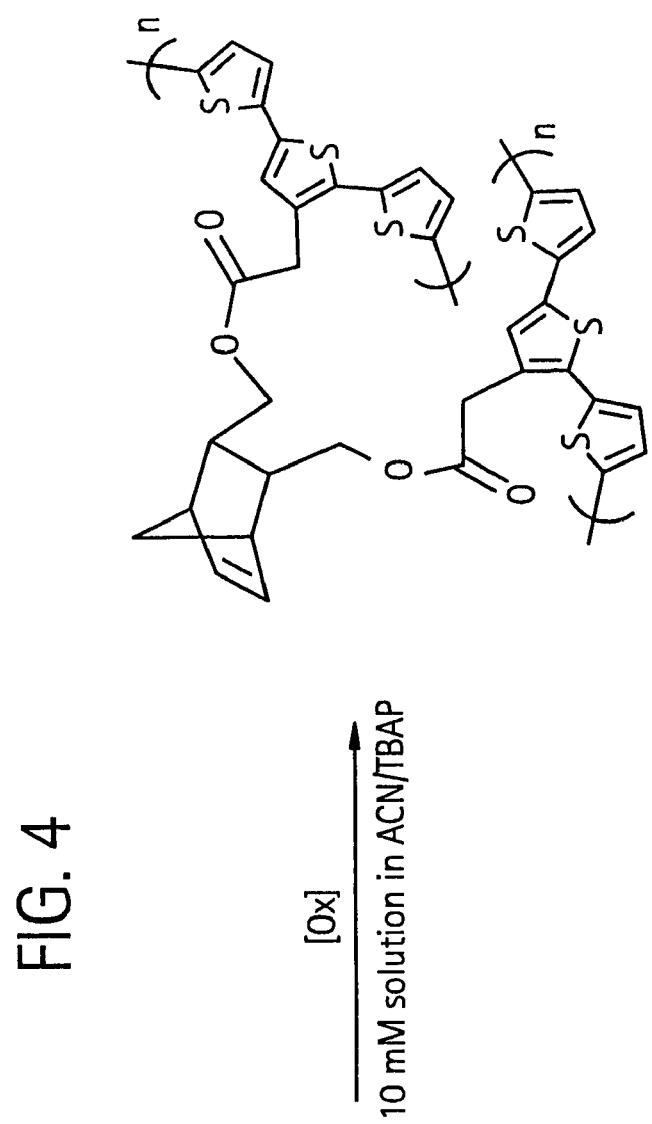
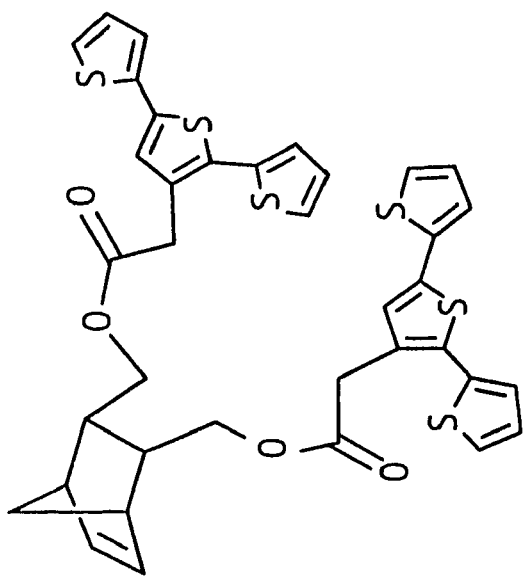
FIG. 4

- 1st scan
- 2nd scan

FIG. 25
Scheme 1
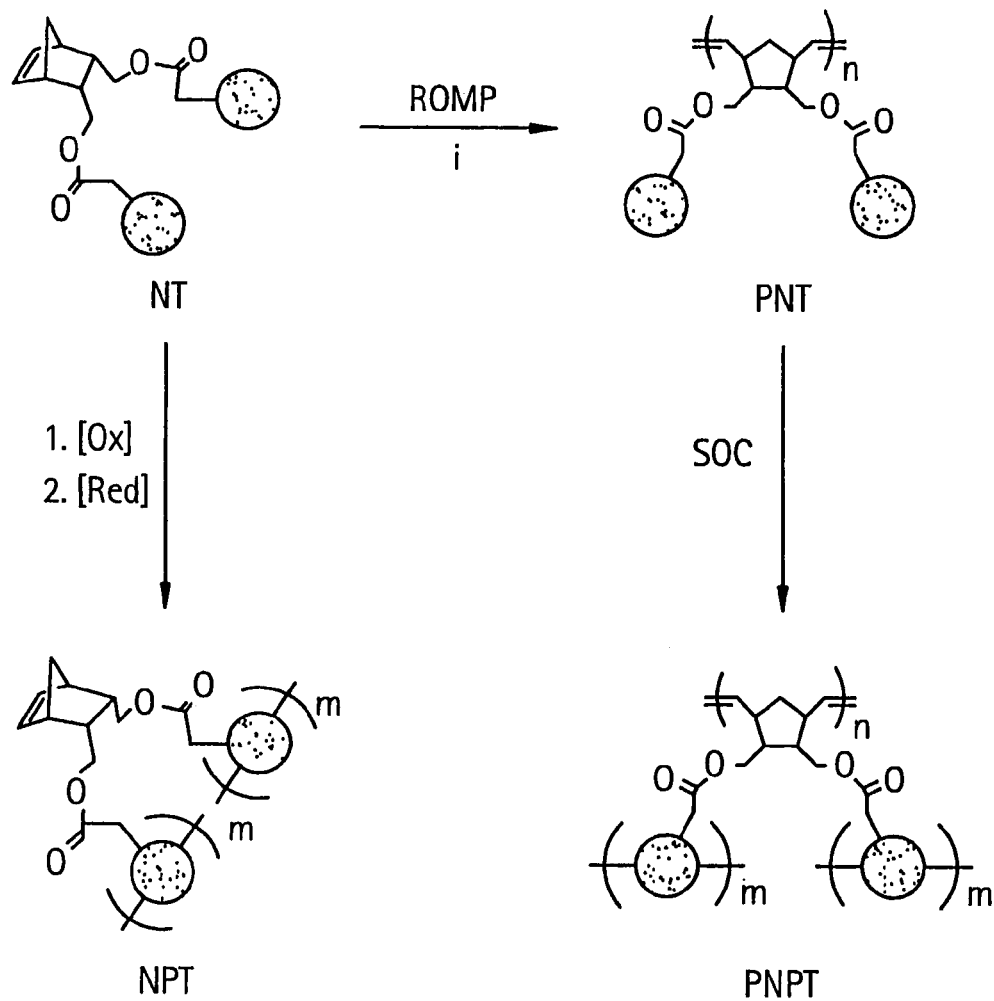
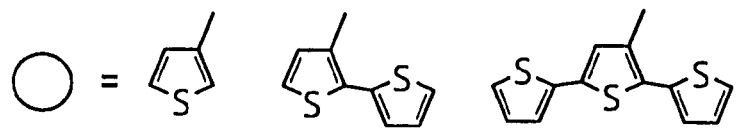
|      |   | (1T) | (2T) | (3T) |
|------|---|------|------|------|
| NT   | = | N1T  | N2T  | N3T  |
| PNT  | = | PN1T | PN2T | PN3T |
| NPT  | = | N/A  | NP2T | NP3T |
| PNPT | = | N/A  | PNP2T| PNP3T|

25 nm 12.5 nm

0

120 nm    170 nm 20 nm 10 nm

0

180 nm    240 nm

METHOD OF CROSSLINKING INTRINSICALLY CONDUCTIVE POLYMERS OR INTRINSICALLY CONDUCTIVE POLYMER PRECURSORS AND THE ARTICLES OBTAINED THEREFROM

CROSS-REFERENCE TO RELATED APPLICATION

This application claims the benefit of U.S. Provisional Application Ser. No. 60/451,165, filed Feb. 28, 2003.

BACKGROUND

This disclosure relates to methods for crosslinking intrinsically conductive polymers and intrinsically conductive polymer precursors and the articles obtained therefrom.

Intrinsically conductive polymers are often used for generating patterns on substrates that are utilized in both electronic and optoelectronic devices. Lithography of intrinsically conductive polymers is frequently utilized in the generation of such patterns. Several different techniques are currently utilized to generate patterns of intrinsically conducting polymers such as chemically amplified soft lithography, soft photolithography, pattern generation via photochemical crosslinking, and electrochemical dip pen nanolithography. Each of these methods suffers from several drawbacks related to the lack of solubility of unsubstituted intrinsically conductive polymers in common organic solvents. Prominent among these drawbacks is the extended time period required for generating patterns.

For example, pattern-generating techniques requiring the deposition of intrinsically conductive polymer on an entire substrate generally utilize a multi-step procedure, which utilizes long development times and is therefore not cost effective. Similarly, electrochemical dip-pen nanolithography, which utilizes a pen to perform lithography, takes prolonged periods of time in order to develop a pattern due to relatively slow scan rates used in the process. The slow scan rate often causes the pen to run out of ink, which requires the repositioning of the pen after refilling for a second writing. These drawbacks have led to the development of solution processable intrinsically conductive polymers for generating patterns. The use of chemical solvents however, has given rise to environmental problems. There therefore remains a need for utilizing intrinsically conductive polymers and methods of using these polymers, which permits rapid application in nanolithographic patterning while minimizing the use of solvents.

SUMMARY

A method of manufacturing an intrinsically conductive polymer comprises crosslinking at least a portion of an intrinsically conductive polymer precursor in the solid state, the swollen state, or combinations comprising at least one of the foregoing states, wherein the swollen state is characterized as being one wherein the intrinsically conductive polymer precursor increases in volume upon exposure to a solvent without completely dissolving in the solvent.

In one embodiment, an article is manufactured by crosslinking the intrinsically conductive polymer precursor in the solid state, the swollen state, or combinations comprising at least one of the foregoing states.

In another embodiment, a method of manufacturing a pattern comprises casting a film of an intrinsically conductive polymer precursor on a substrate; and crosslinking at least a portion of the film by oxidation, wherein the crosslinking occurs in the solid state, the swollen state or combinations comprising at least one of the foregoing states.

In yet another embodiment, an article having a pattern is manufactured by casting a film of an intrinsically conductive polymer precursor onto a substrate; and crosslinking at least a portion of the intrinsically conductive polymer precursor in the solid state, the swollen state, or combinations comprising at least one of the foregoing states.

In yet another embodiment, a composition comprising a poly(thiophene) having the structure (XXXV), or the structure (XXXVI), or the structure (XXXVII), or the structure (XXXVIII)

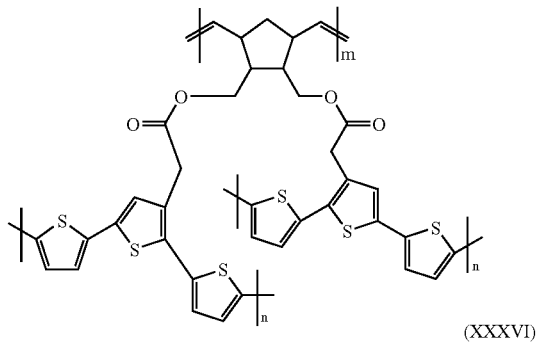

(XXXV)

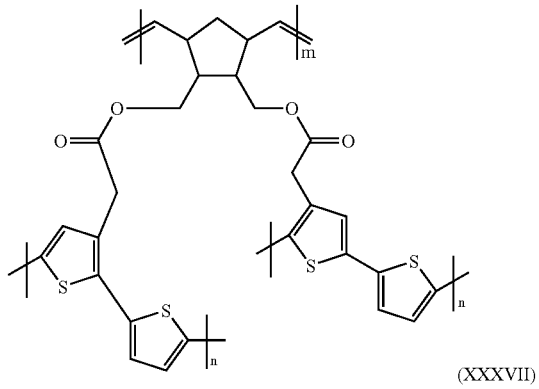

(XXXVI)

(XXXVII)

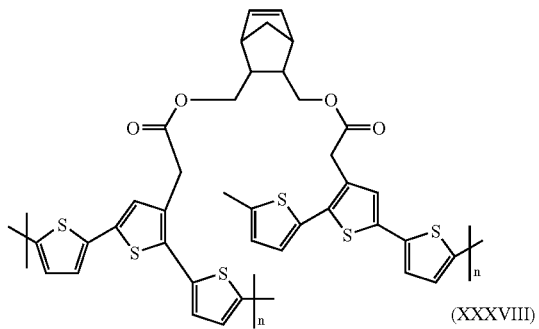

(XXXVIII)

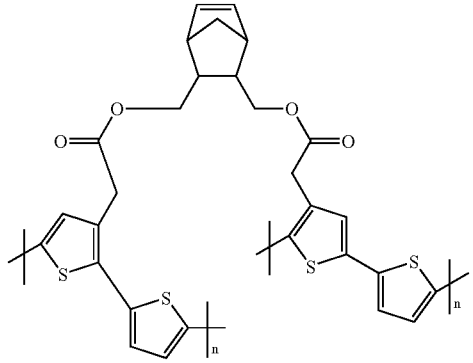

or a combination comprising at least one of the foregoing poly(thiophene) structures, and wherein the molecular weight of the poly(thiophene) is about 100 to about 500,000 g/mole and further wherein there is a positive charge on the intrinsically conductive polymer and associated with this positive charge is a negative charge.

FIGURES

FIG. 4 depicts the reaction scheme utilized to crosslink the bis(terthienyl)norbornylene monomer into an ICP;

FIG. 25 is a schematic representation depicting the reactions for the conversion of N1T, N2T and N3T to form PN1T, PN2T and PN3T respectively;

Figure 26A:
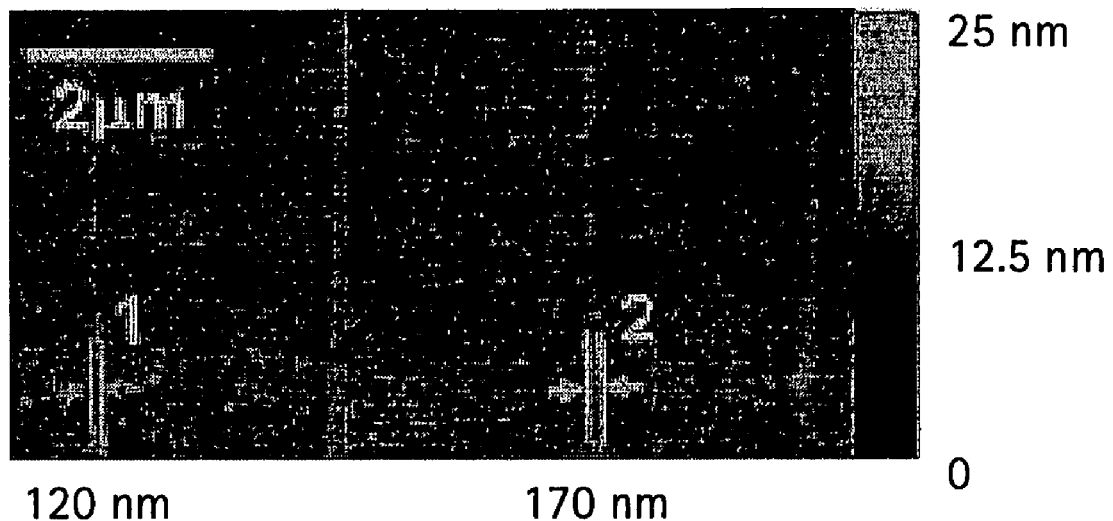
Figure 27A:
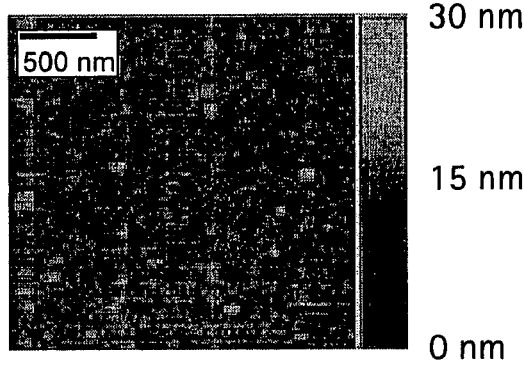

FIGS. 26(a) and (b) are micrographs showing height images of ICP nano-lines of PNP3T developed via contact mode electrochemical oxidative crosslinking of PN3T; and FIG. 27(a), (b), (c) and (d) are micrographs showing height ((a) and (c) respectively) and phase ((b) and (d) respectively) images of ICP nano-lines of PNP3T developed via tapping mode electrochemical oxidative crosslinking of PN3T.

DETAILED DESCRIPTION OF PREFERRED EMBODIMENTS

Disclosed herein are intrinsically electrically conductive polymers (ICP's) or precursors to ICP's (hereinafter "ICP precursors") that can be crosslinked in the solid state, the swollen state, or combinations comprising at least one of the aforementioned states. The ICP and/or the ICP precursor generally has a reactive functionality covalently bonded to it that undergoes a reaction in the solid state and/or the swollen state to bring about the crosslinking of the ICP or the ICP precursor. In addition to crosslinking the ICP or the ICP precursor, the ICP or the ICP precursor may be copolymerized or blended with other non-electrically conducting oligomers and/or polymers, that possess reactive functionalities which may also be used to bring about crosslinking.

The crosslinking of ICP's or ICP precursors in the solid state and/or the swollen state can be used advantageously in a variety of different technologies. For example, it can be used to permit the rapid micrographic or nanolithographic patterning of ICP or ICP precursor films. These films may be disposed on substrates if desired. Crosslinking speeds of up to about 60,000 nanometers per second (nm/sec) may be achieved, which represents a greater than or equal to about thousand fold improvement over comparative processes such as electrochemical dip-pen nanolithography. In addition to the improved speed of crosslinking, the number of process steps required to achieve the patterning of the ICP or ICP precursor films is reduced when compared with other comparative processes.

The ICP's used herein, are generally conjugated polymers. The swollen state as defined herein, is that state wherein the ICP or the ICP precursor increases in volume upon exposure to the solvent without completely dissolving in the solvent. The solid state as defined herein is that state wherein the ICP or the ICP precursor is unswollen by solvents. As defined herein, non-electrically conducting oligomers and polymers are those that are not intrinsically electrically conductive such as, for example, polyacetals, polyacrylics, polycarbonates polystyrenes, polyesters, polyamides, polyamideimides, polyarylates, polyacrylates, polymethylmethacrylates, polyarylsulfones, polyethersulfones, polyphenylene sulfides, polyvinyl chlorides, polysulfones, polyimides, polyetherimides, polytetrafluoroethylenes, polyetherketones, polyether etherketones, polyether ketone ketones, polybenzoxazoles, polyoxadiazoles, polybenzothiazinophenothiazines, polybenzothiazoles, polypyrazinoquinoxalines, polypyromellitimides, polyquinoxalines, polybenzimidazoles, polyoxindoles, polyoxoisoindolines, polydioxoisoindolines, polytriazines, polypyridazines, polypiperazines, polypyridines, polypiperidines, polytriazoles, polypyrazoles, polypyrrolidines, polycarboranes, polyoxabicyclononanes, polydibenzofurans, polyphthalides, polyacetals, polyanhydrides, polyvinyl ethers, polyvinyl thioethers, polyvinyl alcohols, polyvinyl ketones, polyvinyl halides, polyvinyl nitriles, polyvinyl esters, polysulfonates, polysulfides, polythioesters, polysulfones, polysulfonamides, polyureas, polyphosphazenes, polysilazanes, polysiloxane, polyolefins, or the like. A copolymer of ICP with a non-electrically conducting polymer is considered to be an ICP. A polymer blend is a composition by which either an electrically conductive or non-electrically conducting polymer is mixed with the precursor polymer.

ICP precursors, as defined herein, are non-conductive polymers, oligomers or monomers that can be rendered electrically conductive (i.e. converted into ICP's) by crosslinking the non-conductive polymer, oligomer or monomer. As defined herein, a copolymer of an ICP precursor with a non-electrically conducting polymer or oligomer is also considered to be an ICP precursor. Crosslinking, as defined herein, is a process wherein covalent bonding occurs between two intrinsically conductive polymer molecules or between two intrinsically conductive polymer precursor molecules or between an intrinsically conductive polymer molecule and an intrinsically conductive polymer precursor. During crosslinking conjugation within an intrinsically conductive polymer precursor may be simultaneously achieved to convert the intrinsically conductive polymer precursor to an intrinsically conductive polymer. Suitable examples of ICP's or ICP precursors are poly (aniline), substituted poly(aniline)s, poly(pyrrole)s, substituted poly(pyrrole)s, poly(thiophene)s, substituted poly (thiophene)s, poly(acetylene)s, poly(ethylene dioxythiophene)s, poly(ethylenedioxypyrrole)s, poly(p-phenylene vinylene)s, polycarbazoles, substituted polycarbazoles, polyindoles, or the like, or combinations comprising at least one of the foregoing ICPs. Other suitable examples of ICP's or ICP precursors are various combinations of the repeat units of pyrrole, substituted pyrrole, thiophene, substituted thiophene, acetylene, ethylenedioxythiophene, substituted ethylenedioxythiophene, ethylenedioxypyrrole, substituted ethylenedioxypyrrole, vinylene, carbazole, substituted carbazole and the like to give polymer. Blends or copolymers or composites of the foregoing ICP's may also be used. Similarly blends or copolymers or composites of an ICP with an ICP precursor may also be used.

The ICP's and/or the ICP precursors may be copolymerized with non-electrically conducting oligomers or polymers such as, but not limited to, polymethylmethacrylates, polyacrylates, polyamides, polyesters, polyimides, polyethers, polyolefins, polyetherketones, polyether ether ketones, polyether ketone ketones, polycarbonates, polyarylene ethers, epoxies, polysulfones, polyethersulfones, polyetherimides, polynorbornylene, polysiloxanes, polyvinylchlorides, fluoropolymers, liquid crystalline polymers, ionomers, or the like, or combinations comprising at least one of the foregoing polymers. The copolymers of the ICP's or ICP precursors with the non-electrically conducting oligomers or polymers may be random copolymers, graft copolymers, block copolymers, star block copolymers, dendrimers, or the like, or combinations comprising at least one of the foregoing copolymers. Blends of ICP's or ICP precursors with other polymers may also be used.

The non-electrically conducting oligomers or polymers and the resulting ICP's after oxidative crosslinking of the precursor molecules may generally have molecular weights of about 100 to about 500,000 grams/mole (g/mole). Within this range, it is generally desirable to have molecular weights greater than or equal to about 400, preferably greater than or equal to about 800, and more preferably greater than or equal to about 1000 g/mole. Within this range, it is also desirable to have a molecular weight of less than or equal to about 400,000, preferably less than or equal to about 300,000, and more preferably less than or equal to about 200,000 g/mole.

Preferred ICPs that may be used are: poly(acetylene) and its derivatives shown in (I) below

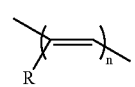

(I)

where R is alkyl or alkoxy group an n is greater than 6; poly(thiophenes) and derivatives shown in (II) below

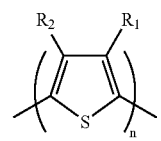

(II)

where $R_1$ and $R_2$ may be the same or different any may be hydrogen, alkyl or alkoxy and wherein n is greater than 6; poly(3,4-ethylenedioxythiophene) and poly(3,4-ethylenedithiathiophene) and derivatives shown in (III) below

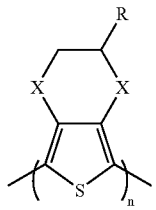

wherein X=sulfur or oxygen, R=hydrogen, alkyl or alkoxy and n is greater than 6; poly(isathianaphthene), poly(pyridothiophene), poly(pyrizinothiophene), and derivatives as shown in (IV) below

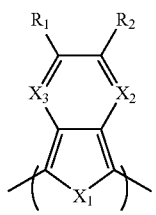

wherein X=S, O, N—H, N—R; $X_2$ and $X_3$ are the same or different and are C or N; $R_1$ and $R_2$ are the same or different and are hydrogen, alkyl or alkoxy and n is greater than 6; poly(pyrrole) and its derivatives as shown in (V) below

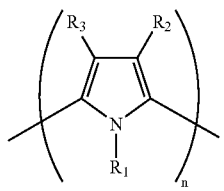

wherein $R_1$ is H or alkyl, and $R_2$ and $R_3$ are the same of different and are hydrogen, alkyl or alkoxy and n is greater than 6; poly(3,4-ethylenedioxypyrrole) and derivatives as shown in (VI) below

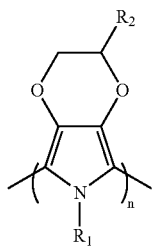

wherein $R_1$ is H or alkyl, and $R_2$ is hydrogen, alkyl or alkoxy and n is greater than 6; poly(aniline) and its derivatives as shown in (VII) below

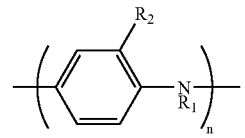

wherein $R_1$ hydrogen, alkyl or propanesulfonate and $R_2$ is hydrogen, alkyl, alkoxy, or sulfonate, and n is greater than 6; poly(phenylenevinylene) and derivatives as shown in VIII below

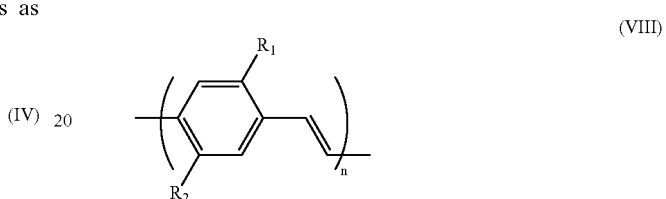

where $R_1$ and $R_2$ are the same of different and are hydrogen, alkyl or alkoxy and n is greater than 6; poly(p-phenylene) and derivatives as shown in (IX) below

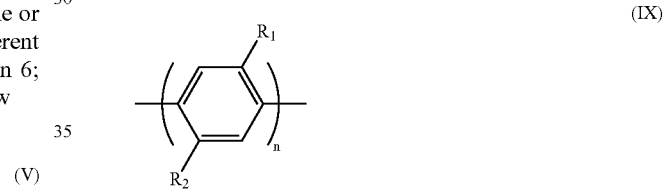

wherein $R_1$ and $R_2$ are the same of different and are alkyl or alkoxy and n is greater than 6; poly(thionapthene), poly(benzofuran), and poly(indole) and derivatives as shown in (X) below

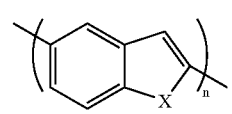

wherein X=S, O, N—H, N—R, and n is greater than 6; poly(dibenzothiophene), poly(dibenzofuran), and poly(carbazole) and derivatives as shown in (XI) below

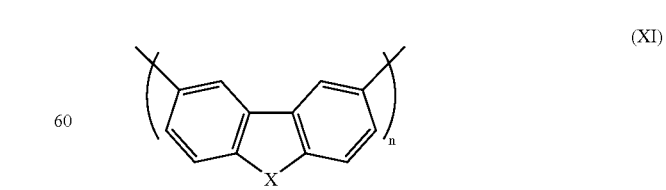

wherein X=S, O, N—H, N—R; R is alkyl and n is greater than 6; poly(bithiophene), poly(bifuran), poly(bipyrrole), and derivatives as shown in (XII) below

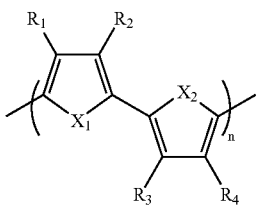
(XII)

wherein $X_1$ and $X_2$ may be the same or different and are S, O, N—H, N—R; $R_1$, $R_2$, $R_3$, and $R_4$ are the same or different and are hydrogen, alkyl or alkoxy; R is alkyl and n is greater than 6; poly(thienothiophene), poly(thienofuran), poly(thienopyrrole), poly(furanylpyrrole), poly(furanylfuran), poly(pyrolylpyrrole), and derivatives as shown in (XIII) below

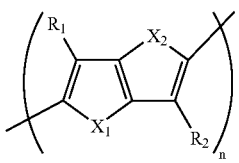
(XIII)

2-substituted thieno[3,4-b]thiophene having the structure (XIV) and 6-substituted thieno[3,4-b]thiophene having the structure (XV)

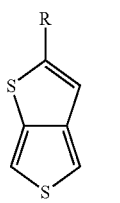
(XIV)

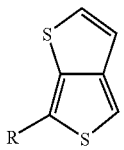
(XV)

wherein $X_1$ and $X_2$ may be the same or different and are S, O, N—H, N—R; $R_1$ and $R_2$, are the same or different and are hydrogen, alkyl or alkoxy; R is alkyl and n is greater than 6; poly(terthiophene), poly(terfuran), poly(terpyrrole), and derivatives as shown in (XVI) below:

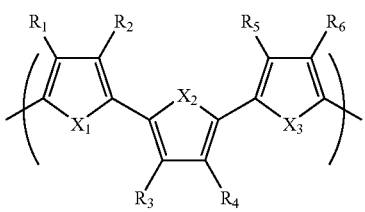
(XVI)

wherein $X_1$, $X_2$ and $X_3$ may be the same or different and are S, O, N—H, N—R; $R_1$, $R_2$, $R_3$, $R_4$, $R_5$, and $R_6$ are the same or different and are hydrogen, alkyl or alkoxy; R is alkyl and n is greater than 6; poly(dithienothiophene), poly(difuranylthiophene), poly(dipyrrolylthiophene), poly(dithienofuran), poly(dipyrrolylfuran), poly(dipyrrolylpyrrole) and derivatives as shown in (XVII) below

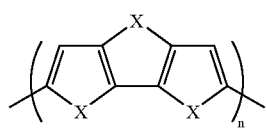
(XVII)

wherein X is S, O, N—H, N—R; R is alkyl and n is greater than 6; poly(phenyl acetylene) and derivatives as shown in (XVIII) below

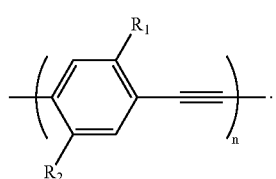
(XVIII)

$R_1$ and $R_2$ are the same or different and are hydrogen, alkyl or alkoxy; and n is greater than 6; poly(biindole) and derivatives as shown in (XIX) below

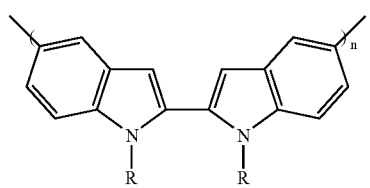
(XIX)

wherein R is hydrogen or alkyl; and n is greater than 6; poly(dithienovinylene), poly(difuranylvinylene), poly(dipyrrolylvinylene) and derivatives as shown in (XX) below

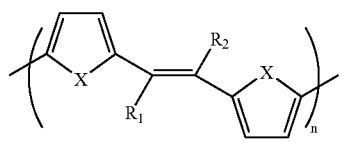
(XX)

wherein X is S, O, N—H, N—R; $R_1$ is hydrogen, alkyl or alkoxy; R is alkyl and n is greater than 6; poly(1,2-trans(3,4-ethlendioxythienyl)vinylene), poly(1,2-trans(3,4-ethylenedioxyfuranyl)vinylene), and poly(1,2-trans(3,4ethylenedioxypyrrolyl)vinylene), and derivatives as shown in (XXI) below

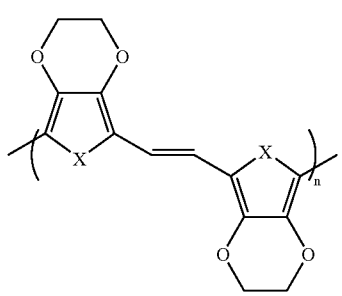

(XXI)

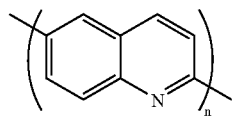

(XXV)

poly(thiazole)) as shown in (XXVI) below

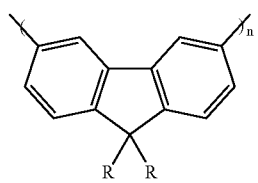

(XXVI)

wherein X is S, O, N—H, N—R; R is alkyl and n is greater than 6; the class of poly(bis- thienylarylenes) and ploy(bis-pyrrolylarylenes) and derivatives as shown in (XXII) below

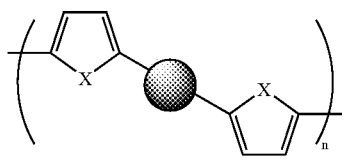

(XXII)

wherein n is greater than 6; poly(fluorene) and derivatives as shown in (XXVII) below

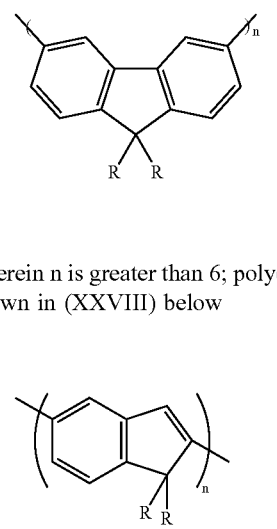

(XXVII)

wherein X is S, O, N—H, N—R and ◯ represents an aromatic ring system; n is greater than 6; the class of poly(bis(3,4-ethylenedioxythienyl)arylenes) and derivatives as shown in (XXIII) below

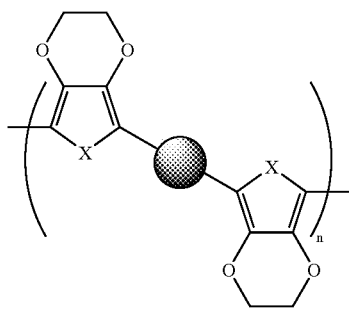

(XXIII)

wherein n is greater than 6; poly(azulene) and derivatives as shown in (XXVIII) below (XXVIII)

wherein X is S, O, N—H, N—R and ◯ represents an aromatic ring system; n is greater than 6; poly(dithienylcyclopentenone) as shown in (XXIV) below

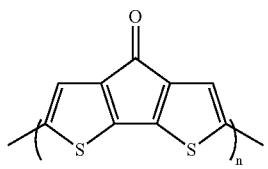

(XXIV)

wherein n is greater than 6;

The aromatics as defined herein are phenyl, biphenyl, terphenyl, carbazole, furan, thiophene, pyrrole, fluorene, thiazole, pyridine, 2,3,5,6-hexafluorobenzene, anthracene, coronene, indole, biindole, 3,4-ethylenedioxythiophene, 3,4-ethylenedioxypyrrole, and both the alkyl and alkoxy derivatives of these aromatics. An alkyl is preferably an aliphatic group with a branched or straight chain ranging from $CH_3$ to $C_{20}H_{41}$, while an alkoxy is preferably OR, where R is an aliphatic group that may either be branched or straight chain ranging from $CH_3$ to $C_{20}H_{41}$.

In one embodiment, the preferred ICP is a poly (thiophene). The preferred poly(thiophene)s are those having structural units of the general formulae (XXIX) and/or (XXX):

wherein n is greater than 6; poly(quinoline) as shown in (XXV) below

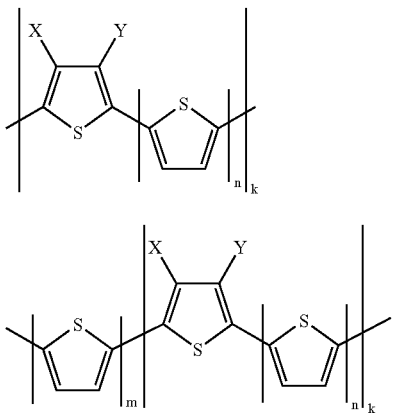

(XXIX)

(XXX)

where X and Y are either the same or different and may be hydrogen, alkyl, alkoxy, alkoxyalkyl, acyl, alkylene, alkylenedioxy, carboxy, ester, thioacyl, or the like, or combinations of at least one of the foregoing groups having about 1 to about 22 carbon atoms, with those having about 1 to about 20 carbon atoms being preferred, about 4 to about 20 carbon atoms being more preferred, about 8 to about 18 carbon atoms being particularly preferred and wherein n, m and k may be either the same or different. In general, n and m independently of one another are integers from about 1 to about 10, preferably integers from about 1 to about 6, and k is an integer from about 1 to about 3000, preferably about 1 to about 1000, and more preferably about 1 to about 100.

The thiophenes that may be used to derive the poly (thiophene) ICP's are 3,4-di(decyl)thiophene, 3,4-di(undecyl)thiophene, 3,4-di(dodecyl)thiophene, 3,4-di(tridecyl) thiophene, 3,4-di(tetradecyl)thiophene, 3,4-di(pentadecyl) thiophene, 3,4-di(hexadecyl)thiophene, 3,4-di(heptadecyl) thiophene, 3,4-di(octadecyl)thiophene, 3,4-di(decyloxy) thiophene, 3,4-di(undecyloxy)thiophene, 3,4-di-(dodecyloxy)thiophene, 3,4-di(tridecyloxy)thiophene, 3,4-di-(tetradecyloxy)thiophene, 3,4-di(pentadecyloxy) thiophene, 3,4-di-(hexadecyloxy)thiophene, 3,4-di (heptadecyloxy)thiophene, 3,4-di-(octadecyloxy)thiophene, 3,4-di(decyloxyethyl)thiophene, 3,4-di(undecyloxyethyl) thiophene, 3,4-di-(dodecyloxyethyl)thiophene, 3,4-di(tridecyloxyethyl)thiophene, 3,4-di-(tetradecyloxyethyl) thiophene, 3,4-di(pentadecyloxyethyl)thiophene, 3,4-di-(hexadecyloxyethyl)thiophene, 3,4-di(heptadecyloxyethyl) thiophene, 3,4-di-(octadecyloxyethyl)thiophene, 3,4-di((2-decyloxy)ethyl)thiophene, 3,4-di((3-decyloxy)propyl) thiophene, 3,4-di((4-decyloxy)butyl)thiophene, 3,4-di(2-(2-(decyloxyethoxy)ethyl)thiophene, 3,4-di(2-(2-(undecyloxyethoxy)ethyl)thiophene, 3,4-di(2-(2-(dodecyloxy)ethoxy)ethyl)thiophene, 3,4-di(cyclopentyl) thiophene, 3,4-di(cyclopentenyl)thiophene, 3,4-di (cyclohexyl)thiophene, 3,4-di(cyclohexenyl)thiophene, 3,4-di(cyclohexadienyl)thiophene, 3,4-di(phenyl)thiophene, 3,4-di(benzyl)thiophene, 3,4-di(decanoyl)thiophene, 3,4-di (undecanoyl)thiophene, 3,4-di(dodecanoyl)thiophene, 3,4-di(tridecanoyl)thiophene, 3,4-di(tetradecanoyl)thiophene, 3,4-di(pentadecanoyl)thiophene, 3,4-di(hexadecanoyl) thiophene, 3,4-di(heptadecanoyl)thiophene, 3,4-di(octadecanoyl)thiophene, 3,4-di(decanoyloxy)thiophene, 3,4-di(undecanoyloxy)thiophene, 3,4-di(decanoylamino)thiophene, 3,4-di(undecanoylamino)thiophene, 3,4-di(dodecanoylamino)thiophene, 3,4-di(tridecanoylamino)thiophene, 3,4-di(tetradecanoylamino)thiophene, 3,4-di(pentadecanoylamino)thiophene, 3,4-di(hexadecanoylamino)thiophene, 3,4-di(heptadecanoylamino)thiophene, 3,4-di(octadecanoylamino)thiophene, 2,3-dipentylthienol[3,4-b]pyrazine, 2,3-didecylthieno[3,4-b]pyrazine, 2,3-diundecylthieno[3,4-b] pyrazine, 2,3-didodecylthieno[3,4-b]pyrazine, 2,3-ditridecylthieno[3,4-b]pyrazine, 2,3-ditetradecylthieno[3,4-b]pyrazine, 2,3-dipentadecylthieno[3,4-b]pyrazine, 2,3-dihexadecylthieno[3,4-b]pyrazine, 2,3-diheptadecylthieno [3,4-b]pyrazine, 2,3-dioctadecylthieno[3,4-b]pyrazine, 2-methyl-3-decyloxythieno[3,4-b]pyrazine-, 2-methyl-3-undecyloxythieno[3,4-b]pyrazine-, 2-methyl-3-dodecyloxythieno[3,4-b]pyrazine-, 2-methyl-3-tridecyloxythieno[3,4-b]pyrazine-, 2-methyl-3-tetradecyloxythieno[3,4-b] pyrazine-, 2-methyl-3-pentadecyloxythieno[3,4-b] pyrazine-, 2-methyl-3-hexadecyloxythieno[3,4-b]pyrazine-, 2-methyl-3-octadecyloxythieno[3,4-b]pyrazine-, 2-methyl-3-eicosyloxythieno[3,4-b]pyrazine-, 2-methyl-3-docosyloxythieno[3,4-b]pyrazine-, 2-ethyl-3-decyloxythieno[3,4-b]pyrazine-2-ethyl-3-undecyloxythieno[3,4-b]pyrazine-, 2-ethyl-3-dodecyloxythieno[3,4-b]pyrazine-, 2-ethyl-3-tridecyloxythieno[3,4-b]pyrazine-, 2-ethyl-3-tetradecyloxythieno[3,4-b]pyrazine-, 2-ethyl-3-pentadecyloxythieno[3, 4-b]pyrazine-, 2-ethyl-3-hexadecyloxythieno[3,4-b] pyrazine-, 2-ethyl-3-octadecyloxythieno[3,4-b]pyrazine-, 2-ethyl-3-eicosyloxythieno[3,4-b]pyrazine-, 2-ethyl-3-docosyloxythieno[3,4-b]pyrazine-, 2-phenyl-3-decyloxythieno[3,4-b]pyrazine-, 2-phenyl-3-undecyloxythieno[3,4-b]pyrazine-, 2-phenyl-3-dodecyloxythieno[3,4-b]pyrazine-, 2-phenyl-3-tridecyloxythieno[3,4-b]pyrazine-, 2-phenyl-3-tetradecyloxythieno[3,4-b]pyrazine-, 2-phenyl-3-pentadecyloxythieno[3,4-b]pyrazine-, 2-phenyl-3-hexadecyloxythieno[3,4-b]pyrazine-, 2-phenyl-3-heptadecyloxythieno [3,4-b]pyrazine-, 2-phenyl-3-octadecyloxythieno[3,4-b] pyrazine-, 2-phenyl-3-eicosyloxythieno[3,4-b]pyrazine-, 2-phenyl-3-docosyloxythieno[3,4-b]pyrazine, 2,3-di(decyloxy)thieno[3,4-b]pyrazine, 2,3-di(undecyloxy)thieno[3,4-b]pyrazine, 2,3-di(dodecyloxy)thieno[3,4-b]pyrazine, 2,3-di (tridecyloxy)thieno[3,4-b]pyrazine, 2,3-di(tetradecyloxy) thieno[3,4-b]pyrazine, 2,3-di(pentadecyloxy)thieno[3,4-b] pyrazine, 2,3-di(hexadecyloxy)thieno[3,4-b]pyrazine, 2,3-di (heptadecyloxy)thieno[3,4-b]pyrazine, 2,3-di(octadecyloxy) thieno[3,4-b]pyrazine, 2,3-di(decyloxyethyl)thieno[3,4-b] pyrazine, 2,3-di(undecyloxyethyl)thieno[3,4-b]pyrazine, 2,3-di(dodecyloxyethyl)thieno[3,4-b]pyrazine, 2,3-di(tridecyloxyethyl)thieno[3,4-b]pyrazine, 2,3-di(tetradecyloxyethyl)thieno[3,4-b]pyrazine, 2,3-di(pentadecyloxyethyl) thieno[3,4-b]pyrazine, 2,3-di(hexadecyloxyethyl)thieno[3, 4-b]pyrazine, 2,3-di(heptadecyloxyethyl)thieno[3,4-b] pyrazine, 2,3-di(octadecyloxyethyl)thieno[3,4-b]pyrazine, 2,3-di(ethyl-2-oxydecyl)thieno[3,4-b]pyrazine, 2,3-di(propyl-3-oxydecyl)thieno[3,4-b]pyrazine, 2,3-di(butyl-4-oxydecyl)thieno[3,4-b]pyrazine, 2,3-di(cyclopentyl)thieno[3,4-b]pyrazine, 2,3-di(cyclopentenyl)thieno[3,4-b]pyrazine, 2,3-di(cyclohexyl)thieno[3,4-b]pyrazine, 2,3-di(cyclohexenyl)thieno[3,4-b]pyrazine, 2,3-di(cyclohexadienyl)thieno [3,4-b]pyrazine, 2,3-di(phenyl)thieno[3,4-b]pyrazine, 2,3-di (benzyl)thieno[3,4-b]pyrazine, 5,6-di(decyloxy)cyclobuta [b]thieno[3,4-e]pyrazine, 5,6-di(undecyloxy)cyclobuta[b] thieno[3,4-e]pyrazine, 5,6-di(dodecyloxy)cyclobuta[b] thieno [3,4-e]pyrazine, 5,6-di(tridecyloxy)cyclobuta[b] thieno[3,4-e]pyrazine, 5,6-di(tetradecyloxy)cyclobuta[b] thieno[3,4-e]pyrazine, 5,6-di(pentadecyloxy)cyclobuta[b] thieno[3,4-e]pyrazine, 5,6-di(hexadecyloxy)cyclobuta[b] thieno[3,4-e]pyrazine, 5,6-di(heptadecyloxy)cyclobuta[b] thieno[3,4-e]pyrazine. 5,6-di(octadecyloxy)cyclobuta[b]

thieno[3,4-e]pyrazine, 5,6-di(cyclopentyloxy)cyclobuta[b]thieno[3,4-e]pyrazine, 5,6-di(cyclopentenyloxy)cyclobuta[b]thieno[3,4-e]pyrazine, 5,6-di(cyclohexyloxy)cyclobuta[b]thieno[3,4-e]pyrazine, 5,6-di(cyclohexenyloxy)cyclobuta[b]thieno[3,4-e]pyrazine, 5,6-di(cyclohexadienyloxy)cyclobuta[b]thieno[3,4-e]pyrazine, 5,6-di(phenyl)cyclobuta[b]thieno[3,4-e]pyrazine, 5,6-di(benzyl)cyclobuta[b]thieno[3,4-e]pyrazine, 2-decyl-1H-thieno[3,4-d]imidazole, 2-undecyl-1H-thieno[3,4-d]imidazole, 2-dodecyl1H-thieno[3,4-d]imidazole, 2-tridecyl-1H-thieno[3,4-d]imidazole, 2-tetradecyl-1H-thieno[3,4-d]imidazole, 2-pentadecyl-1H-thieno[3,4-d]imidazole, 2-hexadecyl-1H-thieno[3,4-d]imidazole, 2-heptadecyl-1H-thieno[3,4-d]imidazole, 2-octadecyl-1H-thieno[3,4-d]imidazole, 2-cyclopentyl-1H-thieno[3,4-d]imidazole, 2-cyclopentenyl-1H-thieno[3,4-d]imidazole, 2-cyclohexyl-1H-thieno[3,4-d]imidazole, 2-cyclohexenyl 1H-cyano[3,4-d]imidazole, 2-cylohexadienyl-1H-thieno[3,4-d]imidazole, 2-phenyl-1H-thieno[3,4-d]imidazole, 2-benzyl-1H-thieno[3,4-d]imidazole, 2-butylthio-1H-thieno[3,4-d]imidazol-, 2-pentylthio-1H-thieno[3,4-d]imidazol-, 2-hexylthio-1H-thieno[3,4-d]imidazol-, 2-heptylthio-1H-thieno[3,4-d]imidazol-, 2-octylthio-1H-thieno[3,4-d]imidazol-, 2-nonylthio-1H-thieno[3,4-d]imidazol-, 2-decylthio-1H-thieno[3,4-d]imidazol-, 2-undecylthio 1H-thieno[3,4-d]imidazol-, 2-dodecylthio-1H-thieno [3,4-d]imidazol-, 2-tride-cylthio-1H-thieno [3,4-d]imidazol-, 2-tetradecylthio-1H-thieno [3,4-d]imidazol-, 2-pentadecylthio-1H-thieno[3,4-d]imidazol-, 2-hexadecylthio-1H-thieno[3,4-d]imidazol-, 2-heptadecylthio-1H-thieno[3,4-d]imidazol-, 2-octodecylthio-1H-thieno[3,4-d]imidazol, or the like, or combinations comprising at least one of the foregoing thiophenes.

In general, as stated above, the thiophene or poly(thiophene) may be copolymerized with a non-electrically conducting polymer. The non-electrically conducting polymer may form the backbone, while the poly(thiophene) or the thiophene is grafted onto the backbone. Alternatively, the thiophene or the poly(thiophene) and the non-electrically conducting polymer may be copolymerized to form of star block copolymers, block copolymers, dendrimers, or the like, or combinations comprising at least one of the foregoing copolymers. In one embodiment, the preferred backbone is a norbornylene with the thiophene grafted onto the norbornylene as shown in formula (XXXI) and (XXXII):

(XXXI)

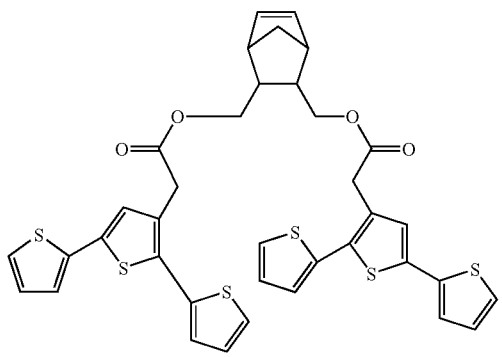

(XXXII)

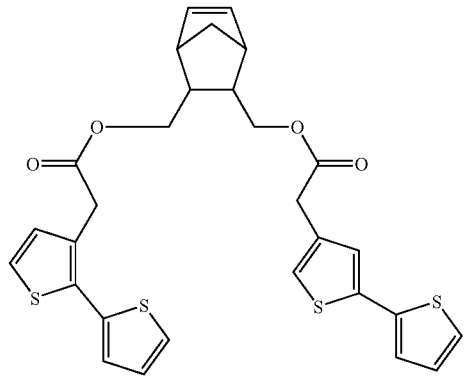

The norbornylene of the structures (XXXI) and (XXXII) is then polymerized to polynorbornylene with the thiophene grafted onto the polynorbornylene as shown in formula (XXXIII) or formula (XXXIV):

(XXXIII)

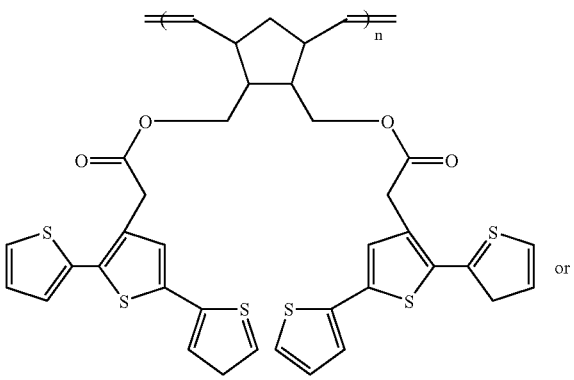

or (XXXIV)

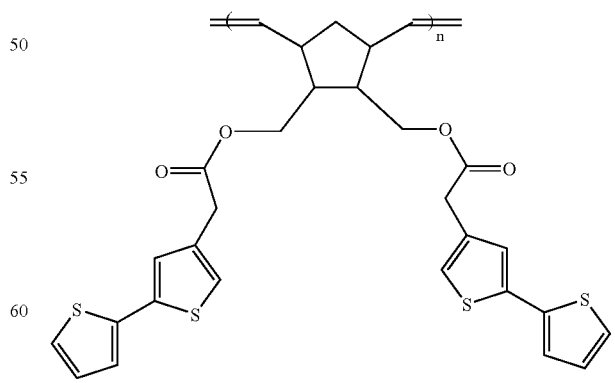

The covalently bonded thiophene graft in the formula (XXXIII) or (XXXIV) may be polymerized by oxidation with oxidants such as ferric trichloride either chemically or electrochemically to form the structure shown in formula (XXXV) or formula (XXXVI) below:

(XXXV)

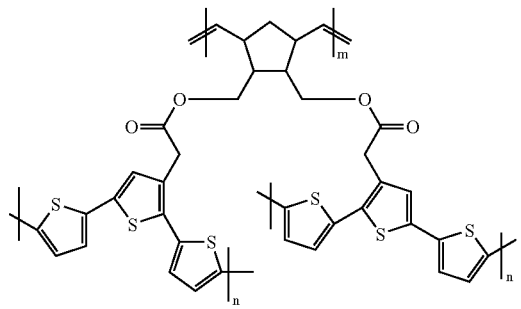

or (XXXVI)

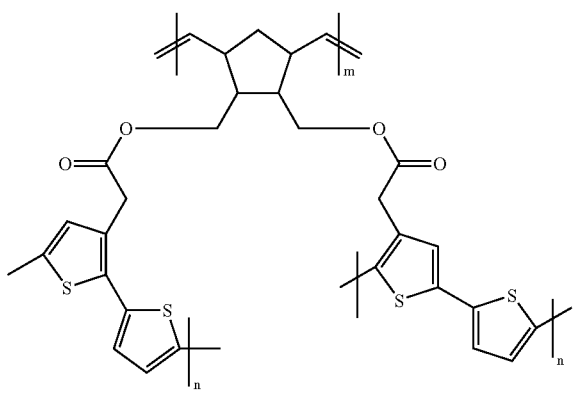

where m and n are about 1 to about 3000.

In another embodiment, bis(terthienyl)norbornylene monomer may be polymerized to obtain the poly(thiophene) shown in formula (XXXVII) or formula (XXXVIII):

(XXXVII)

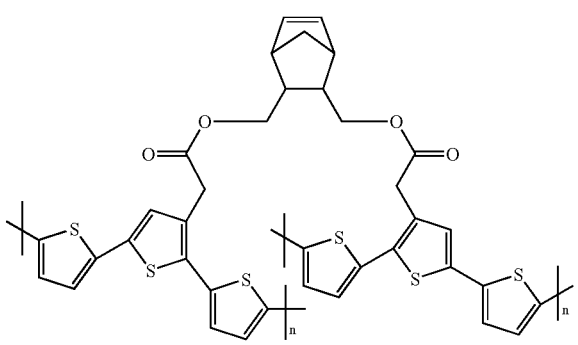

-continued (XXXVIII)

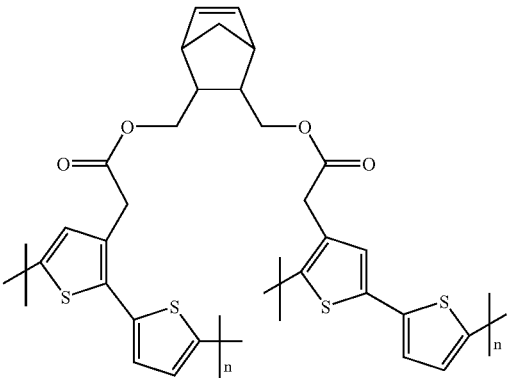

where n is about 1 to about 3000. The norbornylene of structures XXXVII and XXXVIII may be later polymerized if desired to form polynorbornylene.

The polymerization of the thiophene to form the poly(thiophene) also promotes crosslinking of the ICP, since a thiophene or poly(thiophene) graft covalently bonded to a first norbornylene backbone generally reacts with a thiophene or poly(thiophene) graft covalently bonded to a second norbornylene backbone. In the conductive state, there is a positive charge on the backbone of the conjugated polymer and there is a negative ion associated with that positive charge. For example, if ferric chloride is used as the oxidant, then $Cl^-$ would be one of the charge compensating counter ions. As another example, if the polymerization to form ICP is carried out electrochemically and tetrabutylammonium perchlorate is used as the electrolyte, then perchlorate would be the charge compensating counter ion.

As stated above, crosslinking may also be achieved through the use of other reactive functionalities, which are covalently bonded directly to the ICP's, the ICP precursors or the non-electrically conducting polymers. Crosslinking may thus be achieved by reacting the functionalities covalently bonded to the ICP's, the ICP precursors or the non-electrically conducting polymers with each other. It is generally preferred to react the reactive functionalities on the ICP's or the ICP precursors with each other to achieve crosslinking. The reactive functionalities used in either the ICP, the ICP precursor and/or the non-electrically conducting polymers for purposes of crosslinking may be $SO_3H$, COOH, $NH_2$, OH, R'CHOH, CHO, CN, COCl, COSH, SH, COOR', SR', $SiR_3'$, $Si-(OR')_y-R'_{(3-y)}$, R''', $AlR_2'$, halide, thiophene, ethylenically unsaturated functionalities, epoxide functionalities, or the like, wherein R' is hydrogen, alkyl, aryl, cycloalkyl, or araalkyl, cycloaryl, poly(alkylether), or the like, R'' is fluoroalkyl, fluoroaryl, fluorocycloalkyl, fluoroaralkyl, cycloaryl, X is halide, and Z is carboxylate, trifluoroacetate, or the like.

Crosslinking of the ICP's, ICP precursors, and the non-electrically conducting polymers may be brought about by reacting the aforementioned functionalities via anionic polymerization, cationic polymerization, free radical polymerization, addition polymerization, condensation polymerization, or the like, or combinations comprising at least one of the foregoing methods of polymerization. The preferred functional group is thiophene and the crosslinking is preferably achieved through oxidative radical cation coupling.

The crosslinking is generally brought about by oxidation. Methods such as chemical oxidation or electrochemical oxidation may be advantageously used to facilitate the crosslinking. Oxidizing agents such as ammonium peroxydisulphate, potassium persulfate, ferric trichloride ($FeCl_3$), iron (III) salts such as, but not limited to, iron (III) tosylate, iron methane sulfonate, salts of permanganates, peracetates, chromates, dichromates, hydrogen peroxide, nitrosyl trifluoromethylsulfonate, nitrosyl bis(trifluoromethylsulfonyl)imide, or the like, or combinations comprising at least one of the foregoing oxidizing agents may be used to facilitate the crosslinking. In the case of electrochemical oxidation, electron transfer between the working electrode and the precursor polymer in the presence of electrolyte carries out the oxidation.

Electrolytes consist of a solvent and a salt. Examples of solvents include water, alcohols such as methanol, ethanol, and the like, acetonitrile, butyrolactone, propylene carbonate, ethylene carbonate, ethylene glycol, diglyme, triglyme, tetraglyme, nitromethane, nitrobenzene, benzonitrile, methylene chloride, chloroform and other solvents having dielectric constants of greater than 2. Salts consist of a cation and an anion. Examples of cations for the salt are sodium, lithium, potassium, magnesium, tetrabutylammonium, tetraethylammonium, other tetraalkyl ammonium by which the alkyl groups on the nitrogen could all be the same or be different and the alkyl groups could be branched or linear, imidazolium, and the like. Examples of anions include the halides such as fluoride, chloride, bromide and iodide, perchlorate, tetrafluoroborate, hexafluorophosphate, trifluoromethanesulfonate, bis(trifluoromethansulfonimide), tosylate, mesylate, dodecylsulfonate and any other sulfonated benzene system, camphor sulfonate, naphthalene sulfonate, and any other aromatic sulfonate including polymeric sulfonates such as polystyrene sulfonate. The preferred oxidizing agent is ferric trichloride for chemical oxidative crosslinking and the preferred electrolyte is tetrabutylammonium perchlorate for electrochemical oxidative crosslinking.

When electrochemistry is utilized for oxidation, it is the potential of the working electrode that drives the oxidation. The electrolyte that is used for the electrochemistry will therefore affect the type of ICP that is manufactured. For example, when an ICP is crosslinked in lithium tetrafluoroborate, the tetrafluoroborate will be the charge compensating counter ion. If lithium perchlorate is used then perchlorate will be the counter ion. There are many different electrolytes that can be used in which the counter ion could be hexafluorophosphate, tetrafluoroborate, perchlorate, tosylate, trifluorosulfonamide, trifluoromethanesulfonate, or the like, or combinations comprising at least one of the foregoing counter ions.

In general, in an electrolytic cell, the electrolytic medium comprises an electrolyte and a solvent. The electrolyte gives rise to the charge compensating counterions. The electrolytic medium may comprise an amount of about 0.01 mole to 10 molar, based on the molarity of the electrolyte. Within this range, it is generally desirable to have the electrolyte present in an amount of greater than or equal to about 0.05 molar, preferably greater than or equal to about 0.1 molar, and more preferably greater than or equal to about 0.5 molar, based on the total molarity of the electrolyte. Within this range, it is also desirable to have the electrolyte present in an amount of less than or equal to about 9.5 molar, preferably less than or equal to about 9.25 molar, and more preferably less than or equal to about 9 molar, based on the total molarity of the electrolyte.

For the chemical oxidant, it is generally desirable to employ a molar ratio wherein the moles of oxidant to the moles of the ICP precursor ranges is in an amount of about 0.5 to 12. The moles of the ICP precursor is the molecular mass of the polymer repeat unit. Within this range, it is generally desirable to have the molar ratio of the oxidizing agent to the ICP precursor greater than or equal to about 0.8, preferably greater than or equal to about 1, and more preferably greater than or equal to about 1.5. Within this range, it is generally desirable to have the molar ratio of the oxidizing agent to the ICP precursor less than or equal to about 11, preferably less than or equal to about 10, and more preferably less than or equal to about 8.

In addition to the oxidizing agents, it may optionally be desirable to add dopants to convert an ICP precursor to an ICP. For example, dopants are often utilized to convert non-conductive forms of poly(aniline) such as leuco emeraldine to conductive forms of poly(aniline) such as emeraldine or prenigraniline. A dopant as defined here is not the same as that defined within conventional semiconductors like indium doped tin oxide. For conducting polymers, the dopant, in general, refers to the charge compensating dopant ion. For example, for a p-doped polymer, positive charges exist on the polymer backbone and the dopant would be the compensating negative ion, which could be mono, di or trivalent. For example, chloride would be a monovalent ion and sulfate would be a divalent ion. Other "dopant ions" are toluene sulfonate, methanesulfonate, perchlorate, tetrafluoroborate, triflate, or the like, or combinations comprising at least one of the foregoing dopant ions. Doping of the conductive polymer is the process to take it from the insulating state to the positively charged quinoidal backbone. Doping can be performed electrochemically or chemically. For example, if ferric chloride is used to dope the polymer, then the dopant ion that gets incorporated into the polymer will be chloride.

For polyanilines, dopants are generally strong acids such as p-toluenesulfonic acid, naphthalene disulfonic acid, methane sulfonic acid, hydrochloric acid, chloromethyl sulfonic acid, fluoromethyl sulfonic acid, oxalic acid, sulfosalicylic acid, trifluoroacetic acid, dodecylbenzene sulfonic acid, or the like, or combinations comprising at least one of the foregoing acids. Dopants are generally added in an amount of about 0.05 moles to about 100 moles based on the total number of moles of the crosslinked ICP formed. Within this range it is generally desirable to have the dopant present in an amount of greater than or equal to about 1 moles, preferably greater than or equal to about 2 moles, and more preferably greater than or equal to about 3 moles, based on the total number of moles of the crosslinked ICP formed. Within this range it is also desirable to have the dopant present in an amount of less than or equal to about 95 moles, preferably less than or equal to about 90 moles, and more preferably less than or equal to about 75 moles, based on the total number of moles of the crosslinked ICP formed.

Solvents may optionally be used to swell the ICP precursor to the ICP in order to facilitate the crosslinking. As stated above, if a solvent is used, it is desired that the solvent only swell the ICP precursor without completely dissolving it. The solvent utilized for facilitating the crosslinking of the ICP precursor may be one that can swell either the ICP precursor, the non-electrically conducting polymer or oligomer to which the ICP precursor is covalently bonded, or both the ICP precursor and the non-electrically conducting polymer or oligomer to which the ICP precursor is covalently bonded. Liquid aprotic polar solvents such as water, propylene carbonate, ethylene carbonate, butyrolactone, acetonitrile, benzonitrile, nitromethane, nitrobenzene, sulfolane, dimethylformamide, N-methylpyrrolidone, or the like, or combinations comprising at least one of the foregoing solvents are generally desirable. Polar protic solvents such as, but not limited to, water, methanol, acetonitrile, nitromethane, ethanol, propanol, isopropanol, butanol, or the like, or combinations comprising at least one of the foregoing polar protic solvents may be used. Other non-polar solvents such a benzene, toluene, methylene chloride, carbon tetrachloride, hexane, diethyl ether, tetrahydrofuran, or the like, or combinations comprising at least one of the foregoing solvents may also be used. Co-solvents comprising at least one aprotic polar solvent and at least one non-polar solvent may also be utilized to modify the swelling power of the solvent and thereby adjust the rate of crosslinking of the ICP or the ICP precursor. Ionic liquids, which mainly comprise the imidazolium salts, may also be utilized for swelling the polymer.

The crosslinking of the ICP or the ICP precursor in the solid state to form the crosslinked ICP may take place either in the bulk state or in the form of a thin film. Preferably, the bulk state is a mass of ICP or ICP precursor unswollen by solvent and having its smallest dimension greater than or equal to about 1000 nanometers. It is generally desirable for a particle in the bulk state to have its smallest dimension greater than or equal to about 1500, preferably greater than or equal to about 2000, and more preferably greater than or equal to about 2500 nanometers. A preferred thin film, is an ICP or an ICP precursor film having a thickness of less than or equal to about 1000 nanometers. In general, it is desirable to have the film thickness of less than or equal to about 750, preferably less than or equal to about 500, more preferably less than or equal to about 400 nanometers. While the ICP or the ICP precursor in the solid state is unswollen by solvent during the process of crosslinking, it is envisioned that the solid particles of the ICP may be dispersed in, but not swollen by a solvent during the process of crosslinking.

Alternatively, the crosslinking may also occur in the swollen state. In general, the solvent may cause the ICP or the ICP precursor to increase in an amount of about 0.1 volume percent (vol %) to about 300 vol % based on the original volume of the ICP or the ICP precursor. Within this range, it is generally desirable to have an increase greater than or equal to about 1 vol %, and preferably greater than or equal to about 4 vol %, based on the original volume of the ICP or the ICP precursor. Within this range, it is also generally desirable to have an increase of less than or equal to about 250 vol %, preferably less than or equal to about 200 vol % and more preferably less than or equal to about 120 vol % based on the original volume of the ICP or the ICP precursor. The most preferred increase in volume is about 10 vol %, based on the original volume of the ICP or the ICP precursor.

Crosslinking generally takes place by chemical oxidation and can also take place by electrochemical oxidation. When a crosslinked ICP is formed via chemical oxidation, the ICP precursor in the solid or swollen state is generally immersed or dissolved in a solution containing the oxidant. The time period for the immersion may vary depending upon the size of the ICP precursor particles or the thickness of the ICP precursor film. In general a time period of about 30 seconds to about 180 minutes is desirable. Within this range, a time period of greater than or equal to about 45 seconds, preferably greater than or equal to about 1 minute, and more preferably greater than or equal to about 3 minutes is generally desired. Within this range, a time period of less than or equal to about 180 minutes, preferably less than or equal to about 150 minutes, and more preferably less than or equal to about 120 minutes is generally desired.

During the chemical oxidation, the temperature may be raised or lowered in order to control reaction and diffusion kinetics. In general, temperatures of about −50° C. to about 100° C. may be employed. Within this range, it is generally desirable to employ temperatures of greater than or equal to about −30° C., preferably greater than or equal to about −10° C., and more preferably greater than or equal to about −5° C. Within this range, it is also desirable to employ temperatures of less than or equal to about 90° C., preferably less than or equal to about 80° C., and more preferably less than or equal to about 50° C. Agitation may be optionally utilized during the process of chemical oxidation.

Electrochemical oxidation may also be utilized to oxidize the ICP precursors in the bulk state or in thin film form. The ICP precursors may be optionally swollen with solvent prior to or during the electrochemical oxidation process, if desired. In electrochemical oxidation, an ICP precursor film is generally applied onto a substrate, which can optionally be utilized as the working electrode in an electrochemical cell or the substrate may be an insulator and an external conductive probe or pattern be utilized as the working electrode. Oxidation generally occurs rapidly upon the application of a voltage sufficient to convert the pendant polymerizable unit to a radical cation to the working electrode. The rate of oxidation is dependent upon a number of factors such as, but not limited to, the amount of swelling, the polarity of the solvent, concentration of the precursor monomer units on the backbone of the precursor polymer, the conductivity of the crosslinked ICP formed and the like. This method of oxidation can be advantageously used for microlithographic or nanolithographic direct-write and patterning procedures.

An ICP precursor is preferably cast as a thin film onto a variety of different substrates prior to electrochemical oxidation. The substrates may generally be made from optically clear glass (e.g. silicate glass, aluminosilicate glass, indium tin oxide, or the like) plastic (e.g., polycarbonate, polymethylmethacrylate, polyethyleneterephthalate (PET), polystyrene, polyethylene, or the like), ceramic (e.g., alumina, zirconia, calcium oxide, or the like), metals (e.g., copper, gold, platinum, nickel, or the like), or combinations comprising at least one of the foregoing substrate materials. Substrates comprising transparent semi-conductors such as, but not limited to, tin oxide, tungsten trioxide, silicon, silicon nitride, gallium arsenide, and the like, may also be utilized as substrates.

In one embodiment, a nanolithographic pattern may be established upon a patterned substrate by coating the substrate with a thin film of ICP precursor and subsequently electrochemically oxidizing the ICP precursor to form an ICP.

In another embodiment, the substrate may be an insulating substrate having a pattern derived from an electrically conductive material predisposed on it. The insulating substrate is generally a non-electrically conducting material such as plastics, ceramics, or the like, or combinations comprising at least one of the foregoing insulating materials. The electrically conductive material utilized in the pattern may by disposed onto the substrate through etching, plating, chemical vapor deposition, painting, or the like, and may comprise electrically conductive filler particles or insulating filler particles. The combination of and ICP precursor with the filler particles is termed a precursor composite.

There is no particular limitation to the shape of the filler particles, which may be for example, spherical, irregular, fractal, plate-like or whisker like. The particles may be nanosized or micrometer sized. Suitable examples of the nanosized particles are carbon nanotubes, carbon black, fullerenes, buckyballs, or the like, or combinations comprising at least one of the foregoing nanosized particles.

The carbon nanotubes may be single wall carbon nanotubes (SWNT's), multiwall carbon nanotubes (MWNTs), vapor grown carbon fibers (VGCF), or combinations comprising at least one of the foregoing types of nanotubes. SWNTs used in the composition may be produced by laser-evaporation of graphite, carbon arc synthesis or the high-pressure carbon monoxide conversion process (HIPCO) process. These SWNTs generally have a single wall comprising a graphene sheet with outer diameters of about 0.7 to about 2.4 nanometers (nm). SWNTs having aspect ratios of greater than or equal to about 5, preferably greater than or equal to about 100, more preferably greater than or equal to about 1000 are generally utilized in the compositions. While the SWNTs are generally closed structures having hemispherical caps at each end of the respective tubes, it is envisioned that SWNTs having a single open end or both open ends may also be used. The SWNTs generally comprise a central portion, which is hollow, but may be filled with amorphous carbon.

In one embodiment, the SWNTs may exist in the form of rope-like-aggregates. These aggregates are commonly termed "ropes" and are formed as a result of Van der Waal's forces between the individual SWNTs. The individual nanotubes in the ropes may slide against one another and rearrange themselves within the rope in order to minimize the free energy. Ropes generally having between 10 and $10^5$ nanotubes may be used in the compositions. Within this range, it is generally desirable to have ropes having greater than or equal to about 100, preferably greater than or equal to about 500 nanotubes. Also desirable, are ropes having less than or equal to about $10^4$ nanotubes, preferably less than or equal to about 5,000 nanotubes.

In another embodiment, the SWNTs may comprise a mixture of metallic nanotubes and semi-conducting nanotubes. Metallic nanotubes are those that display electrical characteristics similar to metals, while the semi-conducting nanotubes are those, which are electrically semi-conducting. In general the manner in which the graphene sheet is rolled up produces nanotubes of various helical structures. Zigzag and armchair nanotubes constitute two possible confirmations. In order to minimize the quantity of SWNTs utilized in the composition, it is generally desirable to have the composition comprise as large a fraction of metallic SWNTs. It is generally desirable for the SWNTs used in the precursor composite to comprise metallic nanotubes in an amount of greater than or equal to about 1 wt %, preferably greater than or equal to about 20 wt %, more preferably greater than or equal to about 30 wt %, even more preferably greater than or equal to about 50 wt %, and most preferably greater than or equal to about 99.9 wt % of the total weight of the SWNTs. In certain situations, it is generally desirable for the SWNTs used in the precursor composite to comprise semi-conducting nanotubes in an amount of greater than or equal to about 1 wt %, preferably greater than or equal to about 20 wt %, more preferably greater than or equal to about 30 wt %, even more preferably greater than or equal to about 50 wt %, and most preferably greater than or equal to about 99.9 wt % of the total weight of the SWNTs.

The precursor composite may also contain other carbon nanotubes such as MWNTs and VGCF. MWNTs are derived from processes such as laser ablation and carbon arc synthesis. MWNTs have at least two graphene layers bound around an inner hollow core. Hemispherical caps generally close both ends of the MWNTs, but it may be desirable to use MWNTs having only one hemispherical cap or MWNTs, which are devoid of both caps. MWNTs generally have diameters of about 2 to about 50 nm. When MWNTs are used, it is preferred to have an average aspect ratio greater than or equal to about 5, preferably greater than or equal to about 100, more preferably greater than or equal to about 1000.

Other conductive fillers such as vapor grown carbon fibers, carbon black, conductive metallic fillers, solid non-metallic, conductive fillers, or the like, or combinations comprising at least one of the foregoing may optionally be used in the compositions. Vapor grown carbon fibers or small graphitic or partially graphitic carbon fibers, also referred to as vapor grown carbon fibers (VGCF), having diameters of about 3.5 to about 2000 nanometers (nm) and an aspect ratio greater than or equal to about 5 may also be used.

Solid conductive metallic fillers may also optionally be used in the conductive compositions. These may be electrically conductive metals or alloys that do not melt under conditions used in incorporating them into the organic polymer, and fabricating finished articles therefrom. Metals such as aluminum, copper, magnesium, chromium, tin, nickel, silver, iron, titanium, gold, platinum, and mixtures comprising any one of the foregoing metals can be incorporated into the organic polymer as conductive fillers. Physical mixtures and true alloys such as stainless steels, bronzes, and the like, may also serve as conductive filler particles. In addition, a few intermetallic chemical compounds such as borides, carbides, and the like, of these metals, (e.g., titanium diboride) may also serve as conductive filler particles. Solid non-metallic, conductive filler particles such as tin-oxide, indium tin oxide, and the like may also optionally be added to render the organic polymer conductive. The solid metallic and non-metallic conductive fillers may exist in the form of powder, drawn wires, strands, fibers, tubes, nanotubes, flakes, laminates, platelets, ellipsoids, discs, and other commercially available geometries.

Non-conductive, non-metallic fillers that have been coated over a substantial portion of their surface with a coherent layer of solid conductive metal may also optionally be used in the conductive compositions. The non-conductive, non-metallic fillers are commonly referred to as substrates, and substrates coated with a layer of solid conductive metal may be referred to as "metal coated fillers". Typical conductive metals such as aluminum, copper, magnesium, chromium, tin, nickel, silver, iron, titanium, and mixtures comprising any one of the foregoing metals may be used to coat the substrates. Examples of such substrates include silica powder, such as fused silica and crystalline silica, boron-nitride powder, boron-silicate powders, alumina, magnesium oxide (or magnesia), wollastonite, including surface-treated wollastonite, calcium sulfate (as its anhydride, dihydrate or trihydrate), calcium carbonate, including chalk, limestone, marble and synthetic, precipitated calcium carbonates, generally in the form of a ground particulates, talc, including fibrous, modular, needle shaped, and lamellar talc, glass spheres, both hollow and solid, kaolin, including hard, soft, calcined kaolin, and kaolin comprising various coatings to facilitate compatibility with the polymeric matrix polymer, mica, feldspar, silicate spheres, flue dust, cenospheres, fillite, aluminosilicate (armospheres), natural silica sand, quartz, quartzite, perlite, tripoli, diatomaceous earth, synthetic silica, and mixtures comprising any one of the foregoing. All of the above substrates may be coated with a layer of metallic material for use in the conductive compositions. The aforementioned non-metallic, non-conductive fillers may also be used in the precursor composite without the conductive coating.

Electrically conductive fillers as well as the non-metallic, non-conductive fillers are generally used in amounts of about 0.001 to about 90 wt % based on the total weight of the precursor composite. Within this range, the electrically conductive fillers as well as the non-metallic, non-conductive fillers are generally used in amounts greater than or equal to about 0.25 wt %, preferably greater or equal to about 0.5 wt %, more preferably greater than or equal to about 1 wt % of the total weight of the precursor composite. The electrically conductive fillers as well as the non-metallic, non-conductive fillers are furthermore generally used in amounts less than or equal to about 80 wt %, preferably less than or equal to about 40 wt %, preferably less than or equal to about 30 wt %, preferably less than or equal to about 20 wt %, more preferably less than or equal to about 5 wt % of the total weight of the precursor composite. The precursor composite may be crosslinked by chemical or electrochemical oxidation to produce intrinsically conductive polymer Preferred electrically conductive materials utilized in the pattern disposed upon the substrate are indium tin oxide, carbon, carbon nanotubes, gold, platinum, or nickel while preferred substrates are transparent glass, polycarbonate, polyester, polyacrylates, polyamide, polyimide, polysulfone, polyolefin, polyether or polymethylmethacrylate. Since crosslinking within the ICP precursors generally occurs with a change in color, the application of an electrical voltage to the conductive predisposed pattern promotes crosslinking in those parts of the ICP precursor film directly exposed to the voltage. This results in the formation of a pattern either on or within the film. The unreacted portions of the film may then be dissolved away if desired.

In another embodiment, the substrate may be electrically conductive, while the pattern predisposed upon the substrate may be insulating in nature. When such a substrate is used, the voltage may be applied to the electrically conductive portion of the substrate via electrical contacts. The ICP precursor generally undergoes crosslinking in those portions of the substrate carrying an electrical charge. The portions of the ICP precursor that do not undergo crosslinking may then be dissolved away if so desired, resulting in a pattern formed by the crosslinked ICP upon the substrate.

Another method of applying a pattern to a film comprises bringing an external electrode into contact with an ICP precursor film disposed upon a substrate. The substrate may either be an insulator, a conductor or a semiconductor or a combination thereof. The substrate along with the film are then placed in an electrolytic cell and an external electrode bearing a negative of a desired image is then pressed against the surface of the film opposite to the surface disposed on the substrate. When a voltage is applied across the film, via the electrode and the substrate, crosslinking occurs in those regions of the film, which have been contacted with the external electrode. Since the crosslinking is generally accompanied by a change in color, an image is formed on the film. While the external electrode may have any desired tip size, a tip size of less than or equal to about 200 nanometers for the purpose of patterning nanolines is suitable. A pattern may be generated on the surface i.e., an embossed pattern or may be generated below the surface, i.e., an embedded surface. In general, nanoscale patterns can be generated using electrochemical atomic force microscopy. Patterns formed above the surface, i.e., embossed patterns are formed by using contact mode, while patterns are imbedded into the surface by using tapping mode. It is also to be noted that increasing the oxidative potential during patterning increases crosslinking speed away from tip (potentially leading toward faster writing) and that propagation speed away from the electrode tip is faster for contact mode vs. tapping mode. This is because the tip is in contact with the surface longer during patterning using the contact mode.

In general, when electrochemical oxidation is used to bring about crosslinking, a voltage of about 0.1 volt to about 10 volt may be used in the electrochemical cell. Generally, the voltage is dependent upon the oxidation potential of the polymerizable unit of the precursor polymer. It is preferred that the voltage be proportional to the voltage that is desirable at the onset for oxidation of the polymerizable unit and more preferred that the voltage be at the peak for polymerizable unit oxidation. Similarly, within this range it is desirable for the voltage to be less than 1 volt above the peak for polymerizable unit oxidation and more preferably less than 0.8 volt above the peak for polymerizable unit oxidation.

Alternatively it may be desirable to use a current for galvanostatic electrochemical polymerization of about 0.1 milliamperes/cm$^2$ to about 20 amperes/cm$^2$ in the electrochemical cell. Within this range, it is desirable to use a current of greater than or equal to about 0.1, preferably greater than or equal to about 0.3, and more preferably greater than or equal to about 0.5 milliamperes/cm$^2$. Similarly, within this range, it is desirable to use a current of less than or equal to about 18, preferably less than or equal to about 15, and more preferably less than or equal to about 10 amperes/cm$^2$.

It is generally desirable to apply the aforementioned voltages and/or currents to patterns having overall surface areas, greater than or equal to about 0.5 square micrometers ($\mu m^2$), preferably greater than or equal to about 10 $\mu m^2$, more preferably greater than or equal to about 20 $\mu m$, more preferably greater than or equal to about 25 $\mu m^2$, and most preferably greater than or equal to about 50 $\mu m^2$.

In yet another embodiment, a nanolithographic pattern may be generated on an ICP precursor film disposed upon a substrate, by utilizing electrochemical atomic force microscopy (AFM). In this method, an AFM tip (coated with conductor such as gold, platinum/iridium, carbon, modified with carbon nanotubes) is used as a working electrode in an electrolytic cell to generate the desired pattern on the ICP precursor film. The AFM tip is either brought into contact with the ICP precursor film or brought into the proximity of the ICP precursor film without touching the film, and a suitable voltage is applied between the electrochemical AFM tip and the substrate, which promotes crosslinking of those regions of the ICP precursor film which have been contacted by (or brought in close proximity to) the AFM tip. Since a color change occurs in the ICP precursor film upon crosslinking, a pattern is generated in the areas of the film exposed to the voltage. Furthermore, since crosslinked polymers are denser than the corresponding uncrosslinked precursor polymers, they can be observed with tapping mode AFM run in phase mode. In one embodiment, the pattern generated may be in the form of a straight line, a curved line, a dot, a plane, or any other desirable geometrical shape. The pattern may be one dimensional, two dimensional or three dimensional if desired and may be formed upon the surface as an embossed structure or embedded within (below) the surface.

This method of crosslinking ICP's and ICP precursors has a number of advantages especially in the area of lithographic patterning of substrates. Crosslinking in the solid and/or the swollen state permits high speed pattern transfer, especially since the ICP or the ICP precursor can crosslink away from the electrode at a rate of 30,000 nanometers/second. This is novel in that this described process does not exhibit nucleation and growth. Nucleation and growth is commonly encountered with other methods of "conventional electrochemical polymerization" of monomer from electrolyte solution that has monomer dissolved in it. Here "conventional electrochemical polymerization" is defined as the method by which the monomer is dissolved in electrolyte solution and a potential (or current) is applied to the working electrode by which oxidation of the monomer takes place to form the corresponding radical cation which then undergoes a series of coupling processes to form higher oligomers and, after a suitable length of oligomer has been achieved by which the oligomers or polymers become insoluble in solution, electrodeposition takes place via a nucleation and growth mechanism.

Figure 1A:
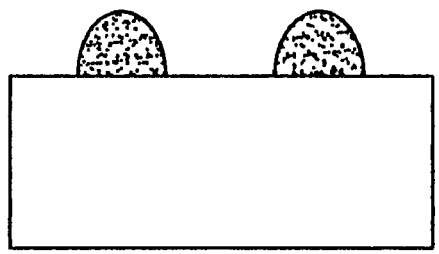
FIG. 1(a) is a schematic depicting crosslinked intrinsically conductive polymer (ICP) disposed upon the surface of the substrate, while 1(b) is a schematic depicting crosslinked ICP embedded within the substrate.
Figure 1B:
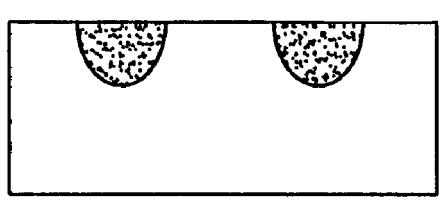
Figure 2:
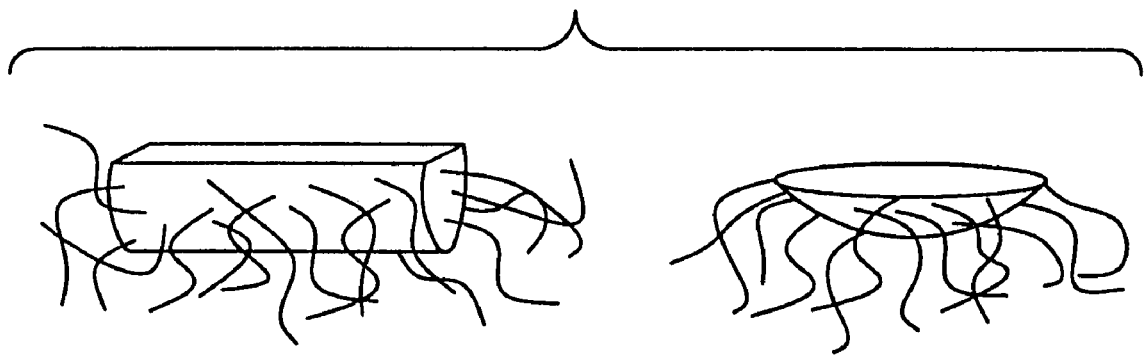
FIG. 2 is a schematic depicting ICP nanostructures (i.e. nanowires) emerging from the surface of a crosslinked ICP, after the uncrosslinked ICP precursor was dissolved away; the wavy lines emerging from the crosslinked ICP nanostructures are portions of precursor polymer that were only partially crosslinked and hence are covalently bound to the nanostructure.

The described process does not have any nucleation and growth since the monomer is already present in the precursor polymer film and is already coated on the substrate surface. In addition, this method permits the simultaneous patterning of multiple areas on a single substrate as well as simultaneous patterning of the upper and lower surfaces of a film disposed upon a substrate. This method permits the formation of a pattern on the surface of a substrate as well as patterns embedded in the substrate as may be seen in FIG. 1. In FIG. 1(a), an ICP 2 is shown to be patterned on top of the substrate 4, while in FIG. 1(b), the ICP 2 is embedded in the substrate 4. In addition, by dissolving the uncrosslinked ICP precursor from the ICP 2 as shown in FIG. 1(a) or 1(b), a mass of ICP nanowires having solubilizing brushes 6 may be obtained as shown in FIG. 2. This method also permits the three-dimensional patterning of films having rough surfaces. In addition, by utilizing solvents and/or electrolytes having a different solvating power for the ICP's or the ICP precursors, the rate of crosslinking in the swollen state may be varied.

Articles produced by this method are generally suitable for a wide variety of end use applications where conjugation and/or electrical conductivity is desired, including, for example, antistatic garments, antistatic floor coverings, components in computers, and generally, as replacements for metallic conductors, or semiconductors, including such specific applications, as, for example, batteries, fuel cells, photovoltaics, electrostatic dissipation and electromagnetic shielding. They may also be used for example, as antistatic wrappings for electronic equipment or electromagnetic interference shields for computers and other sensitive instruments, including aerospace applications and biomedical devices. A preferred end use includes medical applications such as sensors, surgical and diagnostic devices and instruments, or components thereof, conductive polymeric wires or leads for activation of biological processes, and antistatic clothing for use by operating room personnel. Further applications include coatings for controlled heat transfer. Other applications include transistors, capacitors, wires for circuitry, use in interconnect technology, as hole transport layers for light emitting diodes, as light emitting materials for use in light emitting diodes, as optically transparent conductors/electrodes, optical gratings and as electrochromic windows or electrochromic displays.

The following examples, which are meant to be exemplary, not limiting, illustrate compositions and methods of manufacturing of some of the various embodiments of the ICP described herein.

EXAMPLES

Example 1

This example details the synthesis of the 5-norbornene-endo-2,3-bis(methylene thiophene acetate) monomer, which can be polymerized to form the ICP precursor.

1.46 grams (9.5 millimoles) of 5-norbornene-2-endo,3-endo-dimethanol was added to a 100 milliliter (mL), 3-neck round bottom flask that had been vacuum dried and nitrogen purged and fitted with Dean-Stark trap. 120 mL of toluene was added to the flask under nitrogen, followed by the addition of 2.84 grams (20 millimoles) of 3-thiophene acetic acid and 160 milligrams (mg) of p-toluene sulfonic acid. The mixture was completely dissolved for 10 minutes in the toluene and the solution was refluxed for 6 hours at 105° C. during which the bottom layer in Dean-Stark trap was collected occasionally until a total of 80 mL was obtained. The bottom layer contains water and toluene. Since water has higher a density than toluene, most of the water generated during the esterification reaction is trapped on the bottom of Dean-Stark trap. The removal of water promotes the esterification reaction. The reaction mixture was cooled down to room temperature, washed with 50 mL of water and extracted with ether. The organic portion of the reaction mixture, which comprises by products of the reaction was separated, washed with brine, dried over sodium sulfate, and filtered following which the toluene was removed under vacuum. The resulting yellow oil containing at least 75% of the product was dissolved in 5 mL of methylene chloride, and column chromatography was performed on silica gel using methylene chloride-methanol solution in a volume ratio of 98:2 as an eluent to yield 2.90 grams (75% yield) of 5-norbornene-endo-2,3-bis(methylene thiophene acetate), as a light yellow oil. The structure of 5-norbornene-endo-2,3-bis(methylene thiophene acetate) was confirmed using H-NMR and FTIR.

Example 2

This example details the synthesis of the ICP precursor from the 5-norbornene-endo-2,3-bis(methylene thiophene acetate) monomer using ring opening metathesis polymerization (ROMP).

A solution of 1.33 grams (3.30 millimoles) of 5-norbornene-endo-2,3-bis(methylene thiophene acetate) in 10 mL of dry methylene chloride was transferred via a syringe into a 100 mL Shlenk flask containing 18 milligrams (mg) (0.02 millimoles) of Grubb's alkylidene catalyst and 5 mL of methylene chloride. The Shlenk flask was previously vacuum dried and nitrogen purged prior to and during the addition of the 5-norbornene-endo-2,3-bis(methylene thiophene acetate). The mixture was allowed to stir for 30 minutes following which 3 mL of ethyl vinyl ether was added to facilitate a termination of the polymerization. The solution was then concentrated under vacuum of 100 mm Hg rotary evaporator at room temperature. The polymer was precipitated 3 times in 300 mL of pentane, filtered and then dried under vacuum to yield 0.98 grams of a gum-like polymer. The structure was characterized by nuclear magnetic resonance spectroscopy ($H^1$-NMR), and the number average molecular weight was determined using gel permeation chromatography (GPC) using monodispersed polystyrene standards was 65,000 g/mol. The polydispersity index was 1.28.

Example 3

This example details the preparation of bis(terthienyl) norbornylene monomer, which can also be utilized for the preparation of the ICP precursor. An ester linked norbornylene monomer, containing two terthiophene moieties was prepared in a six step synthesis in the FIG. 3 below.

To a 100 milliliter, 3-neck round bottom flask that had been vacuum dried and nitrogen purged was added 0.873 grams (2.8 millimole) of (2,2':5',2"-terthiophene)-3'-acetic acid. Dry methylene chloride ($CH_2Cl_2$) in an amount of 20 milliliter was added under nitrogen, followed by the addition of 1.27 grams (0.01 mole) of oxalyl chloride. The reaction was continued with stirring for two hours at room temperature after which the solvent and excess oxalyl chloride were removed under vacuum, and the resulting acid chloride was redissolved in 20 milliliter of dry diethyl ether.

Into a separate 100 milliliter 3-neck round bottom flask was added 0.208 grams of 5-norbornene-2-endo,3-endo-dimethanol (1.35 millimole) under nitrogen. To this flask was added 20 milliliter of dry diethyl ether followed by the addition of 0.8 milliliter triethylamine. The (2,2':5',2"-terthiophene)-3'-acetic acid chloride solution was dissolved in 20 milliliter dry diethyl ether was added drop-wise over a twenty minute period into the flask. The mixture was then stirred for an additional 10 minutes and poured into 50 milliliter of water. The organic layer was separated and the water layer was washed with diethyl ether (3×50 ml). The organic portion was washed with brine, separated, dried over magnesium sulfate, filtered, and then the methylene chloride was removed under vacuum. The resulting oil was dissolved in 5 milliliters of methylene chloride, and column-chromatography was performed on silica gel using methylene chloride as an eluent to yield 0.431 g (46%) of the bis (terthienyl)norbornylene monomer as a light yellow solid powder.

Example 4

Figure 5:
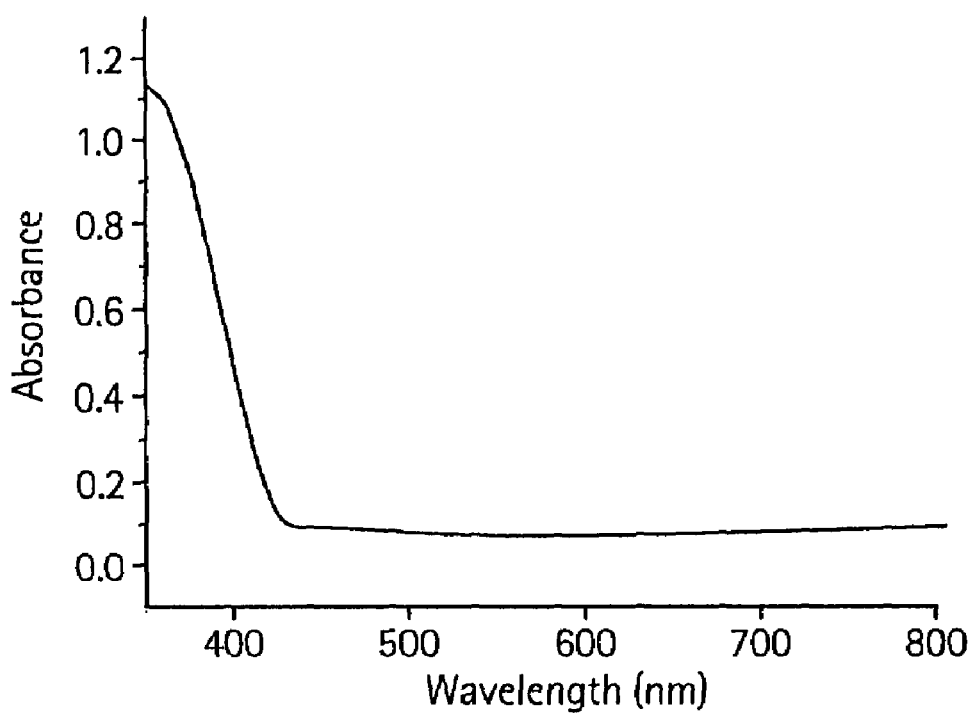
FIG. 5 is a graphical representation of the ultraviolet-visible spectrum of the bis(terthienyl)norbornylene monomer prior to crosslinking.
Figure 6:
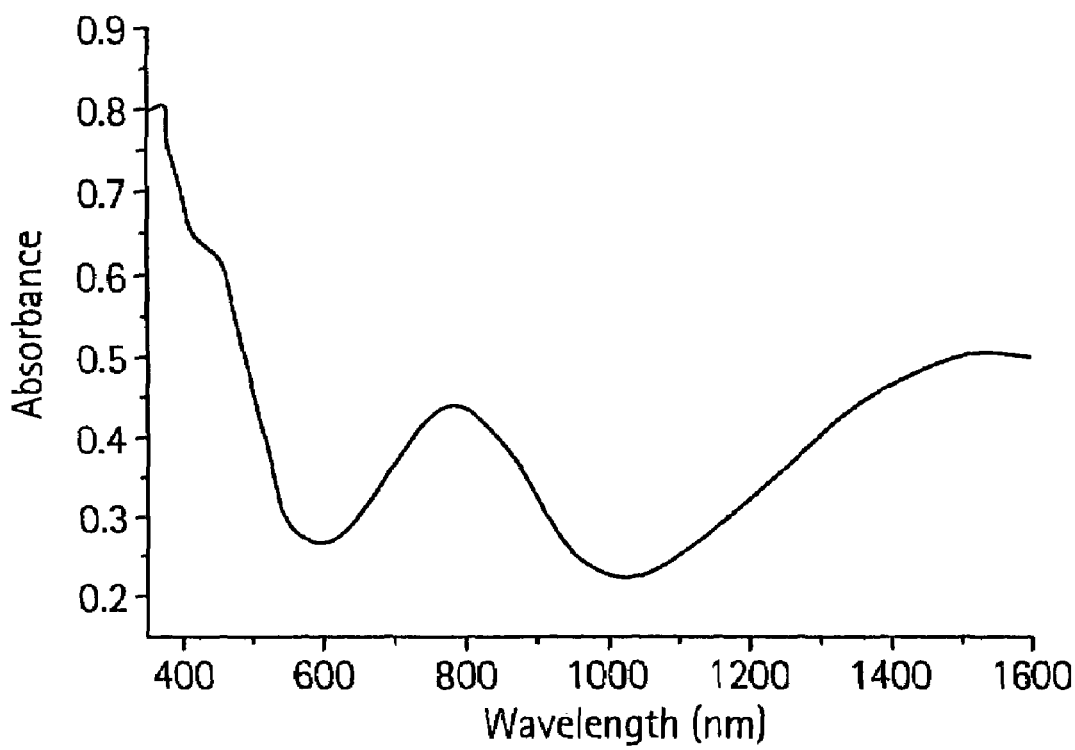
FIG. 6 is a graphical representation of the ultraviolet-visible spectrum of the bis(terthienyl)norbornylene monomer after crosslinking.

This example details the chemical oxidation of the ICP precursor poly(5-norbornene-endo-2,3-bis(methylene-3'-[2, 2':5',2"]-terthiophene acetate)) to form the ICP. A 0.5 micrometer thick film of poly(5-norbornene-endo-2,3-bis (methylene-3'-[2,2':5',2"]-terthiophene acetate)) was first cast onto a glass slide at 1000 rpm from methylene chloride solution. The film was dried at 25° C. for a time period of 1 hour. The resulting film on glass was immersed at room temperature into a solution of ferric (III) chloride in acetonitrile in order to promote the oxidation of the pendant terthiophene moieties as shown in FIG. 4. The molar ratio of the ferric (III) chloride to acetonitrile was 0.01M. In 5 seconds the film changed from pale yellow to blue indicating that the oxidative coupling to from poly(thiophene) was accomplished. This conversion may be seen in FIGS. 5 and 6, which are graphical representations of the ultraviolet visible spectrum before and after crosslinking respectively. FIG. 5 shows the ability of the conductive polymer to reduce upon addition of hydrazine solution. The loss of lower energy bands at approximately 800 nm and 1500 nm upon hydrazine addition show that the conductive form of the polymer can be reduce. The two bands at 800 and 1500 nm coincide with the band structure of a polythiophene in the doped form.

Example 5

Figure 3:
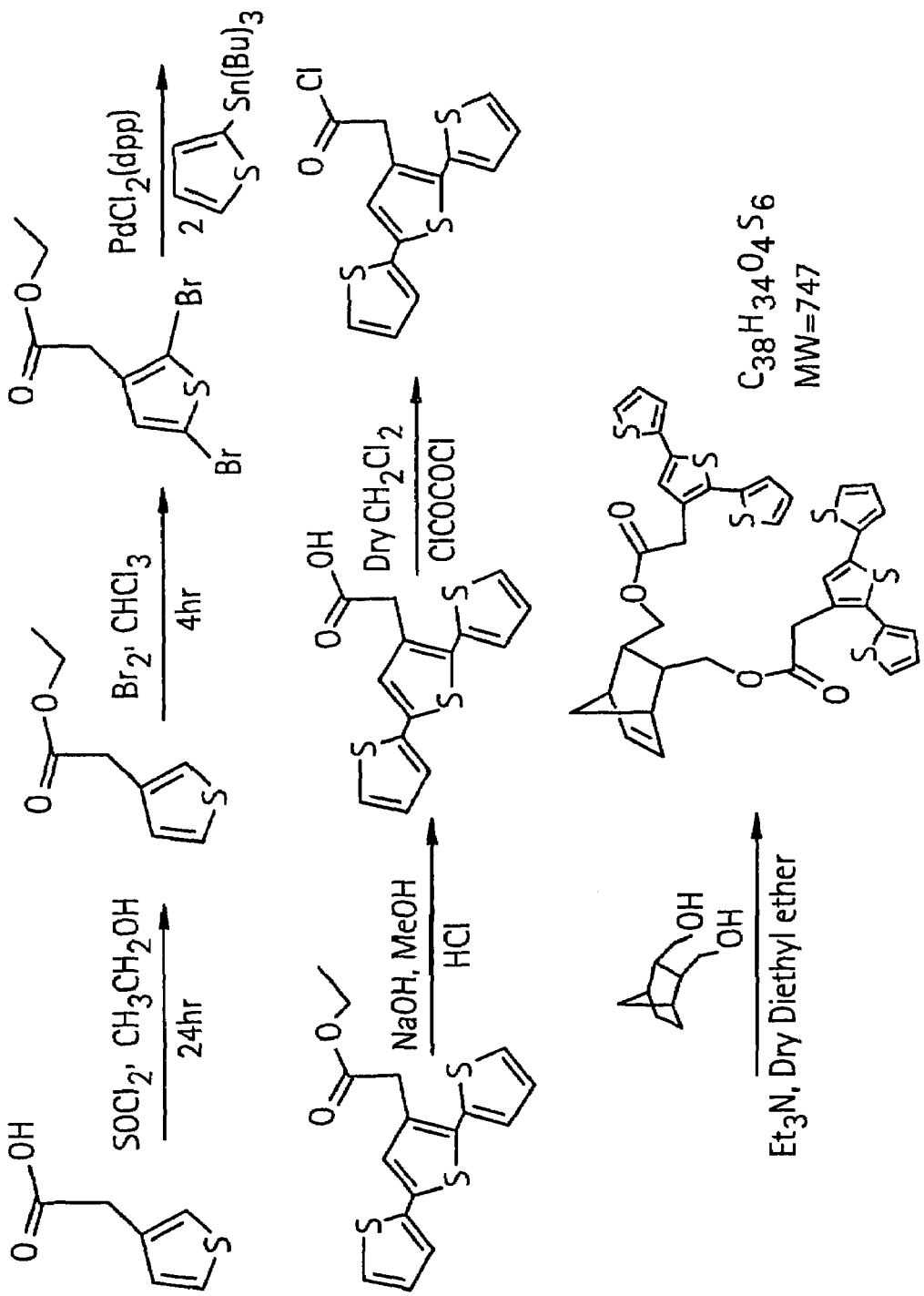
FIG. 3 depicts the reaction scheme utilized to synthesize the bis(terthienyl)norbornylene monomer.

This is a control (comparative) experiment to demonstrate the process of conventional electrochemical polymerization using bis(terthienyl)norbornylene monomer. This example details the polymerization of the bis(terthienyl)norbornylene precursor polymer to obtain the ICP as shown in FIG. 3. In this example, the bis(terthienyl)norbornylene monomer of Example 3 was electrochemically polymerized in an electrolyte solution consisting of 0.01 M solution of the monomer in a 0.1 M solution of tetrabutylammonium perchlorate (TBAP) in acetonitrile. The reference electrode was Ag/Ag+ (i.e., 10 mM of silver nitrate ($AgNO_3$) in acetonitrile). A platinum plate was used as the counter electrode. The cyclic voltammetry for this process is also shown in FIG. 7.

Figure 7:
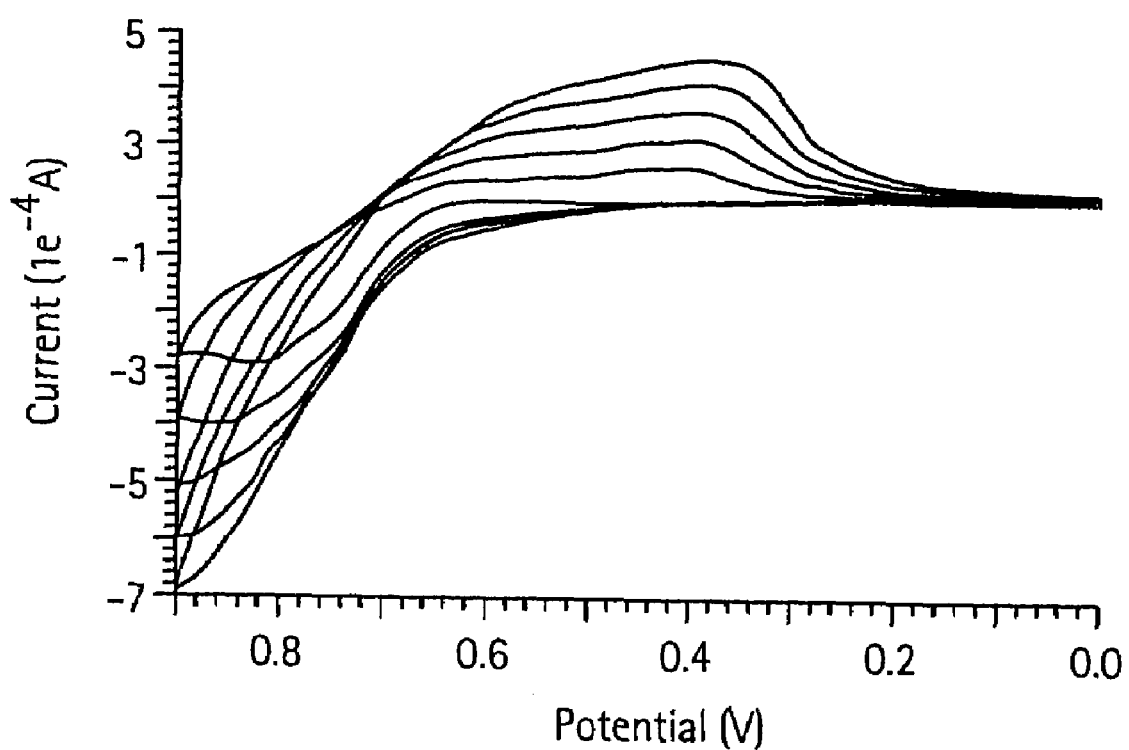
FIG. 7 is a graphical representation of the cyclic voltammetry utilized in the electrochemical oxidation of the bis(terthienyl)norbornylene monomer to form poly(thiophene)

As may be seen in FIG. 7, the experiment was initiated at 0 V, a potential at which no electron transfer takes place as indicated by the lack of current. The potential was then scanned in the positive direction i.e., the oxidation direction, at a rate or 100 mV/s. At 0.66 V, there is an onset for an oxidative process than may be attributed to the oxidation of the terthiophene moieties of the bis(terthienyl)norbornylene monomer. Upon further scanning, a peak current results at a potential of 0.82 V. It should be noted that between the potentials of 0.66 V and the final potential before reversing the potential, 0.9 V, electrochemical oxidative coupling and polymerization of the terthiophene take place. Thus, for a single cyclovoltammetric scan, the polymerization proceeds for a total of about 4.8 seconds. Upon scanning in the reverse direction, i.e., the reduction direction, it is immediately evident that the oxidation is an irreversible process. Furthermore, as observed from a mirror placed beneath the working electrode, it is evident that there is formation of a blue precipitate on the electrode surface. Upon scanning further in the reduction direction, a cathodic peak occurs at 0.41 V. This cathodic process is attributed to the reduction in the conductive polymer formed on the electrode surface from the oxidized/conductive state to the neutral state. The occurrence of this reductive process at a diminished potential relative to the terthiophene moiety indicates that presence of a species with a more extended conjugation.

The potential is then reversed at 0 V and a second scan started. In the second scan an anodic current first becomes prevalent at 0.48 V, well below that for the onset for oxidation of the pendent terthiophene moieties of 2 bis (terthienyl)norbornylene monomer and is attributed to the oxidation of the conjugated polymer on the working electrode surface. Once again at about 0.66 V there is an onset for monomer oxidation inducing further polymerization. Additional polymerization is indicated by the increased cathodic current response observed at 0.41 V for the reduction of the conducting polymer. Upon subsequent scans polymerization proceeds in a facile manner as evidenced by the regular intervals for the cathodic peak current. This indicates the conducting polymer is of sufficient conductivity to serve as a working electrode.

Example 6

This example details the formation of the ICP via the electrochemical oxidative crosslinking of poly(5-norbornene-endo-2,3-bis(methylene-3'-[2,2':5',2"]-terthiophene acetate)) on a substrate. The poly(5-norbornene-endo-2,3-bis(methylene-3'-[2,2':5',2"]-terthiophene acetate)) used in this example is first derived by the ring opening metathesis polymerization (ROMP) using Grubb's alkylidene catalyst and is terminated using ethyl vinyl ketone.

A 0.5 micrometer thick film of poly(5-norbornene-endo-2,3-bis(methylene-3'-[2,2':5',2"]-terthiophene acetate)) was spun cast onto indium tin oxide (ITO) glass at 1000 rpm. The ITO glass was used as the working electrode in a 3-electrode electrolytic cell having a 0.1M solution of tetrabutylammonium perchlorate (TBAP) in acetonitrile as the electrolyte. A platinum plate was used as the counter electrode. The temperature of the solution in the electrolytic cell was 25° C. Oxidation was accomplished at a potential of 0.9 V versus the Ag/Ag+ reference electrodes in order to crosslink the pendant terthiophene moieties of the poly(5-norbornene-endo-2,3-bis(methylene-3'-[2,2':5',2"]-terthiophene acetate)).

Example 7

Figure 8:
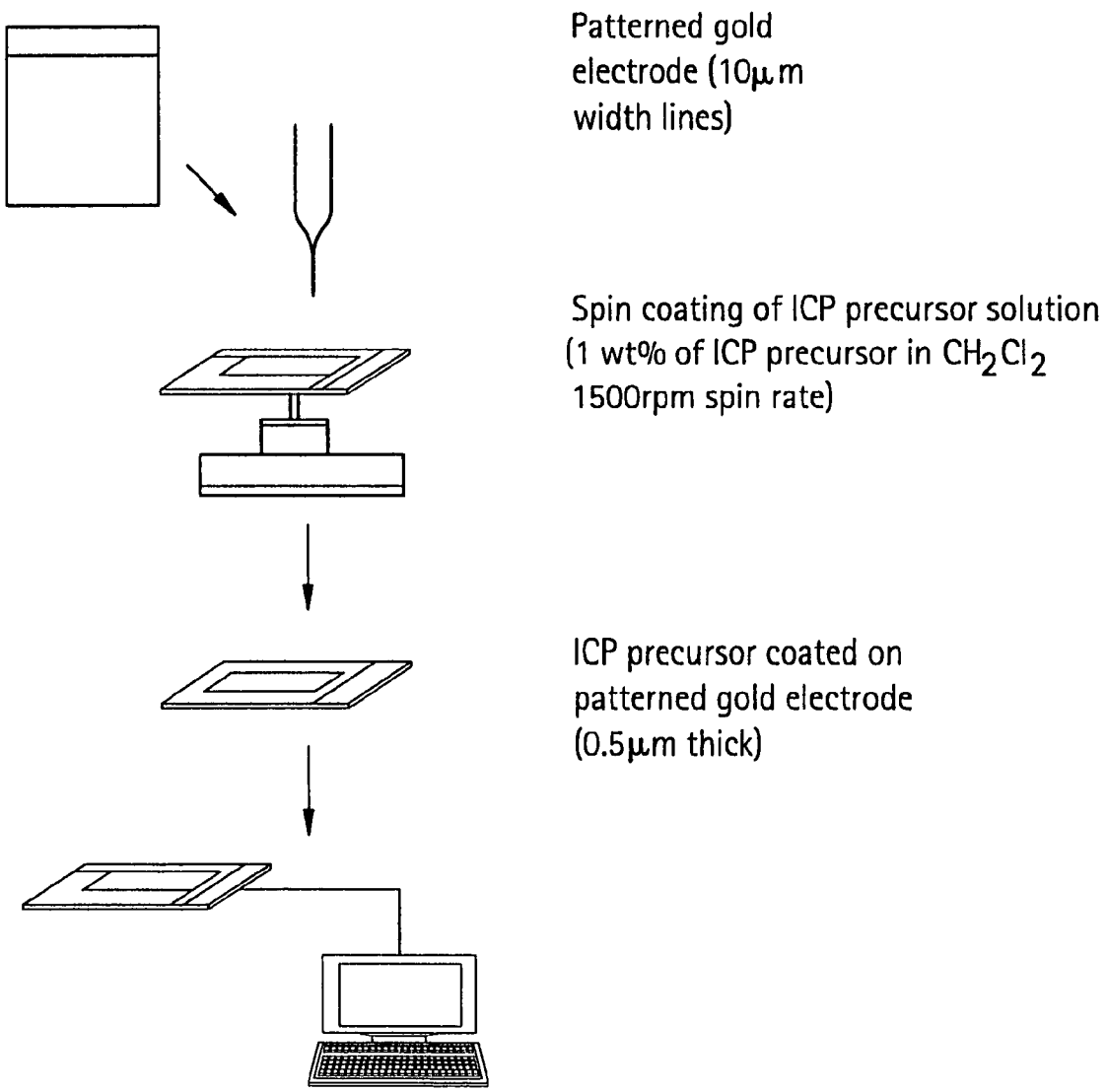
FIG. 8 depicts one method of selectively crosslinking an ICP precursor film disposed upon a substrate, wherein the substrate has a conductive pattern disposed upon it.
Figure 9:
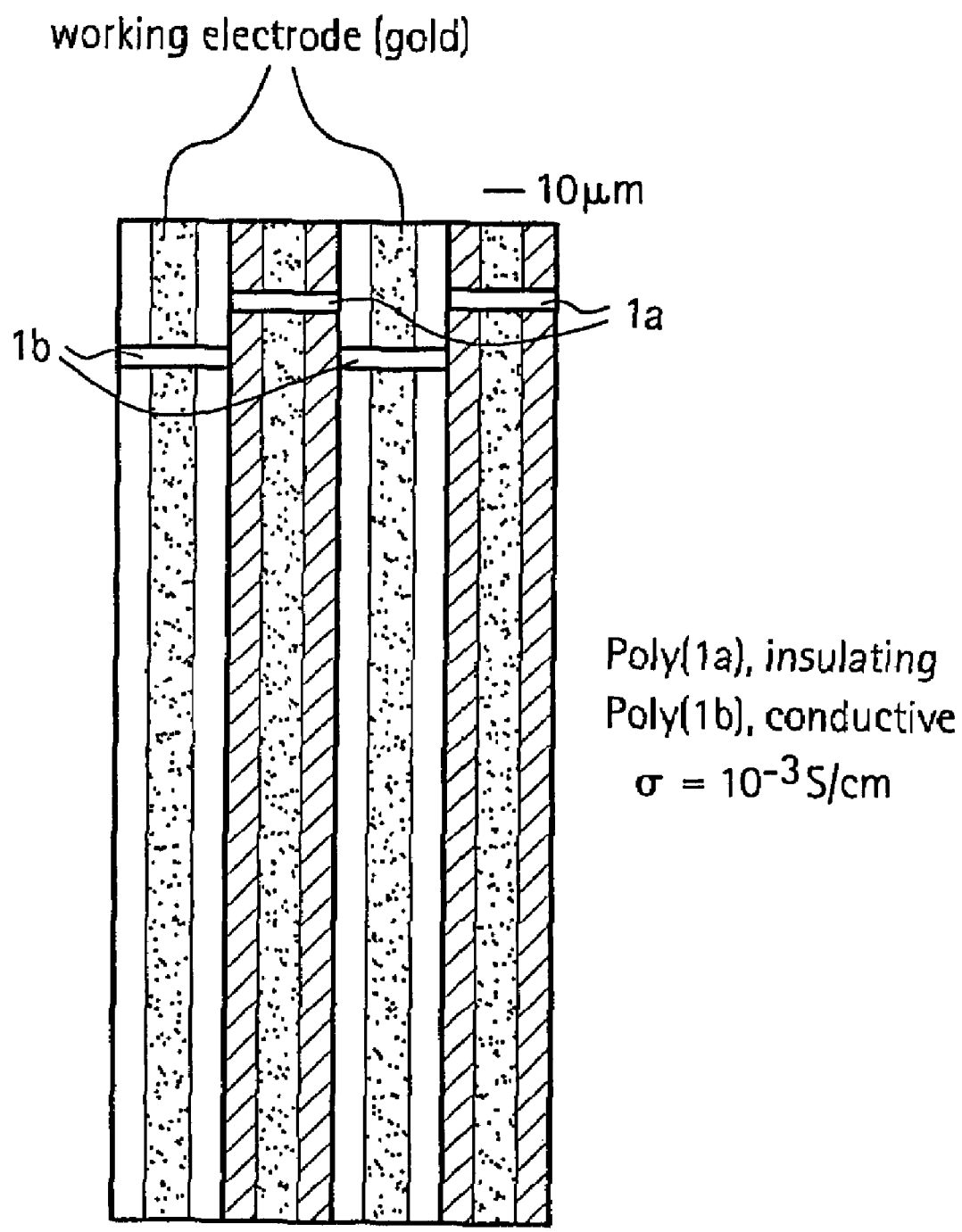
FIG. 9 depicts the selective crosslinking of the ICP precursor only on the gold lines to which the electrical leads are attached.

This example details the formation of the ICP via crosslinking of a precursor polymer by the electrochemical oxidation of poly(5-norbornene-endo-2,3-bis(methylene-3'-[2,2':5',2"]-terthiophene acetate)) on a glass substrate having 100 interdigitated gold lines. Each gold line has a thickness of 10 micrometers and the distance between lines was 10 micrometers. The substrate was coated in a manner similar to that in Example 4. The coated substrate was immersed into the polyelectrolyte solution (in an electrochemical cell) and the patterned substrate was used as a working electrode in a three electrode configuration as shown in FIG. 8. The reference electrode was Ag/Ag+. A platinum plate was the counter electrode. A potential of 0.9 V was applied. The potential was applied to only one set of alternating lines as shown in FIG. 9, thereby oxidizing and crosslinking the ICP only on the upper surface of the gold lines to which the potential was applied.

The application of a potential of 0.9 V for a time period of only 0.1 second, promoted the oxidation and crosslinking of the ICP to a thickness of about 3 micrometers away from the surface of the gold leads. Thus, the rate of crosslinking is equal to a rate of crosslinking of 30,000 nanometers/second.

Example 8

This example was conducted to demonstrate that a film of an ICP precursor may be stamped on its upper surface by using an electrode having a negative of the desired image. By applying an electric current or a potential to the electrode, the ICP precursor film is oxidized only in those areas that have been contacted by the electrode, thus producing the desired image or pattern.

Figure 10:
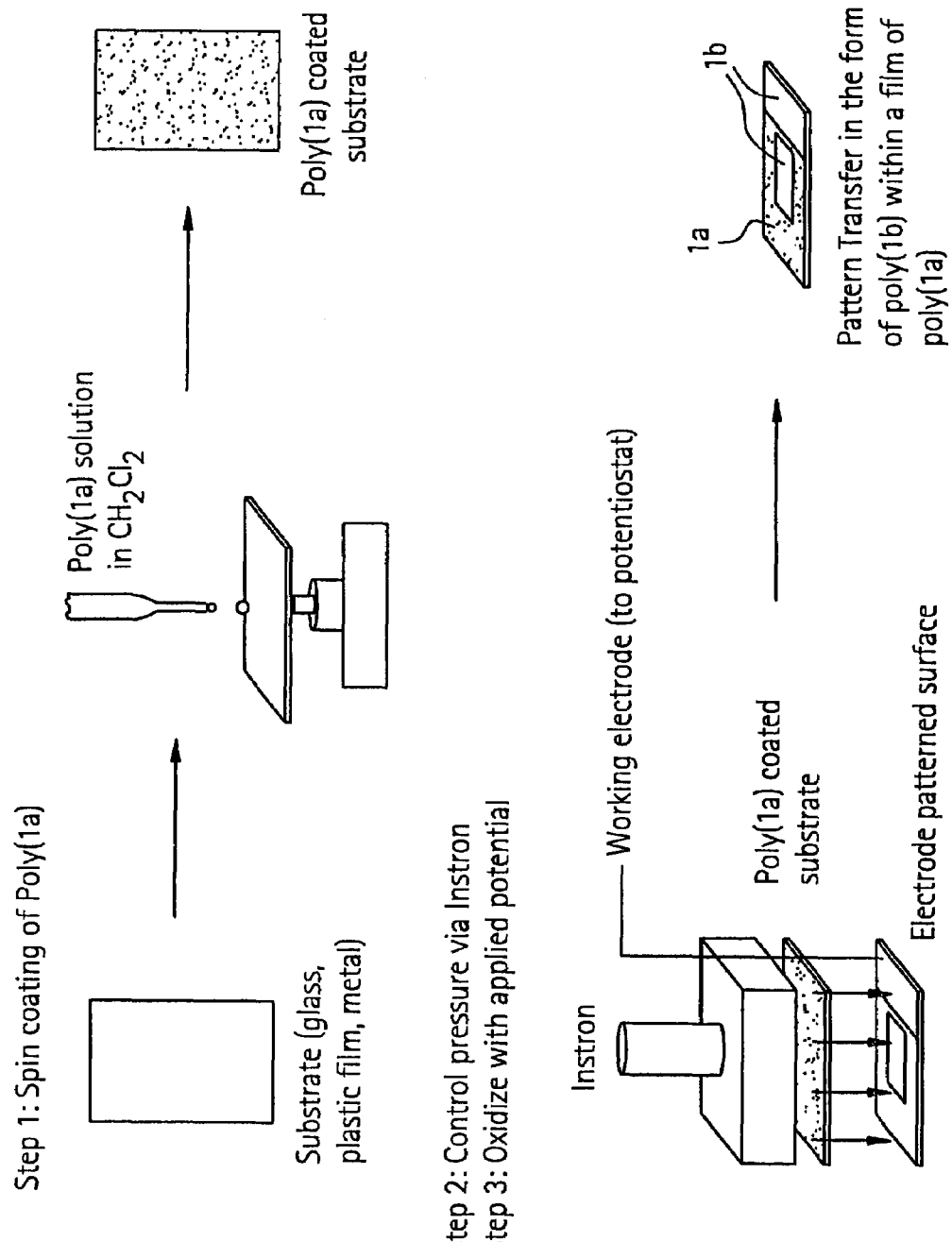
FIG. 10 depicts one method of selectively crosslinking at least a portion of an ICP precursor film disposed upon a substrate by bringing an electrode into contact with the surface of the film opposite the surface disposed upon the substrate.

A film of the ICP precursor ICP precursor poly(5-norbornene-endo-2,3-bis(methylene-3'-[2,2':5',2"]-terthiophene acetate)) was deposited on the surface of a glass substrate as described in example 4. The substrate together with the film was used as an electrode (the substrate and the film were not the electrode) in a three electrode cell having Ag/Ag$^+$ as reference electrode and Pt plate as counter electrode. A platinum button microelectrode served as the working electrode and was then pressed against the surface of the film using an instron as shown in FIG. 10. A pressure of 1 kg/cm$^2$ was applied by the instron. A potential of 1 V was applied to the platinum button microelectrode for a period of 0.01 second. Upon removing the platinum button and examining the film using optical microscopy at a magnification of 10×, it was determined that a mirror image of the platinum electrode was imprinted into the film by virtue of the crosslinking of the ICP. As stated above, there is a change in color when the ICP precursor undergoes oxidation and crosslinking to form the ICP. By combining the patterning methods of Examples 7 and 8, a film may be simultaneously patterned on its upper and lower surfaces, thus permitting a three dimensional patterning of the film.

Example 9

In this example of nanopatterning, a patterned silicon wafer substrate having platinum lines of 500 nm widths was used as the electrode in a 3 electrode cell. The silicon wafer was patterned using an electron beam technique and was obtained from the Nanofabrication Center at Cornell University. The ICP precursor poly(5-norbornene-endo-2,3-bis(methylene-3'-[2,2':5',2"]-terthiophene acetate)) was dissolved in chloroform and spin coated at a speed of 1500 rpm resulting in a coating of 200 nanometers. The film was dried for 1 hour room at room temperature prior to immersion in the electrolytic cell. Electrical leads were attached to 10 of the platinum lines and the substrate was immersed into an electrolytic cell having a 0.1 M solution of tetrabutylammonium perchlorate (TBAP) in acetonitrile. The reference electrode was silver (Ag/Ag+) and a platinum plate was used as the counter electrode.

Figure 11:
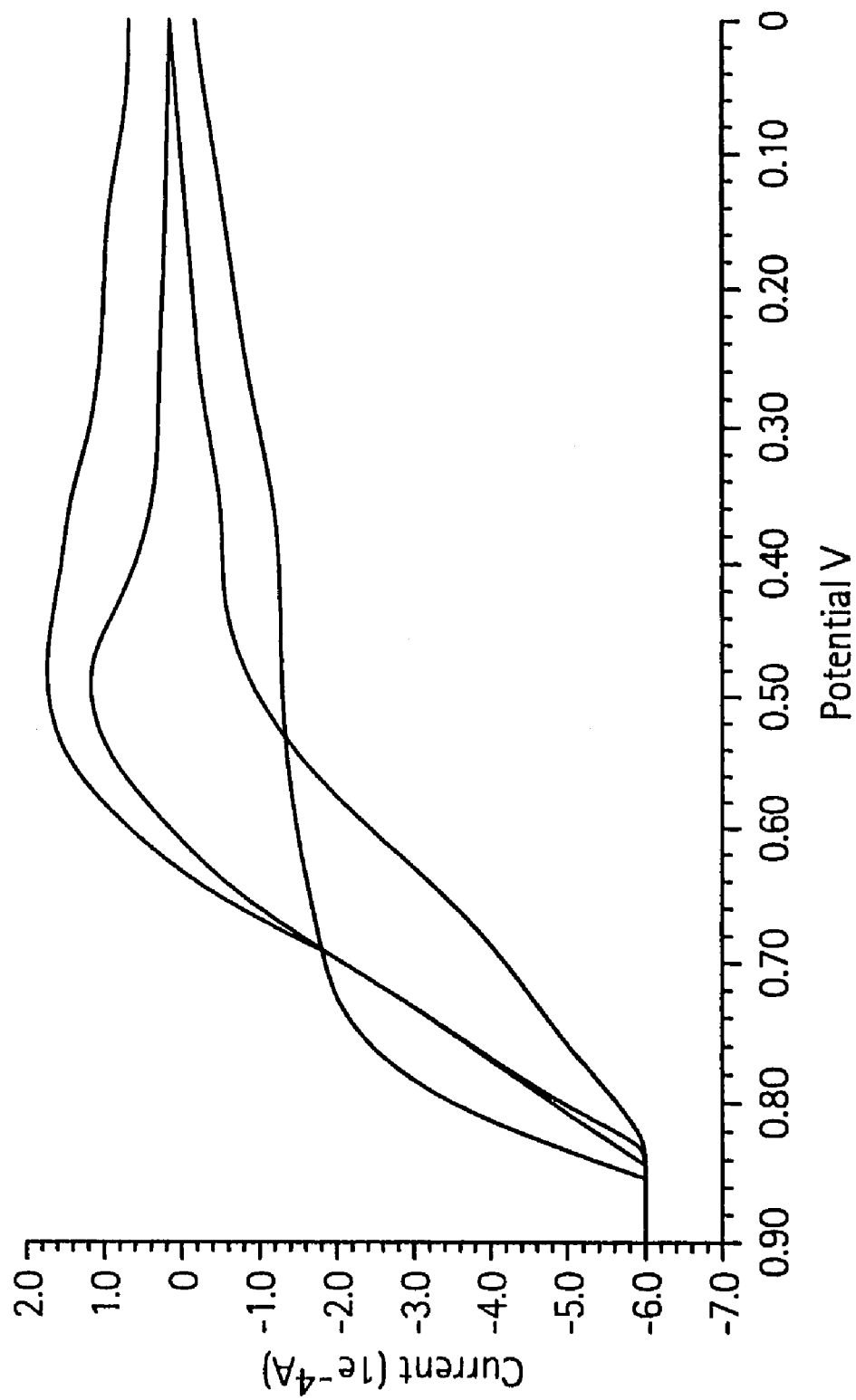
FIG. 11 is a graphical representation of the cyclic voltammetry utilized in the nanopatterning of the ICP precursor film disposed on a silicon wafer having platinum lines disposed upon the silicon wafer.

The cyclic voltammetry was performed using the platinum lines as the working electrode by scanning between 0 V and 1 V (versus the reference electrode) at a scan rate of 100 millivolts per second. The cyclic voltammetry curve for the experiment is shown in FIG. 11 and demonstrates that the reduction current is increased due to the propagation of crosslinking. The second scan shows both oxidation peaks for the monomeric terthiophene units and the polymeric terthiophene peaks at 0.75 V and 0.5 V respectively.

Example 10

In this example, nanolithography was performed using solid state crosslinking on a substrate using electrochemical atomic force microscopy (ECAFM). ICP precursor films of poly(5-norbornene-endo-2,3-bis(methylene-3'-[2,2':5',2"]-terthiophene acetate)) were formed on a silicon wafer substrate from a 1 wt % solution of poly(5-norbornene-endo-2,3-bis(methylene-3'-[2,2':5',2"]-terthiophene acetate)) in chloroform by spin coating at a speed of 1500 revolutions per minute (rpm) for 30 seconds. The film thickness was 200 nanometers. The films roughness was measured using atomic force microscopy (AFM) and the root mean square (RMS) of the film roughness was measured in air at 1.2 nanometer. The film roughness in the electrolyte solution was measured at 0.3 nanometer i.e., the surface roughness appeared to be reduced as a result of swelling caused by the electrolyte solution.

The imaging and lithography was performed by using molecular imaging SPM with a Nanoscope E controller manufactured and marketed by Digital Instruments. In addition, Nanoscript software manufactured by Digital Instruments was used for programming of the lithography. All the imaging and the lithography were performed by using contact mode atomic force microscopy using gold coated silicon nitride ($Si_3N_4$) AFM tips prepared by thermal evaporation in a vacuum of a 25 Å layer of chromium followed by the application of a 500 Å layer of gold. After applying the gold coating, the thickness of the AFM tip was 100 nanometer.

During the electrolysis, the AFM tip was used as the working electrode, while the silver wire having a diameter of 0.25 millimeters and platinum coil made from wire having a diameter of 0.25 millimeters were used as the reference electrode and the counter electrode respectively. The electrolyte solution contained 0.1 M of TBAP in acetonitrile.

Figure 12:
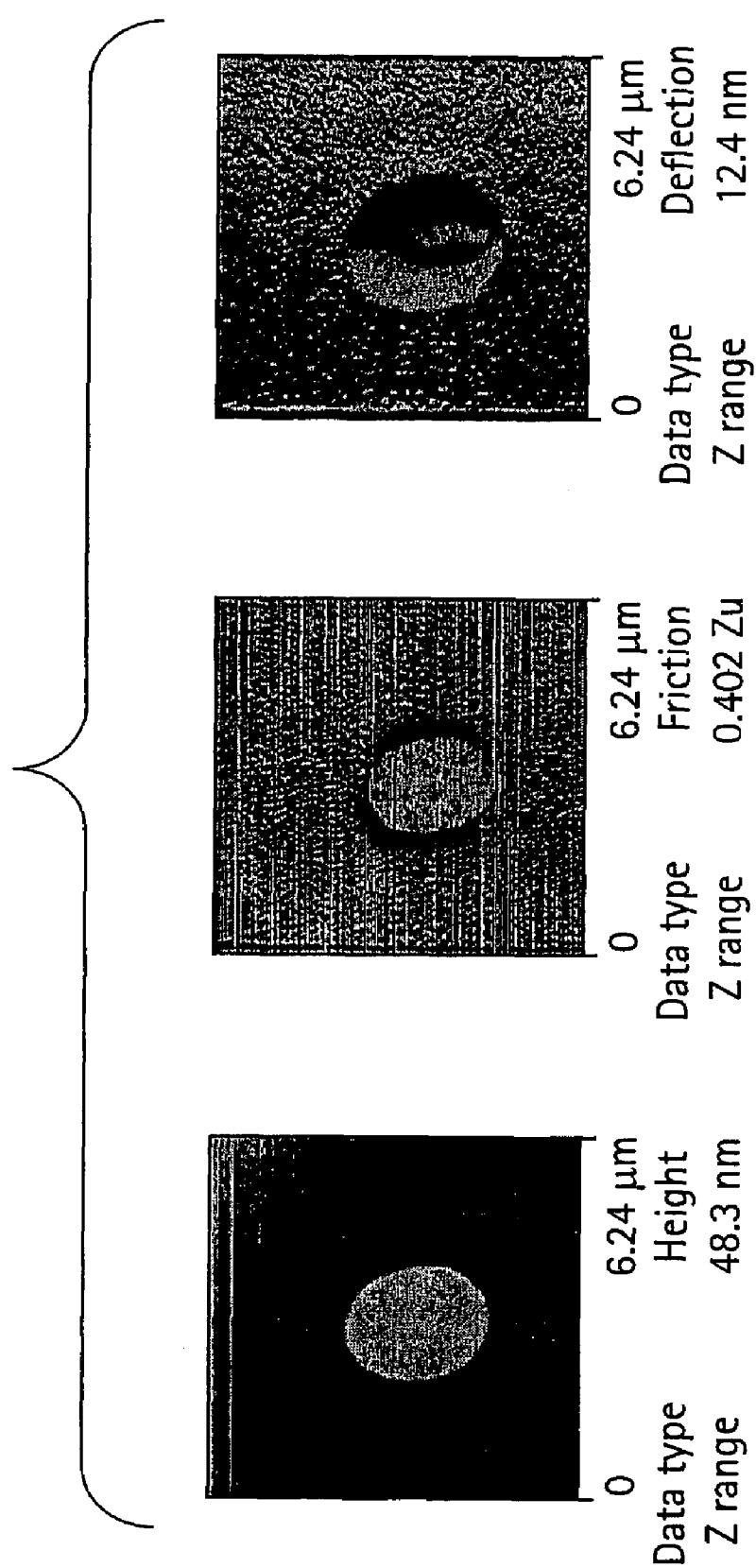
FIG. 12 is an atomic force microscope image of a 2 micrometer line of ICP, which has been crosslinked using an electrochemical AFM tip as an external working electrode.
Figure 13:
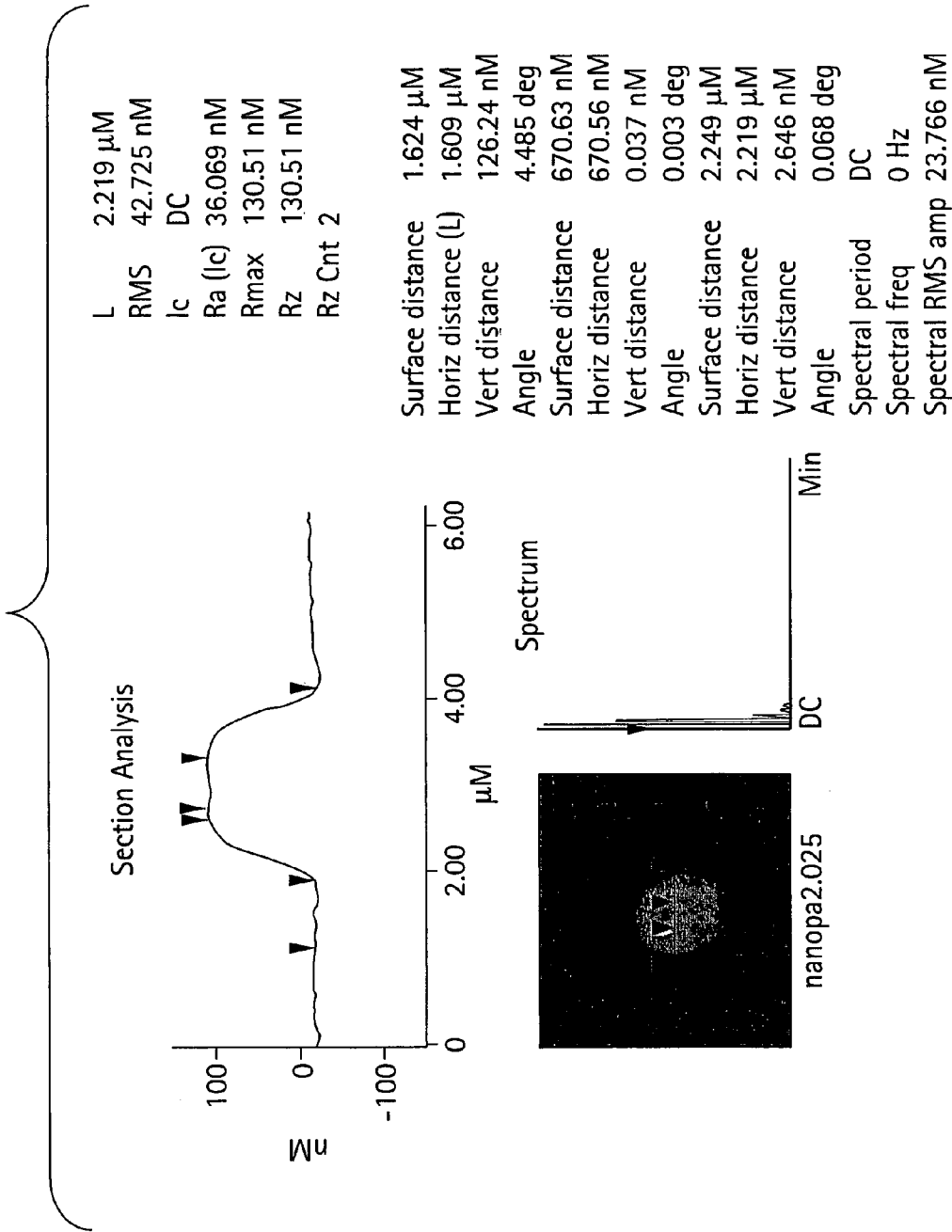
FIG. 13 is graphical representation of the cross-section of a 2 micrometer line of ICP, which has been crosslinked using an electrochemical AFM tip as an external electrode.

FIG. 12 shows a 6 micrometer×6 micrometer section of the coated substrate having an AFM image of a 2 micrometer×2 micrometer line of ICP written using electrochemical AFM. The gold coated AFM tip contacted the surface of the ICP precursor film via contact mode AFM, and the tip was moved from the center of the scan area to 2 micrometer down at the speed of 3 micrometers/second while 1.5 V (versus the silver reference wire) of potential was applied to the gold coated AFM tip. In order to minimize the force between the tip and the film surface, the set-point was maintained between 0 V and 1 V during the experiment. FIG. 13 shows a height image of the film along with a graphical depiction of the height of the film. From this graphical depiction of the crosslinked region of the film, it may be seen that the crosslinked portion of the film has a volcano like shape with a height of approximately 100 nanometers. This indicates that the crosslinking takes place in the direction of the tip, which is a highly charged region.

Figure 14:
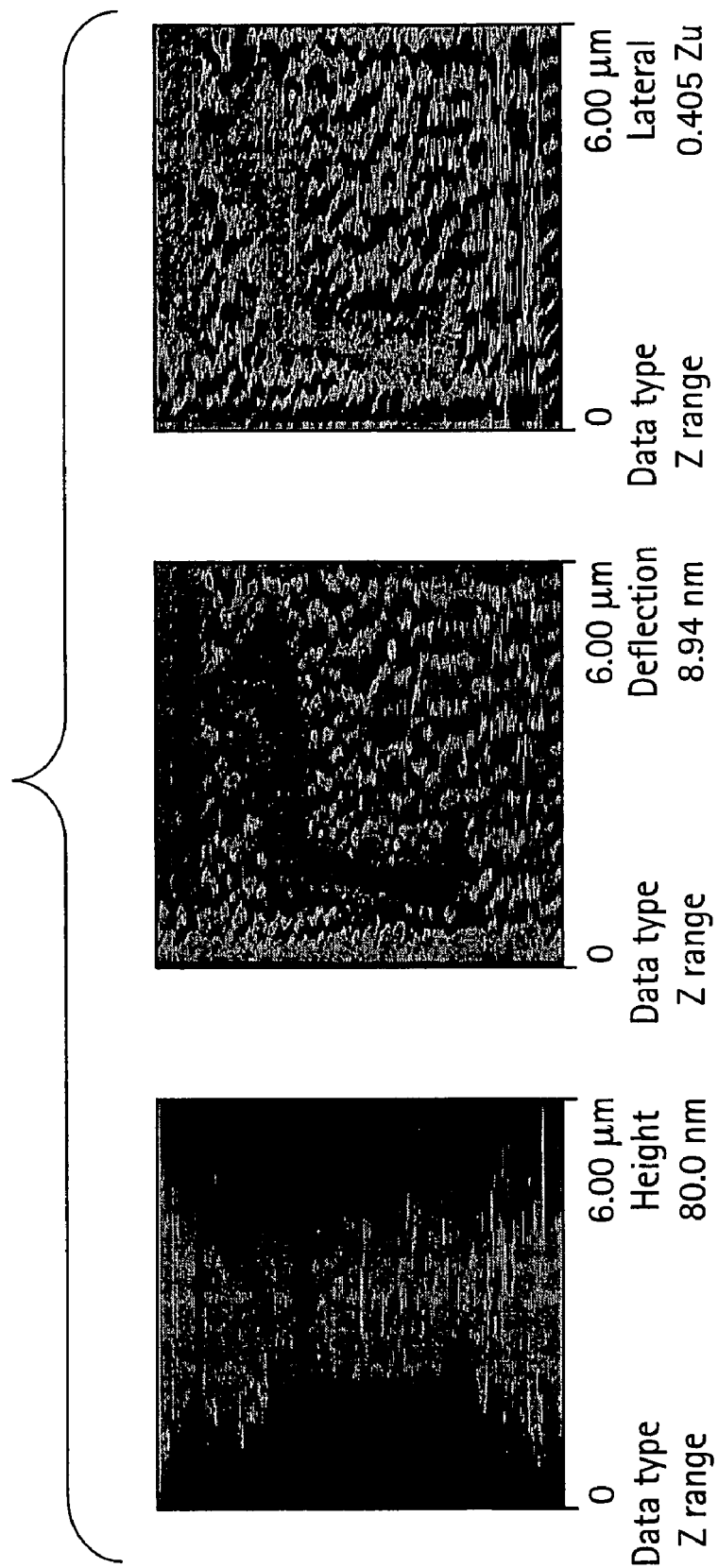
FIG. 14 is an atomic force microscope image of a line drawn across the surface of an ICP precursor film, using an electrochemical AFM tip as an external electrode.

A similar experiment was undertaken to crosslink a line across the substrate. This is shown in FIG. 14(a), (b) and (c) where a line of width 400 nanometers and length equal to 6 micrometers was written across the substrate in less than 0.5 seconds. The propagation speed of the line was 3 micrometers/second. FIG. 14(a) is a height image indicating the height difference at each position; FIG. 14(b) is a deflection image showing the tip deflections during the scanning of the image, while FIG. 14(c) is a lateral force image showing the friction difference at each position during the scan.

The above examples demonstrate that crosslinking the ICP precursor in the solid state to form an ICP has several advantages especially when compared with methods such as dip-pen nanolithography. This method does not have any polymer or monomer attached to the tip of the writing instrument during the patterning process. Thus, the rate of patterning is much more rapid. Additionally, patterns may be simultaneously generated on the upper as well as the lower surfaces of a film, thus permitting the formation of 3 dimensional patterns on a film. Patterns may also be generated on the surface of a film as well as within the bulk of a film.

Example 11

In another example of direct writing of conductive polymer utilizing solid-state oxidative polymerization of a precursor polymer it has been further demonstrated writing in contact mode using electrochemical atomic force microscopy (ECAFM) produces a morphology by which the conductive polymer lines are raised for the precursor polymer film surface. FIGS. 26(a) and (b) shows the lines produced of PNP3T from PN3T using contact mode as the writing style while FIGS. 27(a), (b), (c), and (d) shows the lines of crosslinked conductive polymer produced using tapping mode as the writing style. The specific details of these procedures are as follows:

All electrochemical oxidative nanolithography experiments were performed using an electrochemical atomic force microscopy (ECAFM) setup comprised of a CHI 400 potentiostat (CH Instruments) connected to a Nanoscope IV Multi-mode scanning probe microscope (SPM, Digital Instruments), and a fluid imaging cell for the SPM, MMT-MEC (Digital Instruments). Conductive AFM probes, gold (Au) coated silicon nitride (SiN) probe (NPG, Veeco Metrology LLC, force constant=0.52 N/m), were used as working electrodes (WE). Silver (Ag) wire and platinum (Pt) wire were used as reference electrode (RE, 0.2 vs. NHE) and counter electrode (CE), respectively. 0.1 M TBAP in ACN was used as an electrolyte solution. Experiments were performed in 0.1 M tetrabutylammonium perchlorate (TBAP) using propylene carbonate (PC) as the solvent and applying a potential of 1.65 V (vs. NHE) using a Au coated SiN4 tip as the working electrode. The ECAFM tips have an average tip diameter was 40 nm. Glass slides of 1.3 centimeter (cm) diameter were purchased from Fisher Scientific and cleaned with water, methanol and acetone sequentially before use. No other pretreatment of the glass microscope slides was carried out. The mobile conductive AFM tip was controlled in a designated fashion using $C^{++}$ compiler based LITHO software (Digital Instruments) installed on the SPM. FIG. 26(a) is a micrograph showing a height image of ICP nano-lines of PNP3T written at the speed of 60 mm/s (1) and 30 mm/s (2) via contact mode electrochemical oxidative crosslinking of PN3T. The line width of 1 and 2 were 120 nm and 170 nm respectively.

A 100 nm thick PN3T film was coated onto a glass substrate using chloroform as the solvent for casting and the PN3T film coated glass substrate was placed in the electrochemical cell of ECAFM. Writing was performed using fluid contact mode at a writing speed of 60 μm/s (line 1) and 30 μm/s (line 2) applying 1.4V versus reference electrode. The resulting nano-patterns were imaged via contact mode. At a writing speed of 60 mm/s line widths produced were on the order of 100 nm whereas at a writing speed of 30 mm/s line widths of PNP3T were on the order of 170 nm.

Figure 26B:
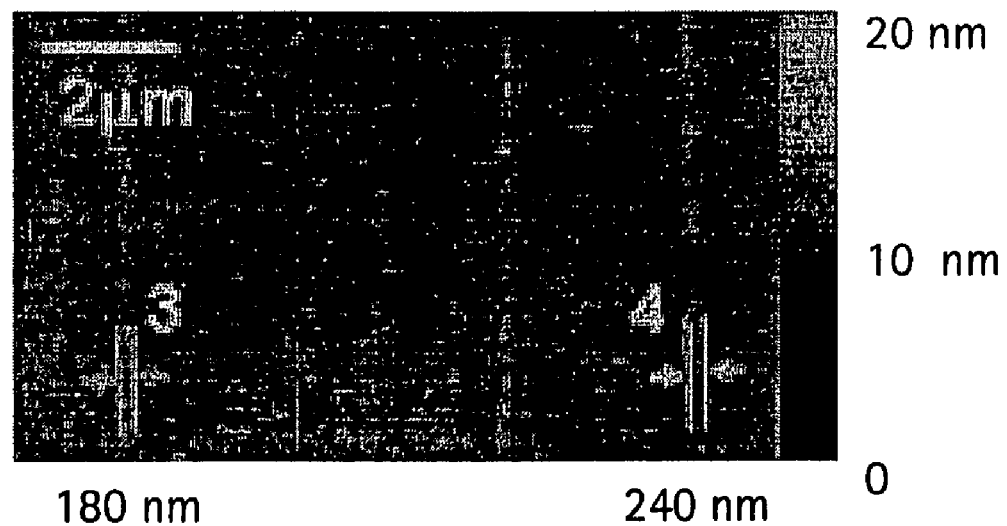

A 100 m thick PN3T film coated onto glass substrate was placed in electrochemical cell of ECAFM. Writing was performed using fluid contact mode at the writing speed of 30 μm/s (line 3) and 15 μm/s (line 4) applying 1.4V versus reference electrode. The resulting nano-patterns were imaged via fluid contact mode. FIG. 26 (B) is a micrograph depicting a height image of ICP nano-lines written at the speed of 30 mm/s (3) and 15 mm/s (4). The line widths of 3 and 4 were 180 nm and 240 nm respectively.

A 100 nm thick PN3T film spin-coated onto glass substrate was placed in electrochemical cell of ECAFM. Writing was performed using fluid tapping mode at the writing speed of 15 μm/s (line 1) and 10 μm/s (line 2) applying 1.4V versus reference electrode. The resulting nano-patterns were imaged via fluid tapping mode obtaining height (a) and phase image (b) simultaneously. FIGS. 27(a) and 27 (b) are micrographs showing height (a) and phase (b) images respectively of ICP nano-lines of PNP3T written at the speed of 15 mm/s (1) and 10 mm/s (2) via tapping mode electrochemical oxidative crosslinking of polymer precursor PN3T. The line width of 1 and 2 were 45 nm and 65 nm, respectively.

Figure 27B:
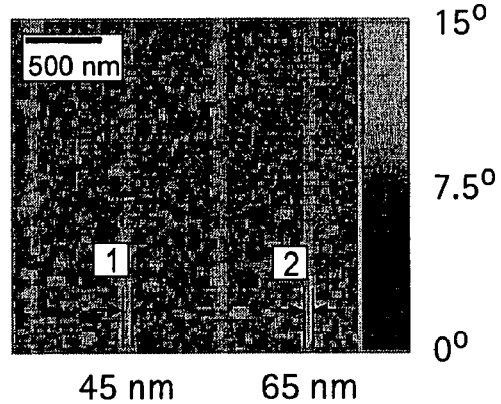
Figure 27C:
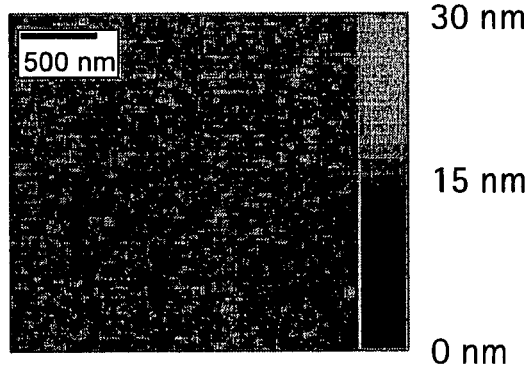
Figure 27D:
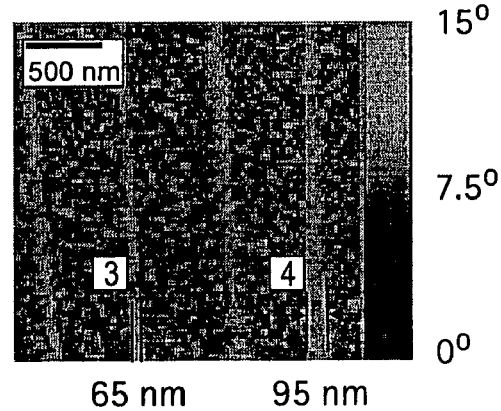

A 100 nm thick PN3T film spin-coated onto glass substrate was placed in electrochemical cell of ECAFM. Writing was performed using fluid tapping mode at the writing speed of 10 μm/s (line 3) and 5 μm/s (line 4) applying 1.4V versus reference electrode. The resulting nano-patterns were imaged via fluid tapping mode obtaining height (c) and phase image (d) simultaneously. FIG. 27(c) and (d) represents micrographs showing height (c) and phase (d) images of PNP3T nano-lines written at the speed of 10 mm/s (3) and 5 mm/s (4). The line width of 3 and 4 were 65 nm and 95 nm respectively. Phase images of ICP nanolines show the clear difference of material rigidity between linear precursor polymer and crosslinked conducting polymer, however no clear height difference between the two was observed in height images.

The electrochemical solid-state crosslinking of PN3T was successfully carried out in either contact mode or tapping mode AFM in electrolyte fluid, and the imaging of the resulting patterns was obtained immediately after using the corresponding modes. The height image of lines of an ICP, PNP3T, written by contact mode is shown in FIG. 26(a) and (b) respectively. The ICP lines of 120 nm (line 1), 170 nm (line 2 and 3), and 240 nm (line 4) wide were obtained at the writing speed of 60 µm/s, 30 µm/s and 15 µm/s, respectively at an applied potential of 1.65 V (vs. NHE). Writing without applying potential did not produce any pattern confirming that the lines are not generated via scratching the polymer film surface by a tip. ICP lines, as small as 120 nm wide could be achieved at a writing speed of 60 µm/s. The writing speed, 60 µm/s, is surprisingly fast compared to current SPL patterning speed of conducting polymers. For example using electrochemical dip pen nanolithography maximum writing speed is 10 nm/s. This faster writing speed for the solid-state oxidative crosslinking comes from the fact that the writing speed with our embodiment is decided by neither the material transfer from tip to substrate which relies on the interactions between transferring materials and substrates as is the case for dip pen nanolithography, nor the material deposition to the electrode surface through a "nucleation and growth mechanism", which slows the ICP deposition during electrochemical deposition as is the case for electrochemical dip pen nanolithography. No lines, which are discernable in height images in contact mode AFM, were obtained by writing faster than 60 µm/s. This speed limit can be explained in terms of the minimum requirement for the electrochemical oxidative coupling of electroactive species during solid state oxidative crosslinking. This can be affected by various experimental conditions; applied potential, tip to surface distance, chain mobility of precursor polymer etc. Apart from our expectation, our electrochemical solid-state oxidative coupling writing in contact mode AFM provided 2.5 dimensional features at the average height of approximately 2 nm. Without being limited by theory, it is believed that the electric field between charged tip and the precursor polymer film, PN3T, in contact mode is strong enough to attract the polymer film, which is softened by swollen in solvent.

Inspired from the results in contact mode writing, writing using tapping mode AFM, the more popular mode for polymeric samples applying much lighter force, was accomplished. Nanometer size ICP lines were obtained by tapping mode electrochemical oxidative crosslinking writing (FIG. 27). The smallest line width obtained was 45 nm, which is close to the size of the AFM tip diameter used (~40 nm). In tapping mode, height and phase images were obtained simultaneously, and the images of nanolines written at the speed of 15 µm/s and 10 µm/s are shown in FIG. 27(a) (height) and FIG. 27(b) (phase). In the nanolines written by tapping mode ECON, no significant height change was observed (FIG. 27(a) and (b), however an apparent phase contrast (FIG. 27(b) and 27 (d) between the insulating precursor polymer, PN3T, and the conducting polymer crosslink, PNP3T, was observed. The phase contrast is attributed to the difference in material rigidity between the linear precursor polymer, PN3T, and crosslinked ICP network, PNP3T. Based on results of contact mode and tapping mode electrochemical oxidative crosslinking, distance and applying force between a tip and a polymer surface plays an important role to decide the electric field induced attraction between a tip and polymeric film surface. Depending of the choice of writing mode, either 2 dimensional (obtained by tapping mode) or 2.5 dimensional (obtained by contact mode) of nanoscale ICP structures could be obtained.

The width of ICP nanolines could be manipulated successfully by controlling writing speeds. The writing speed of ECON decides the duration that the AFM probe spends on the certain region of precursor polymer film, in other words, the duration of solid state oxidative crosslinking is determined by the writing speed. During solid-state oxidative crosslinking, the conversion from the insulating precursor polymer, PN3T, to ICP, PNP3T, propagates due to the new generation of resulting semi-conductive material. As shown in FIGS. 27(b) and (d), the line widths of ICP nanolines were controlled between 45 nm and 95 nm via manipulating the writing speed between 15 µm/s and 5 µm/s. Writing of narrower nanolines is expected by using sharper AFM tips. It should be noted that ICP line-width control in terms of writing speed in electrochemical oxidative nanolithography is attributed to the conductivity of the resulting ICP. Although we have investigated electrochemical oxidative nanolithography via solid-state oxidative crosslinking using other solvents and substrates, thus far, no specific restriction in choice of solvents and substrates were found. Among the solvents, suitable for electrochemical SOC such as acetonitrile and nitromethane could be used to give slightly different results from those of propylene carbonate (PC), however propylene carbonate shows the best results due to its high boiling point that provides the least disturbance during writing and imaging.

From the experiment, it may be seen that true nanometer scale (<100 mm) writing of an ICP was achieved by electrochemical oxidative solid-state crosslinking in nanometer scale using ECAFM. Both contact mode and tapping mode ECAFM can be used to perform ECON. ICP nanolines as small as 45 nm wide that approach the diameter of AFM probe used were obtained with the ability of controlling line width with faster probe rastering speeds resulting in smaller line widths. The writing of narrower ICP nanolines is expected via using sharper conductive AFM probes such as nanotube derivatized tips. The writing speed in ECON is presently >1,000 times faster than other nanolithographic of conducting polymers. As of yet, there is no specific restriction in the choice of substrates, and either 2 dimensional or 2.5 dimensional features can be generated with the choice of tapping mode or contact mode, respectively.

Example 12

This example was conducted to determine the solid-state oxidative crosslinking (SOC) of polynorbornylenes containing 5-norbornene-endo-2,3-bis(methylene thiophene acetate) (N1T), 5-norbornene-endo-2,3-bis(methylene-3-[2,2']-bithiophene acetate) (N2T) and terthiophene pendants (N3T). The study was undertaken to probe polymerization ability, kinetics and the electrochemical and optical properties of the resulting conductive polythiophene interpenetrating networks (IPN)s. The polymerization schematic is shown in FIG. 25. Generally, conductive IPNs prepared from these systems were found to exhibit the capability to shuttle ions with predominant anion transport during the doping/dedoping process and were found to have doping levels ranging from 17 to 36%. N2T was found to produce conductive IPNs via SOC with a lower energy p to p* transition compared to those prepared from N3T.

3-thiophene acetic acid, 5-norbornene-2-endo,3-endo-dimethanol, ethyl thiophene-3-acetate, 2-(tributyl-stannyl) thiophene dichloro-bis(triphenylphosphine)palladium, deuterated chloroform ($CDCl_3$) and p-toluene sulfonic acid were purchased from Aldrich Chemical Co. and used as received. Grubb's alkylidene catalyst and iron (III) chloride were purchased from Strem Chemicals, Inc. and used without further purification. Tetrahydrofuran (THF) and toluene were distilled over sodium and benzophenone under nitrogen, and methylene chloride ($CH_2Cl_2$) and acetonitrile ($CH_3CN$) were distilled over calcium hydride ($CaH_2$) under nitrogen before use. N-bromosuccinimide (NBS), obtained from Acros, was recrystallized from deionized water and vacuum dried. Tetrabutylammonium perchlorate (TBAP) was prepared via the addition of a 70 wt % perchloric acid solution purchased from Fisher Scientific to an aqueous solution of tetrabutylammonium bromide (TBABr) purchased from ACROS organics. TBAP was recrystallized from ethanol before use. Silica Gel was purchased from SAI and the particle size was between 32 mm and 63 mm.

$^1H$ and $^{13}C$ nuclear magnetic resonance (NMR) spectra were recorded using a Bruker 400 FT-NMR spectrometer. $^1H$ NMR data are reported as follows: chemical shift (multiplicity: b=broad signal, s=singlet, d=doublet, t=triplet, q=quartet, dd=doublet of doublets and m=multiplet, integration). $^1H$ and $^{13}C$ chemical shifts are reported in ppm downfield from tetramethylsilane (TMS) reference using residual protonated solvent resonance as an internal standard. Number average molecular weight and polydispersity index (PDI) were obtained using monodisperse polystyrene standards and a Waters 150–C+ gel permeation chromatography (GPC) equipped with ultraviolet/visible (Uv/Vis), refractive index, and evaporative light scattering detectors. Thermal analysis was performed using TA Instrument DSC 2920 and Hi-Res TGA 2950 for differential scanning calorimetery (DSC) and thermagravimetric analysis (TGA).

A Perkin-Elmer Lambda 900 UV-Vis-NIR spectrophotometer was used, and the data was reported using UV winlab software. The polymer, NP2T, was deposited onto an indium doped tin oxide (ITO) coated glass working electrode electrochemically from a 10 mM solution of the monomer, N2T, in 0.1 M TBAP/ACN via scanning from 0 to 1.10 V at the scan rate of 0.1 V/s. The UV-Vis-NIR spectra were taken upon fully oxidized state, then sequentially reducing the polymer film. The ITO coated glass had a nominal resistance of 100 ohms with a dimension of 7 mm×50 mm×0.7 mm and was purchased from Delta Technologies, Ltd.

UV-Vis-NIR studies were conducted upon sequential reduction of PNP2T with hydrazine. 200 nm thick PN2T films were obtained on indium tin oxide (ITO) coated glass from a 1 wt % solution of PN2T in chloroform by spin coating at 1000 rpm, then crosslinked to PNP2T by scanning between −0.2V and 1.1V (vs. $Ag/Ag^+$). This PNP2T film was dipped into an acetonitrile solution containing 0.01 M $FeCl_3$ for 3 minutes until the fully reduced orange color film turned to the fully oxidized dark blue film. The film was washed with acetonitrile and placed in the acetonitrile. UV/V/is/NIR spectrum of fully oxidized state was obtained, then sequential reduction was carried out by subsequent adding a drop of 0.005 M hydrazine/acetonitrile solution into the solution which contain a film of PNP2T. At each reduction step, the film was allowed to sit in this solution for 5 minute before taking the UV-Vis-NIR spectrum. This process was then repeated several times. The film was finally dipped into 0.005 M hydrazine/acetonitrile for full reduction.

An Electrochemical Quartz Crystal Microbalance (EQCM) was used to study ion transport behavior and determine dopant levels of the crosslinked ICPs. The EQCM cell was connected to a CH Instrument 400 potentiostat equipped with oscillator circuit. Polished quartz crystals coated with a 0.201" diameter key-electrode on both sides and operating at a resonant frequency of 7.995 MHz were purchased from International Crystal Manufacturing. The key-electrode comprised of a 1000 Å thick gold coating with a 100 Å chromium underlay were soldered to leads for electrical contact that were sealed away from the solution. A 1 $cm^2$ platinum flag was used as the counter electrode, and a non-aqueous $Ag/Ag^+$ (0.456V vs. NHE) was used as the reference electrode. All the EQCM studies were carried out using 0.1 M $TBAP/CH_3CN$ electrolyte solution.

Preparation of 5-norbornene-endo-2,3-bis(methylene thiophene acetate) (N1T)

To a 250 ml 3-neck round bottom flask that had been vacuum dried and nitrogen purged and fitted with Dean-Stark trap was added 1.46 g (9.5 mmol) of 5-norbornene-2-endo,3-endo-dimethanol. 120 ml of toluene was added under nitrogen, followed by the addition of 2.84 g (20 mmol) of 3-thiophene acetic acid and 160 mg of p-toluene sulfonic acid. The 3 solids were completely dissolved after 10 minutes, and the solution was refluxed for 6 hors while the bottom layer in Dean-Stark trap was collected (80 ml total). The reaction mixture was cooled down to room temperature, washed with water (50 ml), and extracted with ether (3×50 ml). The organic portion was separated and washed with brine, dried over anhydrous sodium sulfate, filtered, and then the solvent was removed under vacuum. The resulting yellow oil was dissolved in 5 ml of $CH_2Cl_2$, and column-chromatography was performed using silica gel with $CH_2Cl_2$/MeOH (98:2) as the eluent to yield 2.90 g (75%) of the desired product, as light yellow oil. $^1H$-NMR ($CDCl_3$): 7.26 (dd, 2H), 7.14 (d, 2H), 7.04 (dd, 2H), 6.10 (s, 2H), 3.90 (dd, 2H), 3.78 (s, 2H), 3.63(s, 4H), 2.82 (s, 2H), 2.49 (m, 2H), 1.48 (d, 1H), 1.29 (d, 1H) $^{13}C$-NMR ($CDCl_3$): 36.30, 40.83, 45.75, 49.32, 65.33, 123.19, 126.10, 126.20, 128.77, 133.90, 135.71, 171.24. FTIR: 3100 and 3040 $cm^{-1}$ (aromatic and vinyl C—H stretching), 2967 and 2873 $cm^{-1}$ (aliphatic C—H stretching), 1734 $cm^{-1}$ (ester C=O stretching), 1259 $cm^{-1}$ (ester C—C—O stretching).

Preparation of ethyl 2-bromothiophene-3-acetate

In a 250 ml 3-neck flask containing 50 ml of $CHCl_3$ and 50 ml of glacial acetic acid, 9.5 grams (0.0558 mol) of ethyl thiophene-3-acetate was added, followed by 9.93 grams (0.0558 mol) of NBS. The mixture was stirred at room temperature for 12 hours. The mixture became clear yellow solution after 1 hour and then was cooled down to room temperature, and poured into 200 ml deionized (DI) water. The organic portion was washed again with 100 ml of DI-water, and then finally washed with 100 ml of 5% aqueous sodium bicarbonate solution. After having been dried over magnesium sulfate, the solvent was filtered and the product was concentrated under vacuum. The resulting residue was vacuum distilled at 95° C. under 1 mm mercury (Hg) yielding 12.3 grams of ethyl 2-bromothiophene-3-acetate (88% yield). $^1H$ NMR ($CDCl_3$): 1.26 (t, 3H), 3.60 (s, 2H), 4.16 (q, 2H), 6.93 (d, 1H), 7.22 (d, 1H).

Preparation of ethyl (2,2'-bithiophene)-3-acetate

To a dried 250 ml three-neck round-bottom flask containing 50 ml of dry THF containing dichlorobis-(triphenylphosphine)palladium (1.20 g) was cannulated 8.5 grams (34 mmol) of ethyl 2-bromothiophene-3-acetate dissolved in 80 ml of dry THF. The mixture was refluxed for 24 hours. The solvent was removed under vacuum, and the residue was dissolved in $CH_2Cl_2$ (100 ml). The solution was washed with water (100 ml×3), and dried with $MgSO_4$. The solvent was evaporated and the residue was purified by column chromatography using silica with toluene as eluent. A total of 5.9 grams of ethyl(2,2'-bithiophene)-3-acetate was obtained as a clear oil resulting in a 69% yield. $^1$H-NMR (CDCl$_3$): 7.33 (dd, 1H), 7.23 (d, 1H), 7.19 (dd, 1H), 7.08 (dd, 1H), 7.05(d, 1H), 4.17 (q, 2H), 3.75 (s, 2H), 1.27 (t, 3H)

Preparation of (2,2'-bithiophene)-3-acetic acid

In a 500 ml flask, 5.5 g (22 mmol) of ethyl (2,2'-bithiophene)-3-acetate dissolved in 50 ml of methanol was added, followed by 200 ml of 15% aqueous sodium hydroxide solution. The solution was refluxed for 3 hours. After cooling down the mixture to room temperature, the solution was concentrated via methanol removal using rotary evaporation. The aqueous solution was washed with diethyl ether, and then acidified with HCl to pH 1 upon which precipitation occurs. The white precipitate was dissolved in CH$_2$Cl$_2$ (150 ml×3) and the organic portion was collected. Chloroform was removed using a rotary evaporator after drying over magnesium sulfate to yield 4.7 g of white solid 96% yield. $^1$H-NMR (CDCl$_3$): 7.34 (dd, 1H), 7.25 (d, 1H), 7.18 (dd, 1H), 7.08 (dd, 1H), 7.06 (d, 1H), 3.80 (s, 2H).

Preparation of 5-norbornene-endo-2,3-bis(methylene-3-[2,2']-bithiophene acetate), (N2T)

To a 250 ml 3-neck round bottom flask that had been vacuum dried and nitrogen purged and fitted with Dean-Stark trap was added 2.46 grams (11 mmol) of (2,2'-bithiophene)-3-acetic acid, 0.81 grams (5.2 mmol) of 5-norbornene-2-endo,3-endo-dimethanol, and 100 ml of toluene under nitrogen, followed by the addition of 84 mg of p-toluene sulfonic acid. The three solids completely dissolved after ten minutes and the solution was refluxed for 6 hours while the bottom layer in Dean-Stark trap was emptied occasionally (60 ml of solution collected in total). The reaction mixture was cooled down to room temperature, washed with water (50 ml), and the product was extracted into ether. The organic portion was separated and washed with brine, dried over sodium sulfate, filtered, and then the solvent was removed under vacuum. The resulting yellow oil was purified by column-chromatography using silica gel and ethyl acetate as the eluent to yield 1.4 grams of the desired product as a clear oil. The yield was 48%. $^1$H-NMR (CDCl$_3$): 7.32 (dd, 2H), 7.22 (d, 2H), 7.18 (dd, 2H), 7.07 (dd, 2H), 7.04 (d, 2H), 6.08 (s, 2H), 3.79 (m, 2H), 3.84 (m, 2H), 3.74 (s, 4H), 2.79 (s, 2H), 2.42 (m, 2H), 1.46 (d, 1H), 1.27 (d, 1H) $^3$C NMR (CDCl$_3$): 35.34, 40.95, 45.85, 49.42, 53.86, 65.52, 124.92, 126.57, 127.30, 128.11, 130.60, 130.73, 133.73, 135.52, 135.84, 171.11 FTIR: 3100 and 3062 cm$^{-1}$ (aromatic and vinylic C—H stretching); 2967 and 2868 cm$^{-1}$ (aliphatic C—H stretching); 1734 cm$^{-1}$ (ester C=O stretch); 1259 cm$^{-1}$ (ester C—C—O stretching).

Preparation of poly[5-norbornene-endo-2,3-bis(methylene thiophene acetate)], (PN1T)

A solution of N1T, (1.33 g, 3.30 mmol) in dry CH$_2$Cl$_2$ (10 ml) was transferred via cannular into a 100 ml Schlenk flask, previously vacuum dried and nitrogen purged, under nitrogen containing 18 mg of Grubb's alkylidene catalyst (0.02 mmol) and 5 ml of CH$_2$Cl$_2$. The mixture was allowed to stir for 30 min followed by irreversible termination via the addition of 3 ml of ethyl vinyl ether. The solution was then concentrated under vacuum. The polymer was precipitated 3 times in pentane (300 ml), filtered and then dried under vacuum to yield 0.98 g (75% yield) of gum-like polymer. Number average molecular weight was determined to be 65,000 g/mole (PDI=1.28). $^1$H-NMR (CDCl$_3$): 7.24 (b, 2H), 7.10 (b, 2H), 7.00 (b, 2H), 5.28 (s, 2H), 4.00 (b, 4H), 3.56 (s, 4H), 2.62 (b, 2H), 2.36 (b, 2H), 1.90 (b, 1H), 1.27 (b, 1H)

Preparation of poly[5-norbornene-endo-2,3-bis(methylene-3-[2,2']-bithiophene acetate)], (PN2T)

PN2T was polymerized from N2T in a manner similar to PN1T with a yield of 94%. The number average molecular weight was determined to be 26,400 g/mol with PDI of 1.14. $^1$H-NMR (CDCl$_3$): 7.19 (b, 2H), 7.06 (b, 4H), 6.91 (b, 4H), 5.13 (s, 2H), 3.93 (b, 4H), 3.60 (s, 4H), 2.45 (b, 2H), 2.21 (b, 2H), 1.78 (b, 1H), 1.20 (b, 1H) $^{13}$C-NMR (CDCl$_3$): 35.16, 44.49, 44.52, 63.68, 124.81, 126.44, 127.10, 128.10, 130.39, 130.60, 133.62, 135.33, 171.00 FTIR: 3105 and 3065 cm$^{-1}$ (aromatic and vinylic C—H stretching); 2954 and 2863 cm$^{-1}$ (aliphatic C—H stretching); 1731 cm$^{-1}$ (ester C=O stretch); 1244 cm$^{-1}$ (ester C—C—O stretching).

All electrochemistry experiments were carried out in a conventional three-electrode cell using a platinum (button) working electrode of 2 mm diameter, a 1 cm$^2$ platinum flag counter electrode and a non-aqueous Ag/0.01 M Ag$^+$ (silver wire in 0.1 M TBAP in CH$_3$CN) reference electrode. The reference electrode was calibrated to be 0.456 V versus the standard hydrogen electrode (SHE) using a 20 mM (millimolar) ferrocene standard solution. Solid-state electrochemical polymerization of precursor polymers was carried out in monomer free 0.1 M TBAP/CH$_3$CN electrolyte solution, and electrochemical polymerization via electroprecipitation technique was carried out using a 10 mM concentration of monomer in TBAP/CH$_3$CN. Electrochemical characterizations of the conducting polymers onto the button working electrodes were performed in a monomer free electrolyte solution after washing of the conducting polymers with CH$_3$CN.

The polymerization yield, number average molecular weight and polydispersity index (PDI) as derived from gel permeation chromatography (GPC) for PN1T, PN2T and PN3T are listed in Table 1. PN1T, PN2T and PN3T are easily soluble in many common organic solvents such as chloroform, tetrahydrofuran, acetone, and toluene. In acetonitrile, which is the solvent in our electrochemical study, the polymers swell to the calculated amount of 8 volume percent for PN3T and 10 volume percent for PN2T, respectively.

TABLE 1

|  | Yield (%) | M$_n$ (g/mol) | PDI |
| --- | --- | --- | --- |
| PN1T | 74 | 64500 | 1.29 |
| PN2T | 85 | 26400 | 1.14 |
| PN3T | 75 | 29300 | 1.08 |

Figure 15A:
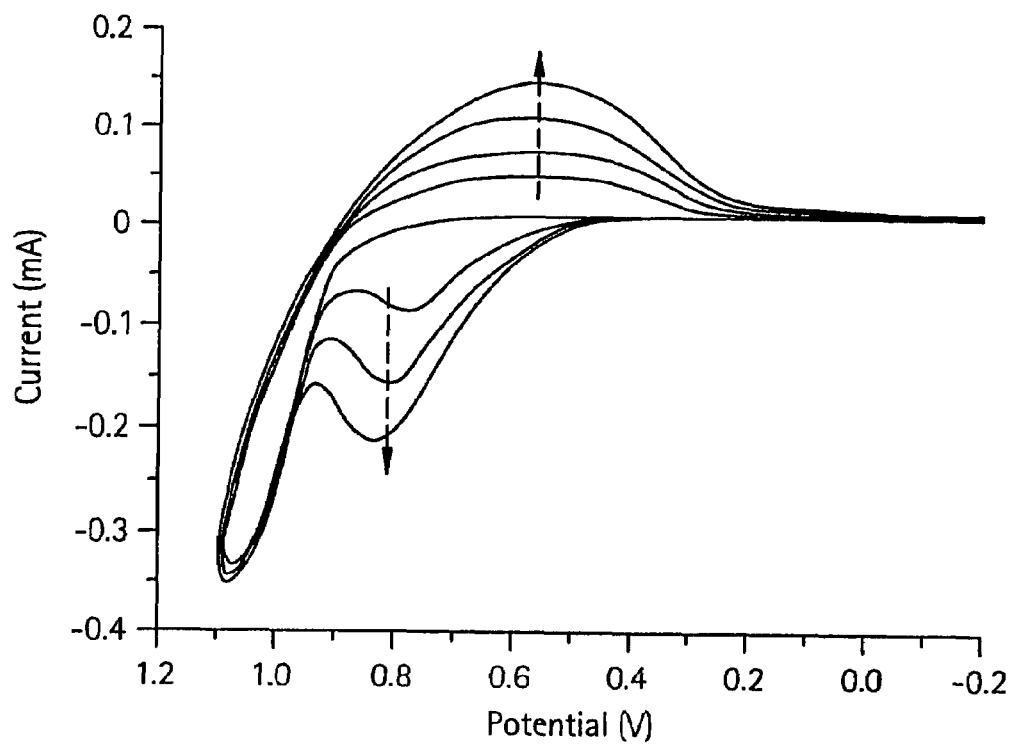
FIG. 15A is a graphical representation depicting the formation of NP2T from a solution of 10 mM N2T in 0.1 M tetrabutylammonium perchlorate (TBAP)/acetonitrile (ACN)

The electrochemical polymerization of the monomers, N1T and N2T, was attempted from their 10 mM solution in 0.1 M TBAP/ACN via cyclic voltammetry. Electrochemical polymerization of N1T was not successful. FIG. 15A depicts the formation of NP2T from a solution of 10 mM N2T in 0.1 M TBAP/ACN. The potential was scanned anodically starting from −0.2 V at a rate of 100 mV/s. At 0.81 V, versus Ag/Ag$^+$ nonaqueous reference electrode, there is an onset for oxidation of bithiophene to bithiophene radical cation with an oxidative diffusion-limited peak current at 1.1 V. At a potential above 0.81 V, polymerization takes place as observed by precipitation of a deep blue solid of NP2T on the working electrode surface. Upon cathodic scanning, a peak current at 0.56 V occurs that is attributed to the reduction of oxidized NP2T to neutral NP2T. A second anodic scan reveals an onset for an oxidation at 0.51 V attributed to that for NP2T. Since this oxidation occurs at a lower potential than the monomer, it can be concluded that NP2T is more highly conjugated than the starting monomer, N2T. Increase of cathodic current at 0.56 V and anodic current at 0.81 V as a function of scan cycle indicates more electroactive species on the electrode surface meaning that additional polymerization of N2T occurs.

Figure 15B:
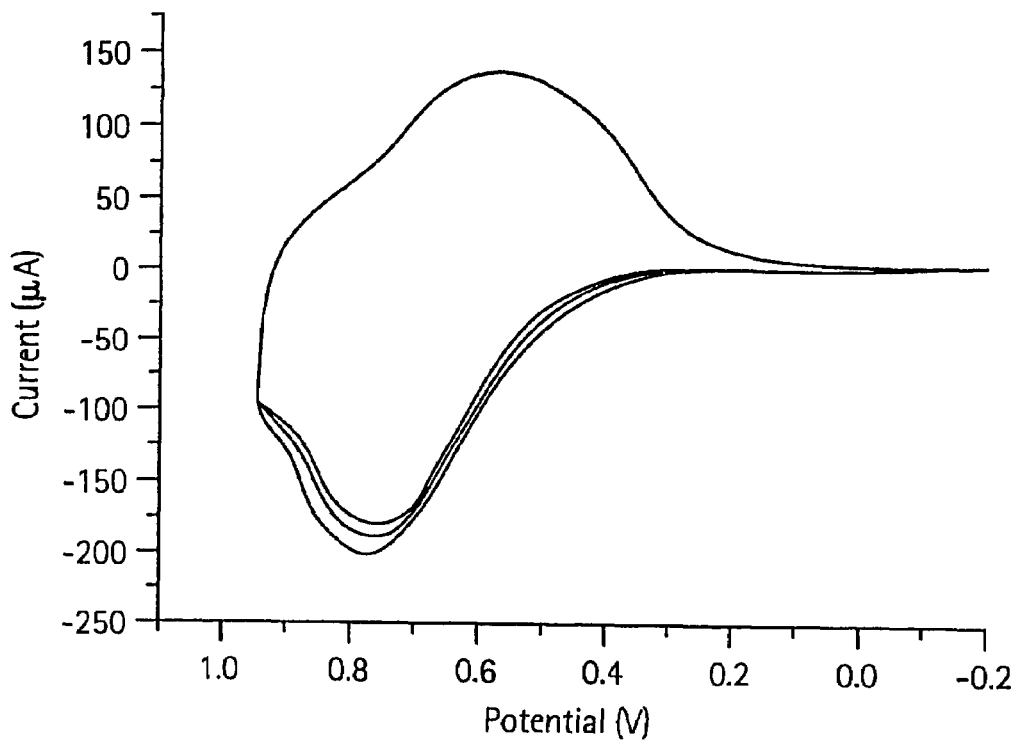
FIG. 15B is a graphical representation depicting the cyclic voltammogram obtained for NP2T at a scan rate of 100 mV/s.

After polymerization of N2T, the electrode coated with a polymer of general structure NP2T was washed with acetonitrile and placed into a monomer-free solution of 0.1 M TBAP/ACN in order to isolate the electrochemical processes. FIG. 15B shows the cyclic voltammogram obtained for NP2T at a scan rate of 100 mV/s. As indicated by FIG. 15B, the half-wave redox potential of the polymer is 0.56 V.

Figure 16A:
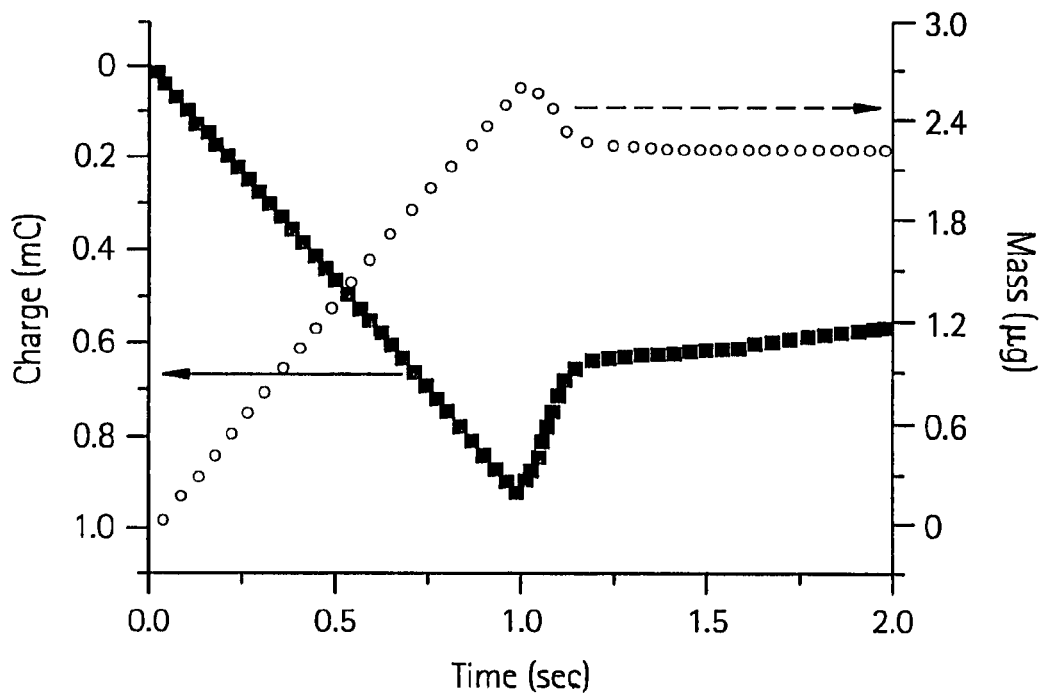
FIG. 16A is a graphical representation depicting the chronocoulometry and concurrent chronogravimetry obtained for the constant potential electrochemical polymerization of N3T in 0.1 M TBAP/CAN.
Figure 16B:
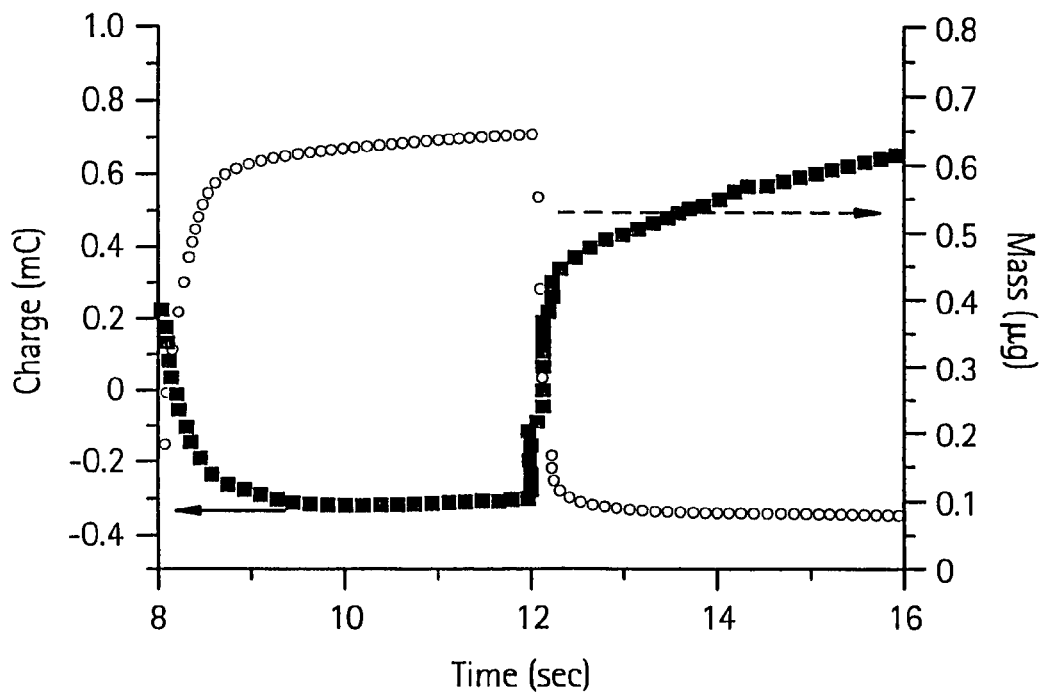
FIG. 16B is a graphical representation depicting the doping/dedoping behavior of NP3T by stepping the potential between 0.9 V and 0 V in 4 second pulses.

The electrochemical polymerization, ion transport and doping of the resulting conductive polymers were studied using the electrochemical quartz crystal microbalance (EQCM). FIG. 16A shows the chronocoulometry and concurrent chronogravimetry obtained for the constant potential electrochemical polymerization of N3T in 0.1 M TBAP/ACN. Upon application of 0.9 V, the mass increases due to positively charged NP3T deposition in addition to the mass of the associated perchlorate counterions. At the end of 1 second the potential is changed to 0 V, at which, the polymer is reduced to the neutral form and a loss of mass on the crystal occurs due to a predominant transport of anions out of the polymer. The percent anions transported during the reduction was calculated from:

$$M_{final} = M_{initial} - X_{an}M_{an} + (Q/F - X_{an})M_{cat} \quad \text{eq (1)}$$

where $M_{initial}$ and $M_{final}$ represent the mass of the polymer, NP3T, deposited in the oxidized state at the end of the initial 1 second period and the mass of the neutral polymer after reduction respectively. $M_{an}$ and $M_{cat}$ are the molar mass of the anion ($ClO_4^-$ ion) and cation ($Bu_4N^+$ ion), respectively, Q is the charge passed during reduction, F is Faraday's constant and $X_{an}$ is the number of moles of anion transported. The doping/dedoping behavior of NP3T was studied by stepping the potential between 0.9 V and 0 V in 4 second pulses (>10 times) as shown in FIG. 16B. The ion transport into and out of the film upon oxidation and reduction was found to be 97% anion dominant and the doping level, calculated as the ratio of moles of electrons removed holes to the moles of thiophene repeat unit, was found to be 35%. Similar ion transport behaviors were observed during electrochemical polymerization for N2T and redox switching of the resulting conductive polymer NP2T as well.

Figure 17:
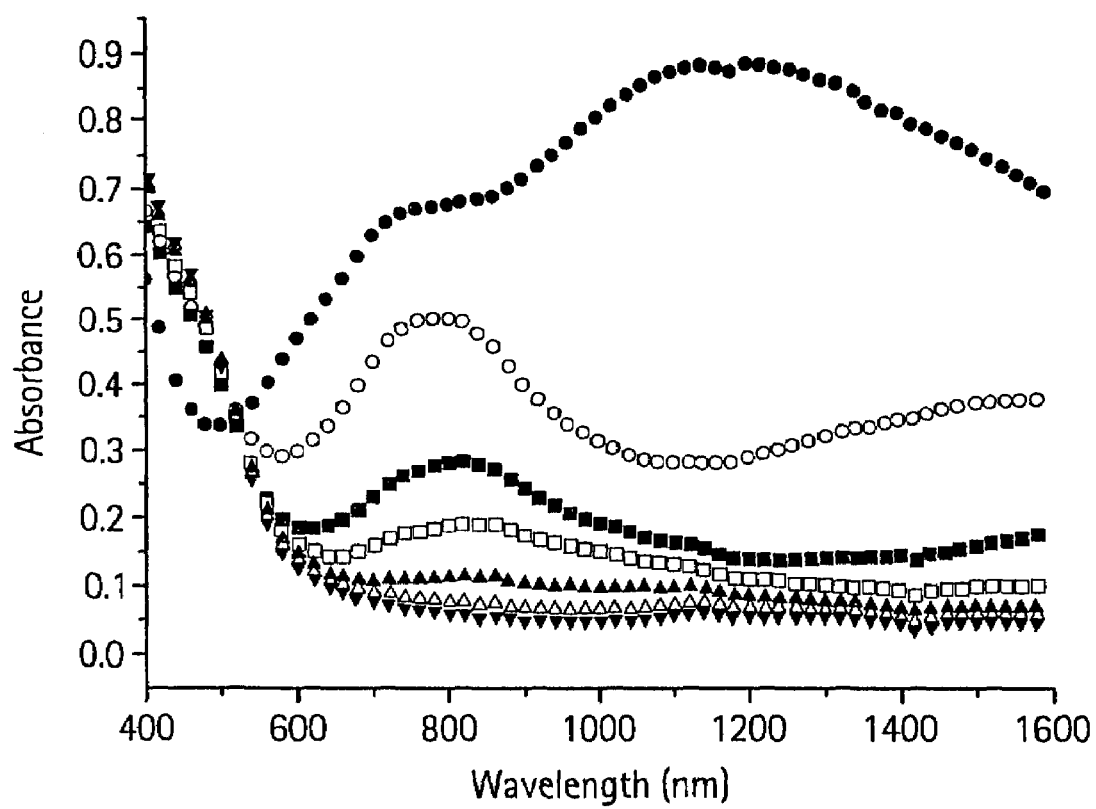
FIG. 17 is a graphical representation depicting the UV-vis-NIR spectra of NP2T upon chemical reduction using 5 mM hydrazine in CAN.

Optical properties of NP2T prepared via conventional electropolymerization were also studied. FIG. 17 shows the UV-vis-NIR spectra of NP2T upon chemical reduction using 5 mM hydrazine in ACN. First, the UV-Vis-NIR spectrum of a fully oxidized NP2T film on ITO coated glass was obtained via application of 1.0 V. An absorption peak at 1200 nm attributed to the π to bipolaron transition resulted. The oxidized NP2T was then sequentially reduced by dropwise addition of 5 mM hydrazine/ACN into the ACN solution containing the NP2T film. Upon addition of 9 mg of a 5 mM hydrazine solution, the absorption at 1200 nm was significantly reduced, and a new peak at 800 nm, attributed to the lower energy π to bipolaron transition, appeared. Upon further dropwise addition of hydrazine solution, the peak at 1200 nm disappeared, while the absorption at 400 nm, attributed to the π to π* transition of polythiophene, became more apparent. After addition of 45 mg of 5 mM hydrazine in ACN, NP2T was fully reduced having a single absorption at about 400 nm, and an onset for the π to π* transition at about 605 nm (2.05 eV).

Figure 18A:
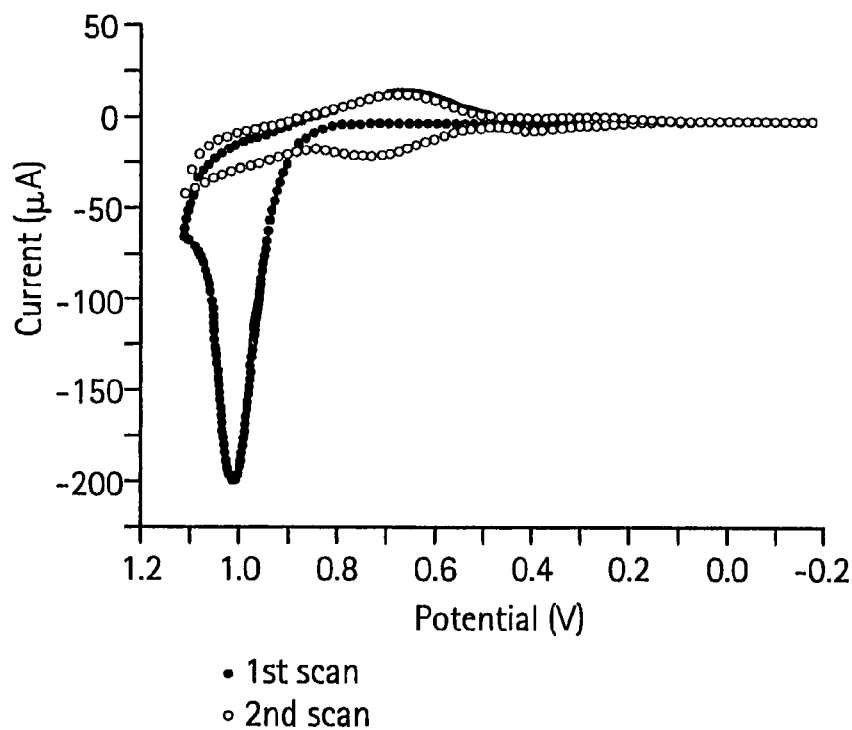
FIG. 18A is a graphical representation depicting the electrochemical solid-state oxidative crosslinking (SOC) of PN2T performed using cyclic voltammetry.

The electrochemical SOC of PN1T and PN2T were attempted in 0.1 M TBAP/$CH_3CN$ electrolyte solution. FIG. 18A shows the electrochemical SOC of PN2T performed using cyclic voltammetry. The precursor polymer, PN2T, was coated from 1 wt % solution in $CHCl_3$ onto the Pt working electrode and then placed in 0.1 M TBAP/ACN. It should be noted that PN2T was not soluble in the electrolyte solution and the insolubility was confirmed by taking UV-Vis spectra of the solution containing a film of PN2T after a period of one hour. During the SOC, the only electrochemically polymerizable monomers present are the pendant bithiophenes attached to PN2T, which are confined to the surface of the electrode. The crosslinking experiment was initiated at a potential of −0.2 V and scanned in the anodic direction at a scan rate of 50 mV/s. As shown in FIG. 18A, at a potential of 0.81 V there is an onset for oxidation that results in a peak at a potential of 1.00 V. Upon cathodic scanning, a reduction peak is observed at a potential of approximately 0.67 V, which can be attributed to the reduction of conductive polythiophene. Upon a second excursion in the anodic direction, there is an onset for oxidation that occurs at approximately 0.31 V, which can be attributed to the oxidation of conjugated polythiophene crosslink units within PNP2T.

Further scanning in the anodic direction shows a significant reduction in the anodic current response at 1.00 V indicating most of the bithiophene units were consumed. Scanning in the reverse direction produces a cathodic process with a current response equivalent to that of the first scan indicating no more formation of conjugated polymer. Thus, oxidative coupling to produce conjugated and conductive polymer was complete upon the first oxidative cycle. It is evident from color observation of the polymer that coupling had taken place since the initially transparent film of PN2T turned dark blue upon excursion above 0.82 V.

Figure 18B:
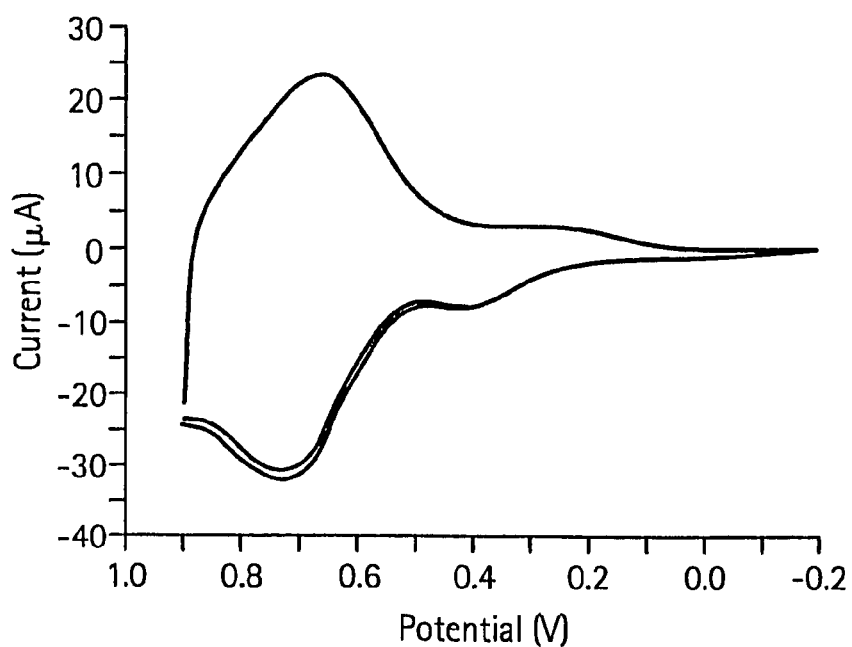
FIG. 18B is a graphical representation depicting the cyclic voltammetry of PNP2T obtained after the solid-state crosslinking of PN2T.
Figure 19:
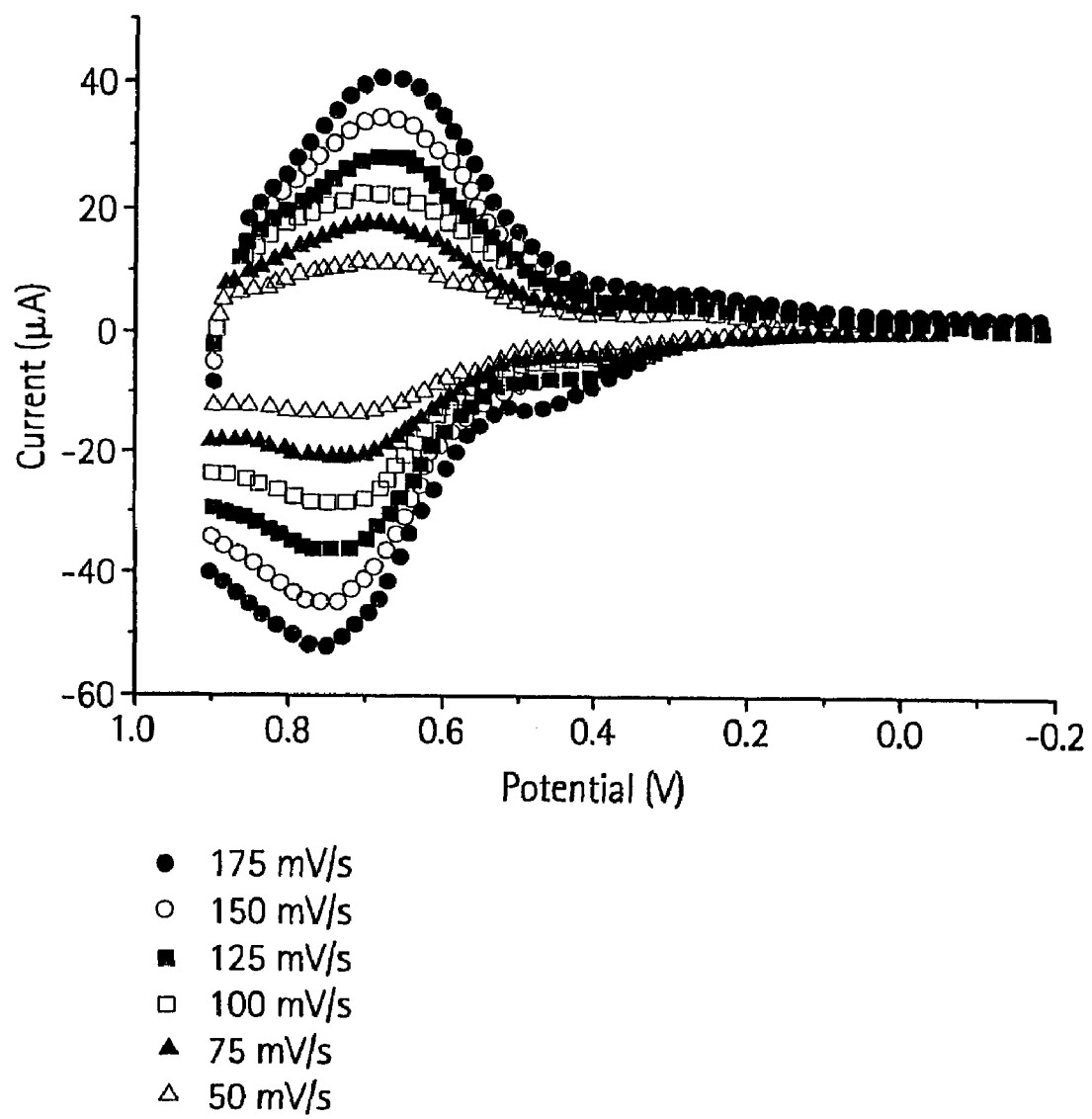
FIG. 19 is a graphical representation depicting the current response of PNP2T as a function of the scan rate at 50, 75, 100, 125, 150 and 175 mV/s.

FIG. 18B shows the cyclic voltammetry of PNP2T obtained after the solid-state crosslinking of PN2T. It should be noted that the oxidation peak of PNP2T occurs at 0.64 V and the reduction peak occurs at approximately 0.67 V. FIG. 19 shows the current response of PNP2T as a function of the scan rate at 50, 75, 100, 125, 150 and 175 mV/s. The linear increase of peak current with respect to the scan rate indicates that the polymer is adhered to the electrode surface. The SOC of PN1T performed under identical conditions to PN2T was not successful possibly due to over-oxidation of the polythiophene that formed. This was apparent in the cyclic voltammetry in that there was an irreversible oxidation of thiophene without a subsequent reduction being apparent.

Figure 20A:
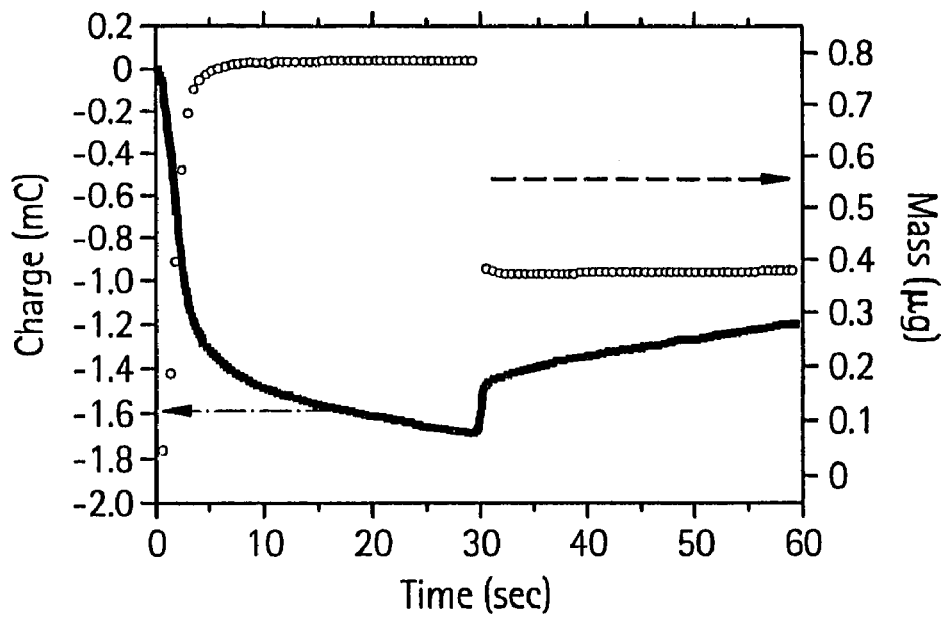
FIG. 20A is a graphical representation depicting the chronocoulometry and concurrent chronogravimetry for constant potential electrochemical SOC of PN3T.
Figure 20B:
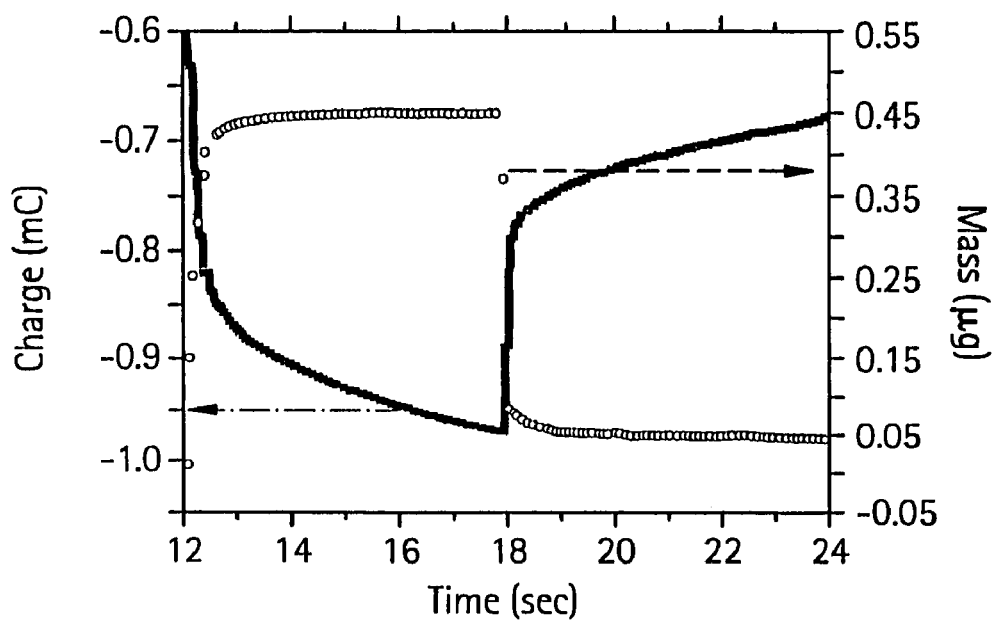
FIG. 20B is a graphical representation of the doping/dedoping behavior of PNP3T determined by stepping the potential between 0.9 V and −0.2 V with a pulse width of 6 seconds.

FIG. 20A is the chronocoulometry and concurrent chronogravimetry for constant potential electrochemical SOC of PN3T. The PN3T was coated onto the gold-key electrode approximately 2.00 µg (micrograms) as measured by QCM, and placed in the EQCM cell filled with 0.1 M TBAP/ACN solution. SOC of PN3T was performed at a constant potential of 0.9 V (vs. Ag/Ag$^+$), the oxidation peak potential for PN3T. After thirty seconds, 0.0 V was applied. Each step of oxidation and reduction was 30 seconds, which was sufficient to give enough time to reach equilibrium of ion movement. As soon as the potential (0.9 V) was applied, oxidative crosslinking of PN3T is initiated taking anions into the polymer matrix to compensate positive charges developed on the terthiophene pendant units. As a result, the mass of polymer increase while the counter ions are moving in, however it reaches a steady-state after approximately 3 seconds, indicating consumption of terthiophene units is completed. In other words, the crosslinking reaction is finished within 3 seconds. During this time, a mass increase of 781 nanograms (ng) was observed mainly due to the incorporation of anion to compensate positive charges attributed to the oxidation of terthiophene units and its resulting conducting polymer PNP3T. Upon switching to −0.2 V, the potential that polymer, PNP3T, is reduced, the mass dropped drastically in less than a second then maintained a steady mass. This indicates that the shutting of anions happened instantaneously while the polymer was being reduced. During this de-doping, 389 ng of mass was decreased as a result of ion shuttling, which is combination of anion migration out of the polymer film and cation incorporation into the polymer film. The ratio of anion and cation, which transport during the solid-state oxidative crosslinking was calculated to be 92:8, a high anion dominancy, according to the equation (1). The doping/dedoping behavior of PNP3T, also studied by stepping the potential between 0.9 V and −0.2 V with a pulse width of 6 second (>10 times). The results are shown in FIG. 20B. PNP3T switches nicely, and the ion transport ratio was calculated to be similar anion dominancy (89%), and the doping level calculated as the ratio of moles of electrons to the moles of thiophene repeat units deposited on the electrode was found to be 36%.

Figure 21A:
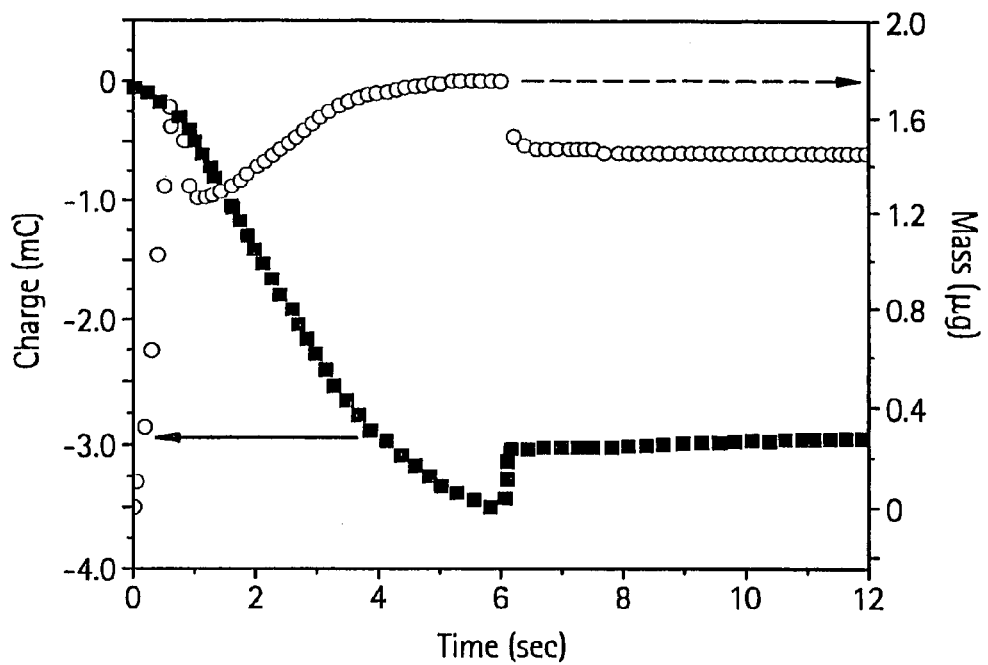
FIG. 21A is a graphical representation depicting the charge and mass change during electrochemical SOC of PN2T by applying a constant potential.
Figure 21B:
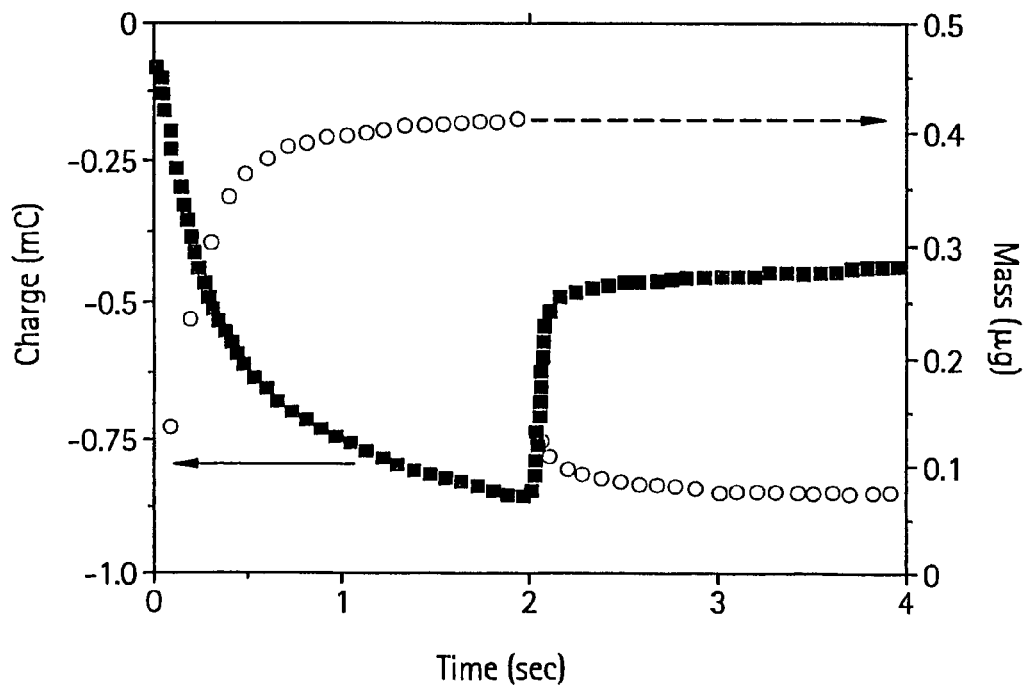
FIG. 21B is a graphical representation of the doping/dedoping behavior of PNP2T determined by stepping the potential between 0.9 V and −0.2 V in 6 second pulses.

FIG. 21A shows the charge and mass change during electrochemical SOC of PN2T via applying constant potential. 3.57 μg. of PN2T, coated onto a gold-key electrode, was placed in the EQCM cell filled with 0.1 M TBAP/CH$_3$CN solution. Crosslinking of PN2T to PNP2T was performed by applying a constant potential of 1.0 V (vs. Ag/Ag$^+$), the peak potential of the oxidation of PN2T (FIG. 7A), for 6 seconds followed by reduction of the crosslinked conductive polymer at −0.2 V for 6 seconds. The percent ratio of anion to cation transported during the solid-state oxidative crosslinking was calculated to be 89% anion dominancy according to equation (1). The doping/dedoping behavior of PNP2T was also studied by stepping the potential between 0.9 V and −0.2 V in 6 second pulses (>10 times). The results are shown in FIG. 21B. The ion transport ratio was calculated to be similar anion dominancy (93%), and the doping level calculated as the ratio of moles of holes to the moles of thiophene repeat units deposited on the electrode was found to be 17%.

Figure 22:
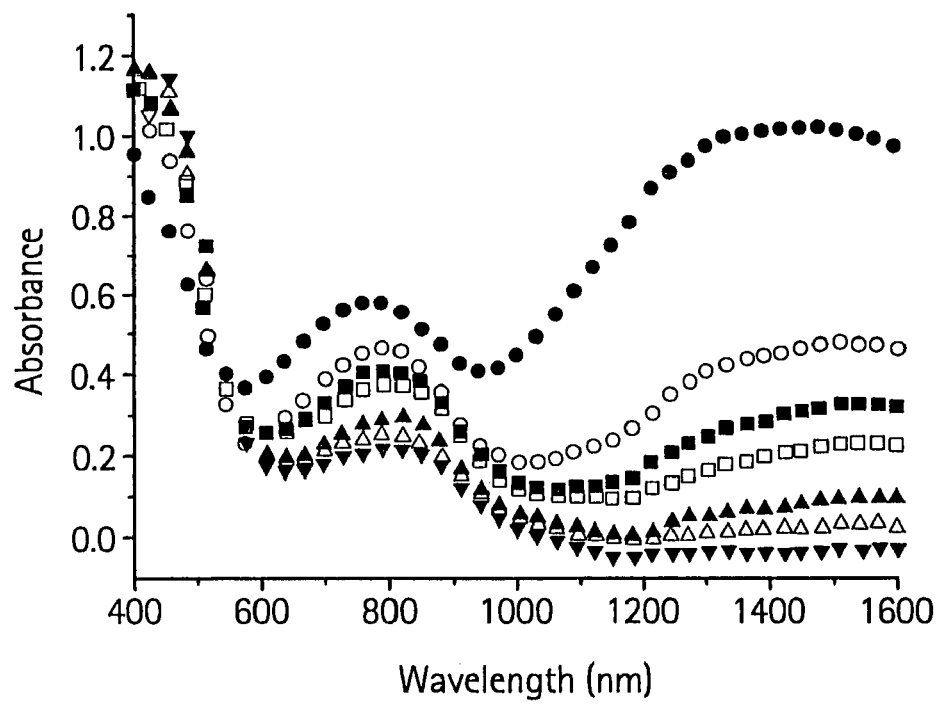
FIG. 22 is a graphical representation depicting optical properties of PNP2T obtained using UV-vis-NIR spectroscopy by sequentially reducing a PNP2T film chemically.

FIG. 22 depicts optical properties of PNP2T obtained using UV-vis-NIR spectroscopy by sequentially reducing a PNP2T film chemically. The PN2T film spin-coated on ITO coated glass was converted to PNP2T via electrochemical SOC by cyclic voltammetry. The resulting PNP2T film in oxidized state was sequentially reduced with 5 mM hydrazine in ACN. The spectrum in fully oxidized state exhibits two peaks at 780 nm (1.59 eV) and 1510 nm (0.82 eV), which can be attributed to the transitions from the valence band to the first and second bipolaron bands. Upon dropwise addition of chemical reducing agent (5 mM hydrazine in ACN), the polymer is sequentially reduced upon which there is a reduction in the absorbance for the valence to bipolaron transitions and an increase in absorbance for the valence to π* transition. PNP2T exhibits a band gap of approximately 2.10 eV (588 nm) with a peak at 2.79 eV (445 nm) in fully reduced state.

Figure 23:
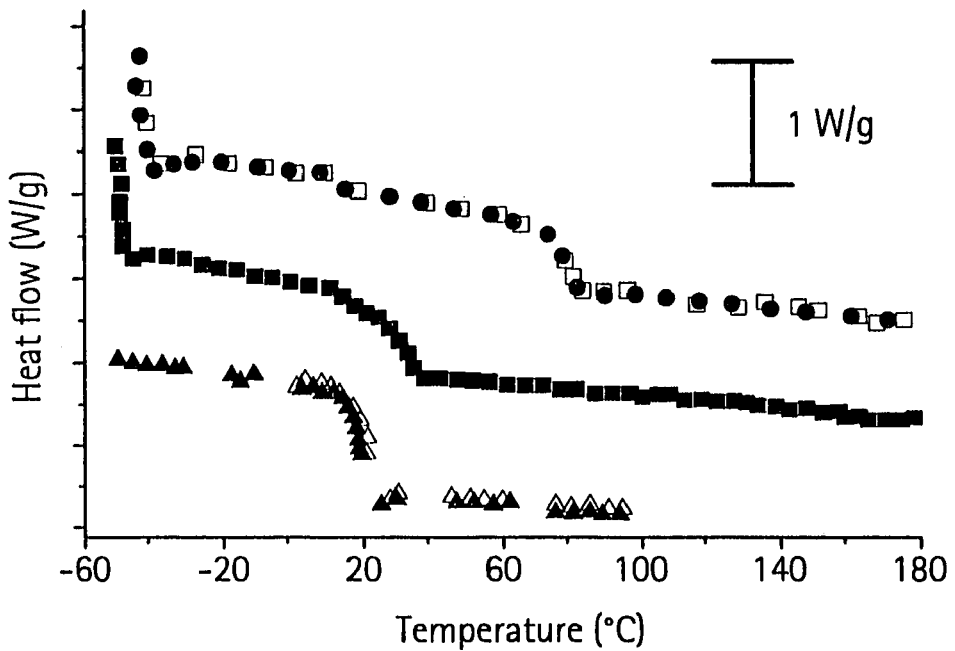
FIG. 23 is a graphical representation depicting the glass transition temperatures ($T_g$) of the three precursor polymers, PN1T, PN2T, and PN3T as determined by differential scanning calorimetry (DSC)
Figure 24:
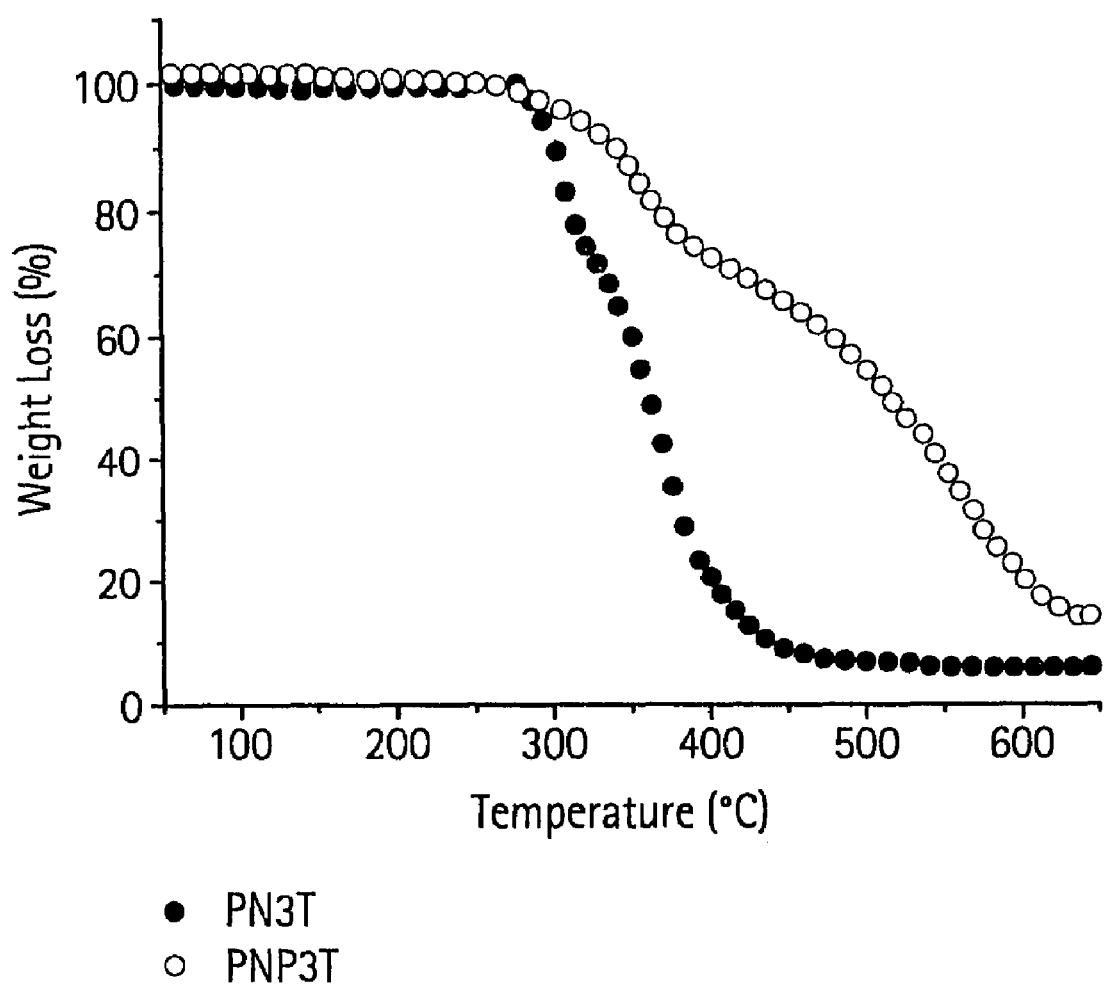
FIG. 24 is a graphical representation depicting the TGA results of PN3T and PNP3T.

The glass transition temperatures ($T_g$) of the three precursor polymers, PN1T, PN2T, and PN3T were studied using differential scanning calorimetery (DSC). FIG. 23 shows the DSC results of these three precursor polymers. The samples were heated up to 100° C. and immediately quenched using liquid nitrogen until they reach −50° C., then DSC analysis was performed by heating at the scan rate of 10° C./minute. As shown in FIG. 23, the $T_g$ of PN1T, PN2T, and PN3T were 21° C., 34° C., and 80° C., respectively. As more aromatic portions are attached to the flexible polynorbornene backbone, the glass transition temperature of the precursor polymer increases. There were no observable melting temperatures indicating these precursor polymers are highly amorphous. Thermal stability of the precursor polymers was also studied using thermal gravimetric analysis (TGA). FIG. 24 shows the TGA results of PN3T and PNP3T. Thermal stability of precursor polymer (PN3T) was significantly increased via SOC especially at high temperatures. The temperatures of 5% weight loss of PN3T and PNP3T were, 293° C., 332° C., and 50% weight loss were 355° C. and 507° C. respectively.

Without being limited by theory, it is believed that the glass transition temperatures of the three pre-polymers increased as the size of the pendant heterocycles increase as measured by DSC, and in the case of PNP2T, the glass transition temperature was shifted to a higher temperature than that of PN2T due to the reduction of free volume via SOC. The thermal stability of PNP3T was higher than that of PN3T indicating the formation of a network structure via SOC increases the thermal stability of polymer.

From the aforementioned example, it may be seen that thiophene based monomer, N1T, was not polymerized by either method due to high oxidation potential, however bi- and ter-thiophene systems, N2T and N3T, were polymerized by both techniques and the SOC technique gives longer conjugation length than that of conventional electroprecipitation. Thus, polythiophenes from higher oligomeric units give lower degree of conjugation than that of lower oligomeric units in both electroprecipitation and solid-state crosslinking.

Ion transport behavior of polythiophenes in two different methods, electroprecipitation and SOC, shows similar behavior to that of polythiophene from electroprecipitaiton. Doping level of PNP3T was 36% (1 charge every 3 thiophene rings) and PNP2T was 17% (1 charge every 6 thiophene rings. All of these results indicate that conductive polymer interpenetrating networks may be used for applications that conductive polymers prepared via conventional electrochemical polymerization are being used.

Example 13

The following examples demonstrate that solid state oxidative crosslinking can be utilized on polymer precursor composites by which a composite is defined as the precursor polymer containing a filler that is either conductive or insulating. The precursor composite comprising 10 wt % buckeye balls and PN3T was subjected to oxidative solid-state crosslinking. The procedure was as follows:

The buckeyeball-PN3T solution was prepared by loading 1 mg of buckminister fullerene into 1 ml of CHCl$_3$ containing 9 mg of PN3T. The mixture was sonicated for 30 seconds to disperse the buckeye balls. The solution was poured onto an indium tin oxide (ITO) coated glass slide that was held at a temperature of 45° C. The film was dried for 5 minutes, then subjected to solid-state electrochemical oxidative crosslinking in 0.1M TBAP/ACN using cyclic voltammetry (3 cycles) by applying a potential between 0 V and 1.0 V (vs. Ag/Ag$^+$) at the scan rate of 50 mV/s was utilized. The cyclic voltammogram (not shown) was indicative of the crosslinking process.

In a second example, electrically insulating glass beads in an amount of 7.4 wt %, based upon the weight of the precursor composite was subjected to oxidative solid-state crosslinking. The procedure was as follows.

7.4 wt % of glass bead to PN3T solution was prepared by loading 0.8 mg of glass bead into 1 ml of CHCl$_3$ containing 10 mg of PN3T. The solution was poured onto an indium doped tin oxide coated glass slide that was held at 45° C. The film dried for 5 minutes following which electrochemical oxidative solid-state crosslinking was performed in 0.1M TBAP/ACN using cyclic voltammetry (3 cycles) via applying the potential scan between 0 V and 1.0 V (vs. Ag/Ag$^+$) at a scan rate of 50 mV/s. The CV of resulting composite was performed in 0.1M TBAP/ACN using cyclic voltammetry (4 cycles) via applying between 0 V and 0.95 V (vs. Ag/Ag$^+$) at the scan rate of 100 mV/s. The cyclic voltammetry (not shown) was in accordance with the occurrence of solid-state oxidative crosslinking.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A method of manufacturing an intrinsically conductive polymer comprising:
   providing an intrinsically conductive polymer precursor in bulk form or as a film;
   subsequently exposing the intrinsically conductive polymer precursor to an oxidant or to an electrolytic medium; and
   crosslinking a portion of the intrinsically conductive polymer precursor in the solid state, the swollen state, or combinations comprising at least one of the foregoing states, wherein the swollen state is characterized as being one wherein the intrinsically conductive polymer precursor increases in volume upon exposure to a solvent without completely dissolving in the solvent.

2. The method of claim 1, wherein the intrinsically conductive polymer is poly(aniline), substituted poly(aniline), poly(pyrrole), poly(thiophene), poly(acetylene), poly(ethylene dioxythiophene), a poly(p-phenylene vinylene), poly(3,4- ethylenedioxythiophene), poly(3,4-ethylenedithiathiophene), poly(isathianaphthene), poly(pyridothiophene), poly(pyrizinothiophene), poly(3,4-ethylenedioxypyrrole), poly(phenylenevinylene), poly(p-phenylene), poly(thionapthene), poly(benxofuran), poly(indole), poly(dibenzothiophene), poly(dibenxofuran), poly(carbazole), poly(bithiophene), poly(bifuran), poly(bipyrrole), poly(thienothiophene), poly(thienofuran), poly(thienopyrrole), poly(furanylpyrrole), poly(furanylfuran), poly(pyrolylpyrrole), poly(terthiophene), poly(terfuran), poly(terpyrrole), poly(dithienothiophene), poly(difuranylthiophene), poly(dipyrrolylthiophene), poly(dithienofuran), poly(dipyrrolylfuran), poly(dipyrrolylpyrrole), poly(phenyl acetylene), poly(biindole), poly(dithienovinylene), poly(difuranylvinylene), poly(dipyrrolylvinylene), poly(1,2-trans (3,4-ethylenedioxythienyl)vinylene), poly(1,2-trans(3,4-ethylenedioxyfuranyl)vinylene), poly(1,2-trans(3, 4ethylenedioxypyrrolyl)vinylene), poly(bis-thienylarylenes) and poly(bis-pyrrolylarylenes), poly(bis(3,4-ethylenedioxythienyl)arylenes, poly(dithienylcyclopentenone), poly(quinoline), poly(thiazole), poly(fluorene) poly(azulene), poly(2-substituted thieno[3,4-b]thiophenes), poly(6-substituted thieno[3,4-b]thiophenes) or combinations comprising at least one of the foregoing intrinsically conductive polymers.

3. The method of claim 1, wherein the intrinsically conductive polymer is copolymerized with non-electrically conductive polymers, and wherein the non-electrically conductive polymers are polyacetals, polyacrylics, polycarbonates polystyrenes, polyesters, polyamides, polyamideimides, polyarylates, polyacrylates, polymethylmethacrylates, polyarylsulfones, polyethersulfones, polyphenylene sulfides, polyvinyl chlorides, polysulfones, polyimides, polyetherimides, polytetrafluoroethylenes, polyetherketones, polyether etherketones, polyether ketone ketones, polybenzoxazoles, polyoxadiazoles, polybenzothiazinophenothiazines, polybenzothiazoles, polypyrazinoquinoxalines, polypyromellitimides, polyquinoxalines, polybenzimidazoles, polyoxindoles, polyoxoisoindolines, polydioxoisoindolines, polytriazines, polypyridazines, polypiperazines, polypyridines, polypiperidines, polytriazoles, polypyrazoles, polypyrrolidines, polycarboranes, polyoxabicyclononanes, polydibenzofurans, polyphthalides, polyanhydrides, polyvinyl ethers, polyvinyl thioethers, polyvinyl alcohols, polyvinyl ketones, polyvinyl halides, polyvinyl nitriles, polyvinyl esters, polysulfonates, polysulfides, polythioesters, polysulfones, polysulfonamides, polyureas, polyphosphazenes, polysilazanes, polysiloxane, polyolefins, fluoropolymers, liquid crystalline polymers, ionomers, or combinations comprising at least one of the foregoing polymers and wherein the copolymers are in the from of random copolymers, graft copolymers, block copolymers, star block copolymers, dendrimers, or combinations comprising at least one of the foregoing copolymers.

4. The method of claim 3, wherein the non-electrically conductive polymers are also crosslinked with the intrinsically conductive polymers or the intrinsically conductive polymer precursors or both.

5. The method of claim 1, wherein the intrinsically conductive polymer is a poly(thiophene) having the structural units shown in (XXIX) or (XXX):

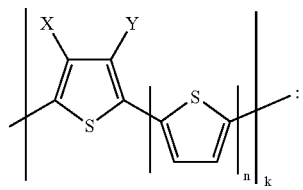

(XXIX)

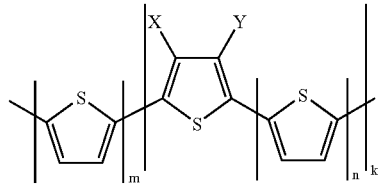

(XXX)

where X and Y are either the same or different and are hydrogen, alkyl, alkoxy, alkoxyalkyl, acyl, alkylene, carboxy, ester, thioacyl, or combinations of at least one of the foregoing groups having about 1 to about 22 carbon atoms, and wherein n and m independently of one another are integers from about 1 to about 10 and 1 and k is an integer from about 1 to about 3000.

6. The method of claim 1, wherein the intrinsically conductive polymer is a poly(thiophene) having the structure (XXXV) or the structure (XXXVI)

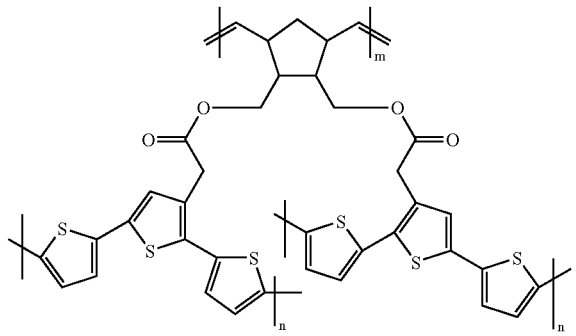
(XXXV)

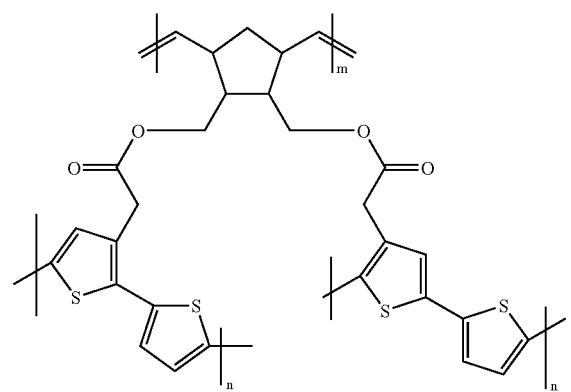
(XXXVI)

and wherein the molecular weight of the poly(thiophene) is about 100 to about 500,000 grams/mole and further wherein there is a positive charge on the intrinsically conductive polymer and associated with this positive charge is a negative charge.

7. The method of claim 1, wherein the intrinsically conductive polymer is a poly(thiophene) having the structure (XXXVII) or the structure (XXXVIII)

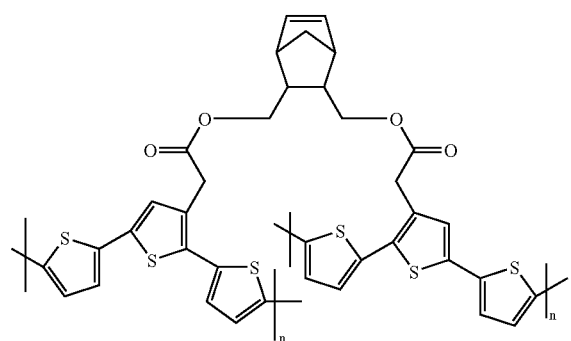
(XXXVII)

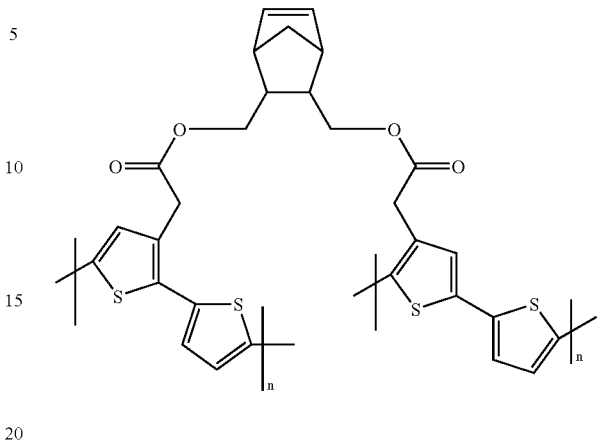
(XXXVIII)

and wherein the molecular weight of the poly(thiophene) is about 100 to about 500,000 g/mole and further wherein there is a positive charge on the intrinsically conductive polymer and associated with this positive charge is a negative charge.

8. The method of claim 1, wherein the intrinsically conductive polymer precursor is 3,4-di(decyl)thiophene, 3,4-di(undecyl)thiophene, 3,4-di(dodecyl)thiophene, 3,4-di(tridecyl)thiophene, 3,4-di(tetradecyl)thiophene, 3,4-di(pentadecyl)thiophene, 3,4-di(hexadecyl)thiophene, 3,4-di(heptadecyl)thiophene, 3,4-di(octadecyl)thiophene, 3,4-di(decyloxy)thiophene, 3,4-di(undecyloxy)thiophene, 3,4-di(dodecyloxy)thiophene, 3,4-di(tridecyloxy)thiophene, 3,4-di-(tetradecyloxy)thiophene, 3,4-di(pentadecyloxy) thiophene, 3,4-di-(hexadecyloxy)thiophene, 3,4-di(heptadecyloxy)thiophene, 3,4-di-(octadecyloxy)thiophene, 3,4-di(decyloxyethyl)thiophene, 3,4-di(undecyloxyethyl)thiophene, 3,4-di-(dodecyloxyethyl)thiophene, 3,4-di(tridecyloxyethyl)thiophene, 3,4-di-(tetradecyloxyethyl)thiophene, 3,4-di(pentadecyloxyethyl)thiophene, 3,4-di-(hexadecyloxyethyl)thiophene, 3,4-di(heptadecyloxyethyl)thiophene, 3,4-di-(octadecyloxyethyl)thiophene, 3,4-di((2-decyloxy)ethyl)thiophene, 3,4-di((3-decyloxy)propyl)thiophene, 3,4-di((4-decyloxy)butyl)thiophene, 3,4-di(2-(2-(decyloxyethoxy)ethyl)thiophene, 3,4-di(2-(2-(undecyloxyethoxy)ethyl)thiophene, 3,4-di(2-(2-(dodecyloxy)ethoxy)ethyl)thiophene, 3,4-di(cyclopentyl) thiophene, 3,4-di(cyclopentenyl)thiophene, 3,4-di(cyclohexy l)thiophene, 3,4-di(cyclohexenyl)thiophene, 3,4-di(cyclohexadienyl)thiophene, 3,4-di(phenyl)thiophene, 3,4-di(benzyl)thiophene, 3,4-di(decanoyl)thiophene, 3,4-di(undecanoyl)thiophene, 3,4-di(dodecanoyl)thiophene, 3,4-di(tridecanoyl)thiophene, 3,4-di(tetradecanoyl)thiophene, 3,4-di(pentadecanoyl)thiophene, 3,4-di(hexadecanoyl) thiophene, 3,4-di(heptadecanoyl)thiophene, 3,4-di(octadecanoyl)thiophene, 3,4-di(decanoyloxy)thiophene, 3,4-di(undecanoyloxy)thiophene, 3,4-di(decanoylamino)thiophene, 3,4-di(undecanoylamino)thiophene, 3,4-di(dodecanoylamino)thiophene, 3,4-di(tridecanoylamino)thiophene, 3,4-di(tetradecanoylamino)thiophene, 3,4-di(pentadecanoylamino)thiophene, 3,4-di(hexadecanoylamino)thiophene, 3,4-di(heptadecanoylamino)thiophene, 3,4-di(octadecanoylamino)thiophene, 2,3-dipentylthienol[3,4-b]pyrazine, 2,3-didecylthieno[3,4-b]pyrazine, 2,3-diundecylthieno[3,4-b] pyrazine, 2,3-didodecylthieno[3,4-b]pyrazine, 2,3-ditridecylthieno[3,4-b]pyrazine, 2,3-ditetradecylthieno[3,4-

-b]pyrazine, 2,3-dipentadecylthieno[3,4-b]pyrazine, 2,3-dihexadecylthieno[3,4-b]pyrazine, 2,3-diheptadecyithieno[3,4-b]pyrazine, 2,3-dioctadecyithieno[3,4-b]pyrazine, 2-methyl-3-decyloxythieno[3,4-b]pyrazine-, 2-methyl-3-undecyloxythieno[3,4-b]pyrazine-, 2-methyl-3-dodecyloxythieno[3,4-b]pyrazine-, 2-methyl-3-tridecyloxythieno[3,4-b]pyrazine-, 2-methyl-3-tetradecyloxythieno[3,4-b]pyrazine-, 2-methyl-3-pentadecyloxythieno[3,4-b]pyrazine-, 2-methyl-3-hexadecyloxythieno[3,4-b]pyrazine-, 2-methyl-3-octadecyloxythieno[3,4-b]pyrazine-, 2-methyl-3-eicosyloxythieno[3,4-b]pyrazine-, 2-methyl-3-docosyloxythieno[3,4-b]pyrazine-, 2-ethyl-3-decyloxythieno[3,4-b]pyrazine-2-ethyl-3-undecyloxythieno[3,4-b]pyrazine-, 2-ethyl-3-dodecyloxythieno[3,4-b]pyrazine-, 2-ethyl-3-tridecyloxythieno[3,4-b]pyrazine-, 2-ethyl-3-tetradecyloxythieno[3,4-b]pyrazine-, 2-ethyl-3-pentadecyloxythieno[3,4-b]pyrazine-, 2-ethyl-3-hexadecyloxythieno[3,4-b]pyrazine-, 2-ethyl-3-octadecyloxythieno[3,4-b]pyrazine-, 2-ethyl-3-eicosyloxythieno[3,4-b]pyrazine-, 2-ethyl-3-docosyloxythieno[3,4-b]pyrazine, 2-phenyl-3-decyloxythieno[3,4-b]pyrazine-, 2-phenyl-3-undecyloxythieno[3,4-b]pyrazine-, 2-phenyl-3-dodecyloxythieno[3,4-b]pyrazine-, 2-phenyl-3-tridecyloxythieno[3,4-b]pyrazine-, 2-phenyl-3-tetradecyloxythieno[3,4-b]pyrazine-, 2-phenyl-3-pentadecyloxythieno[3,4-b]pyrazine-, 2-phenyl-3-hexadecyloxythieno[3,4-b]pyrazine-, 2-phenyl-3-heptadecyloxythieno[3,4-b]pyrazine-, 2-phenyl-3-octadecyloxythieno[3,4-b]pyrazine-, 2-phenyl-3-eicosyloxythieno[3,4-b]pyrazine-, 2-phenyl-3-docosyloxythieno[3,4-b]pyrazine, 2,3-di(decyloxy)thieno[3,4-b]pyrazine, 2,3-di(undecyloxy)thieno[3,4-b]pyrazine, 2,3-di(dodecyloxy)thieno[3,4-b]pyrazine, 2,3-di(tridecyloxy)thieno[3,4-b]pyrazine, 2,3-di(tetradecyloxy)thieno[3,4-b]pyrazine, 2,3-di(pentadecyloxy)thieno[3,4-b]pyrazine, 2,3-di(hexadecyloxy)thieno[3,4-b]pyrazine, 2,3-di(heptadecyloxy)thieno[3,4-b]pyrazine, 2,3-di(octadecyloxy)thieno[3,4-b]pyrazine, 2,3-di(decyloxyethyl)thieno[3,4-b]pyrazine, 2,3-di(undecyloxyethyl)thieno[3,4-b]pyrazine, 2,3-di(dodecyloxyethyl)thieno[3,4-b]pyrazine, 2,3-di(tridecyloxyethyl)thieno[3,4-b]pyrazine, 2,3-di(tetradecyloxyethyl)thieno[3,4-b]pyrazine, 2,3-di(pentadecyloxyethyl)thieno[3,4-b]pyrazine, 2,3-di(hexadecyloxyethyl)thieno[3,4-b]pyrazine, 2,3-di(heptadecyloxyethyl)thieno[3,4-b]pyrazine, 2,3-di(octadecyloxyethyl)thieno[3,4-b]pyrazine, 2,3-di(ethyl-2-oxydecyl)thieno[3,4-b]pyrazine, 2,3-di(propyl-3-oxydecyl)thieno[3,4-b]pyrazine, 2,3-di(butyl-4-oxydecyl)thieno[3,4-b]pyrazine, 2,3-di(cyclopentyl)thieno[3,4-b]pyrazine, 2,3-di(cyclopentenyl)thieno[3,4-b]pyrazine, 2,3-di(cyclohexyl)thieno[3,4-b]pyrazine, 2,3-di(cyclohexenyl)thieno[3,4-b]pyrazine, 2,3-di(cyclohexadienyl)thieno[3,4-b]pyrazine, 2,3-di(phenyl)thieno[3,4-b]pyrazine, 2,3-di(benzyl)thieno[3,4-b]pyrazine, 5,6-di(decyloxy)cyclobuta[b]thieno[3,4-e]pyrazine, 5,6-di(undecyloxy)cyclobuta[b]thieno[3,4-e]pyrazine, 5,6-di(dodecyloxy)cyclobuta[b]thieno[3,4-e]pyrazine, 5,6-di(tridecyloxy)cyclobuta[b]thieno[3,4-e]pyrazine, 5,6-di(tetradecyloxy)cyclobuta[b]thieno[3,4-e]pyrazine, 5,6-di(pentadecyloxy)cyclobuta[b]thieno[3,4-e]pyrazine, 5,6-di(hexadecyloxy)cyclobuta[b]thieno[3,4-e]pyrazine, 5,6-di(heptadecyloxy)cyclobuta[b]thieno[3,4-e]pyrazine, 5,6-di(octadecyloxy)cyclobuta[b]thieno[3,4-e]pyrazine, 5,6-di(cyclopentyloxy)cyclobuta[b]thieno[3,4-e]pyrazine, 5,6-di(cyclopentenyloxy)cyclobuta[b]thieno[3,4-e]pyrazine, 5,6-di(cyclohexyloxy)cyclobuta[b]thieno[3,4-e]pyrazine, 5,6-di(cyclohexenyloxy)cyclobuta[b]thieno[3,4-e]pyrazine, 5,6-di(cyclohexadienyloxy)cyclobuta[b]thieno[3,4-e]pyrazine, 5,6-di(phenyl)cyclobuta[b]thieno[3,4-e]pyrazine, 5,6-di(benzyl)cyclobuta[b]thieno[3,4-e]pyrazine, 2-decyl-1H-thieno[3,4-d]imidazole, 2-undecyl-1H-thieno[3,4-d]imidazole, 2-dodecyl-1H-thieno[3,4-d]imidazole, 2-tridecyl-1H-thieno[3,4-d]imidazole, 2-tetradecyl-1H-thieno[3,4-d]imidazole, 2-pentadecyl-1H-thieno[3,4-d]imidazole, 2-hexadecyl-1H-thieno[3,4-d]imidazole, 2-heptadecyl-1H-thieno[3,4-d]imidazole, 2-octadecyl-1H-thieno[3,4-d]imidazole, 2-cyclopentyl-1H-thieno[3,4-d]imidazole, 2-cyclopentenyl-1H-thieno[3,4-d]imidazole, 2-cyclohexyl-1H-thieno[3,4-d]imidazole, 2-cyclohexenyl 1H-cyano[3,4-d]imidazole, 2-cylohexadienyl-1H-thieno[3,4-d]imidazole, 2-phenyl-1H-thieno[3,4-d]imidazole, 2-benzyl-1H-thieno[3,4-d]imidazole, 2-butylthio-1H-thieno[3,4-d]imidazol-, 2-pentylthio-1H-thieno[3,4-d]imidazol-, 2-hexylthio-1H-thieno[3,4-d]imidazol-, 2-heptylthio-1H-thieno[3,4-d]imidazol-, 2-octylthio-1H-thieno[3,4-d]imidazol-, 2-nonylthio-1H-thieno[3,4-d]-imidazol-, 2-decylthio-1H-thieno[3,4-d]imidazol-, 2-undecylthio 1H-thieno[3,4-d]imidazol-, 2-dodecylthio-1H-thieno[3,4-d]imidazol-, 2-tride-cylthio-1H-thieno[3,4-d]imidazol-, 2-tetradecylthio-1H-thieno[3,4-d]imidazol-, 2-pentadecylthio-1H-thieno[3,4-d]imidazol-, 2-hexadecylthio-1H-thieno[3,4-d]imidazol-, 2-heptadecylthio-1H-thieno[3,4-d]imidazol-, 2-octodecylthio-1H-thieno[3,4-d]imidazol, 2-substituted thieno[3,4-b]thiophenes, 6-substituted thieno[3,4-b]thiophenes, or combinations comprising at least one of the foregoing intrinsically conductive polymer precursors.

9. The method of claim 1, wherein the intrinsically conductive polymer precursor has the structure shown in formula (XXXI) or (XXXII):

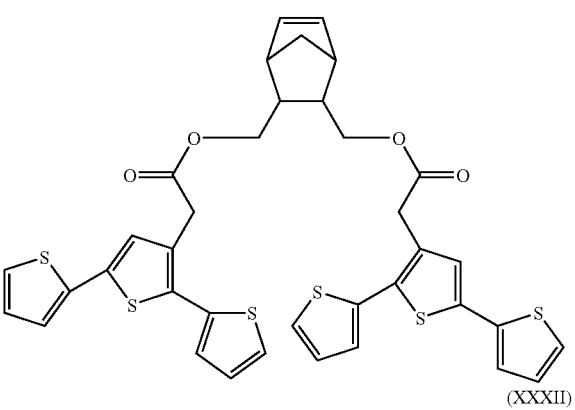

(XXXI)

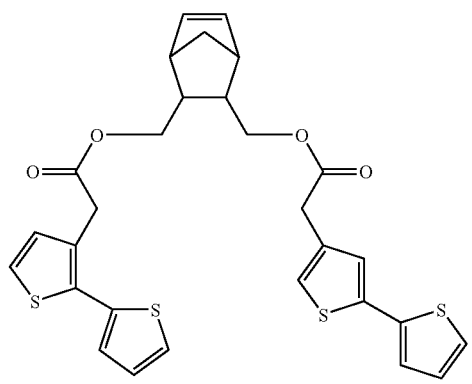

(XXXII)

10. The method of claim 1, wherein the intrinsically conductive precursor is crosslinked using oxidizing agents, wherein the oxidizing agents are ammonium peroxydisulphate, ferric (III) chloride, iron methane sulfonate, salts of permanganates, peracetates, chromates, dichromates, nitrosyl trifluoromethylsulfonate, nitrosyl bis(trifluoromethylsulfonyl)imide, or combinations comprising at least one of the foregoing oxidizing agents.

11. The method of claim 1, wherein the intrinsically conductive polymer precursor is crosslinked in an electrolytic cell.

12. The method of claim 11, wherein the intrinsically conductive polymer precursor is applied to a substrate prior to crosslinking in the electrolytic cell.

13. The method of claim 12, wherein the substrate is used as an electrode in the electrolytic cell.

14. The method of claim 1, wherein the intrinsically conductive polymer precursor is crosslinked on opposing surfaces.

15. The method of claim 1, wherein a pattern is disposed upon a surface of the intrinsically conductive polymer precursor through crosslinking.

16. The method of claim 1, wherein a pattern is formed through the cross-section of the intrinsically conductive polymer precursor through crosslinking.

17. The method of claim 1, wherein a pattern is disposed on opposing surfaces of the intrinsically conductive polymer precursor through crosslinking.

18. The method of claim 1, wherein a pattern is disposed on the surface of the intrinsically conductive polymer precursor by applying a potential across the surface of the intrinsically conductive polymer precursor via an external electrode brought into physical contact with at least one surface of the intrinsically conductive polymer precursor.

19. The method of claim 18, wherein the external electrode is a part of an atomic force microscope.

20. The method of claim 18, wherein the external electrode has a tip through which an electric field is applied and wherein the tip has a size of less than or equal to about 200 nanometers.

21. The method of claim 18, wherein the pattern has the shape of a dot, a straight line, a curved line, or a combination comprising at least one of the foregoing shapes.

22. The method of claim 18, wherein the pattern is raised above the surface by using contact mode or wherein the pattern lines is embedded into the surface by using tapping mode.

23. The method of claim 1, wherein the total crosslinked surface area of the intrinsically conductive polymer is less than 10 percent of the total surface area of the intrinsically conductive polymer precursor.

24. The method of claim 1, wherein the crosslinking of the intrinsically conductive polymer precursor is brought about by oxidation.

25. The method of claim 24, wherein increasing an oxidative potential during oxidation promotes an increase in pattern writing or crosslinking speed away from an electrode tip.

26. The method of claim 1, wherein the intrinsically conductive polymer precursor comprises electrically conducting or electrically insulating fillers.

27. The method of claim 1, wherein the intrinsically conductive polymer comprises electrically conducting or electrically insulating fillers.

28. The method of claim 27, wherein the electrically conducting filler comprises carbon nanotubes, fullerenes, carbon black, carbon fibers, indium tin oxide, metallic conducting fillers, or a combination comprising at least one of the foregoing.

29. The method of claim 28, wherein the carbon nanotubes are single wall carbon nanotubes, multiwall carbon nanotubes, vapor grown carbon fibers, or combinations comprising at least one of the foregoing nanotubes.

30. An article manufactured by the method of claim 1.

31. A method of manufacturing a pattern comprising:

casting a film of an intrinsically conductive polymer precursor on a substrate;

subsequently exposing the film to an oxidant or to an electrolytic medium; and crosslinking at least a portion of the film by oxidation, wherein the crosslinking occurs in the solid state, the swollen state or combinations comprising at least one of the foregoing states;

wherein the swollen state is characterized as being one wherein the intrinsically conductive polymer precursor increases in volume upon exposure to a solvent without completely dissolving in the solvent.

32. The method of claim 31, wherein the oxidation occurs through chemical oxidation, electrochemical oxidation or combinations comprising at least one of the foregoing methods of oxidation.

33. The method of claim 31, wherein the film is crosslinked on at least one surface.

34. The method of claim 31, wherein the film is crosslinked on opposing surfaces.

35. The method of claim 31, wherein the crosslinking occurs through the use of an atomic force microscope tip.

36. The method of claim 31, wherein the film is disposed upon an electrically insulating substrate, wherein the substrate has an electrically conductive pattern disposed upon it.

37. The method of claim 31, wherein the film is disposed upon an electrically conductive substrate having an electrically insulating pattern disposed upon the substrate.

38. An article manufacture by the method of claim 31.

39. A composition comprising a poly(thiophene) having the structure (XXXV), or the structure (XXXVI), or the structure (XXXVII), or the structure (XXXVIII)

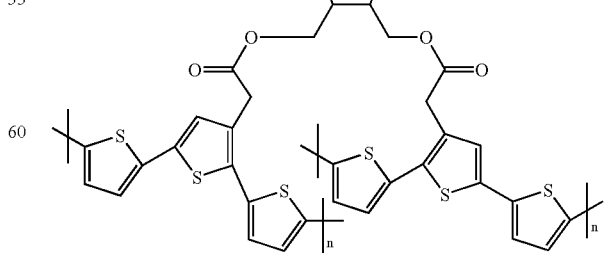

(XXXV)

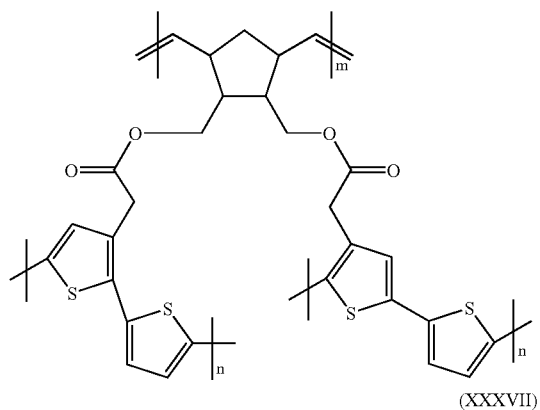
(XXXVI)
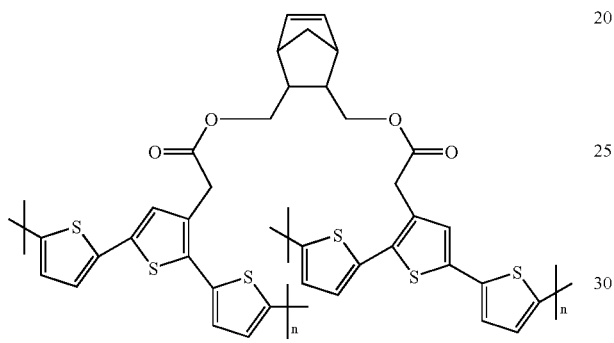
(XXXVII)
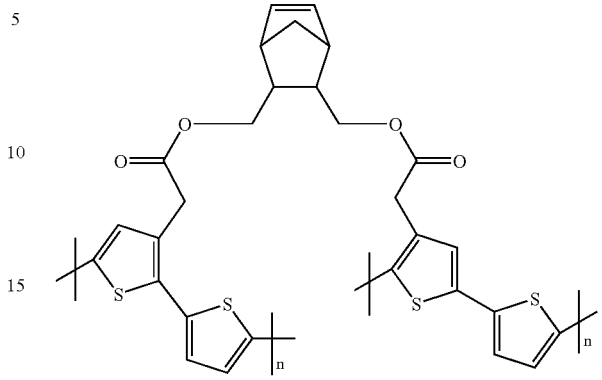
(XXXVIII)
or a combination comprising at least one of the foregoing poly(thiophene) structures, and wherein the molecular weight of the poly(thiophene) is about 100 to about 500,000 g/mole and further wherein there is a positive charge on the intrinsically conductive polymer and associated with this positive charge is a negative charge.
* * * * *